(12) United States Patent
Ogihara

(10) Patent No.: US 9,248,693 B2
(45) Date of Patent: Feb. 2, 2016

(54) PATTERNING PROCESS

(71) Applicant: SHIN-ETSU CHEMICAL CO., LTD., Tokyo (JP)

(72) Inventor: Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 37 days.

(21) Appl. No.: 13/862,969

(22) Filed: Apr. 15, 2013

(65) Prior Publication Data

US 2013/0284698 A1  Oct. 31, 2013

(30) Foreign Application Priority Data

Apr. 27, 2012 (JP) .................................. 2012-103330

(51) Int. Cl.
*B44C 1/22* (2006.01)
*G03F 7/00* (2006.01)
(Continued)

(52) U.S. Cl.
CPC ................. *B44C 1/227* (2013.01); *B82Y 10/00* (2013.01); *B82Y 40/00* (2013.01); *G03F 7/0002* (2013.01); *G03F 7/09* (2013.01); *H01L 21/3122* (2013.01)

(58) Field of Classification Search
CPC . H01L 21/32; H01L 21/312; H01L 21/31127; H01L 21/31138; H01L 21/3005; H01L 21/3086; G03F 7/09
USPC .............. 216/41, 42, 47, 48, 49, 81; 438/706, 438/719, 717, 725
See application file for complete search history.

(56) References Cited

U.S. PATENT DOCUMENTS 8,039,196 B2 * 10/2011 Kim et al. .................. 430/270.1
8,343,711 B2 * 1/2013 Ogihara et al. ............... 430/315
(Continued)

FOREIGN PATENT DOCUMENTS

EP  2 172 808 A1  4/2010
EP  2 540 780 A1  1/2013
(Continued)

OTHER PUBLICATIONS

Liu et al., "Integration of block copolymer directed assembly with 193 immersion lithography," *J. Vac. Sci. Technol. B.*, vol. 28, No. 6, pp. C6B30-C6B34, Nov./Dec. 2010.
(Continued)

*Primary Examiner* — Lan Vinh
(74) *Attorney, Agent, or Firm* — Oliff PLC

(57) ABSTRACT

A patterning process which uses self-assembly, wherein the patterning process includes: forming a silicon-containing film by applying a silicon-containing film composition having an organic substituent group substituted with an acid labile group onto a substrate to be processed, pattern-exposing of the silicon-containing film, forming a polymer film by applying a self-assembling polymer onto the silicon-containing film, self-assembling the polymer film to form a microdomain structure, forming a pattern on the polymer film, transferring the pattern to the silicon-containing film by using the pattern formed on the polymer as a mask, and transferring the pattern to the substrate to be processed by using the pattern transferred to the silicon-containing film as a mask. There can be provided a pattern having a microdomain structure formed by self-assembly with excellent uniformity and regularity, the pattern having been difficult to be obtained by a conventional self-assembly polymer.

4 Claims, 1 Drawing Sheet

(51) Int. Cl.
    *G03F 7/09*      (2006.01)
    *B82Y 10/00*    (2011.01)
    *B82Y 40/00*    (2011.01)
    *H01L 21/312*   (2006.01)

(56) References Cited

U.S. PATENT DOCUMENTS

| | | | |
|---|---|---|---|
| 2004/0050816 A1 | 3/2004 | Asakawa et al. | |
| 2007/0238300 A1 | 10/2007 | Ogihara et al. | |
| 2008/0150091 A1* | 6/2008 | Lin | 257/635 |
| 2009/0023294 A1 | 1/2009 | Wang et al. | |
| 2009/0136869 A1 | 5/2009 | Ogihara et al. | |
| 2009/0179002 A1* | 7/2009 | Cheng et al. | 216/41 |
| 2010/0167214 A1 | 7/2010 | Yoon et al. | |
| 2012/0088192 A1 | 4/2012 | Trefonas et al. | |

FOREIGN PATENT DOCUMENTS

| | | |
|---|---|---|
| JP | 2005-007244 | 1/2005 |
| JP | 2005-008701 | 1/2005 |
| JP | 2005-008882 | 1/2005 |
| JP | 2009-21605 | 1/2009 |
| JP | 2009-126940 | 6/2009 |
| JP | 4716037 | 7/2011 |
| JP | 2012-78830 | 4/2012 |
| WO | WO 2012/084558 A1 | 6/2012 |

OTHER PUBLICATIONS

Cheng et al., "Simple and Versatile Methods to Integrate Directed Self-Assembly with Optical Lithography Using a Polarity-Switched Photoresist," *ACS NANO*, vol. 4, No. 8, pp. 4815-4823, Aug. 24, 2010.

European Search Report issued in Application No. 13002135.5; Dated Jul. 31, 2013.

Aug. 12, 2014 Office Action issued in Japanese Patent Application No. 2012-103330 (with Partial English Translation).

* cited by examiner

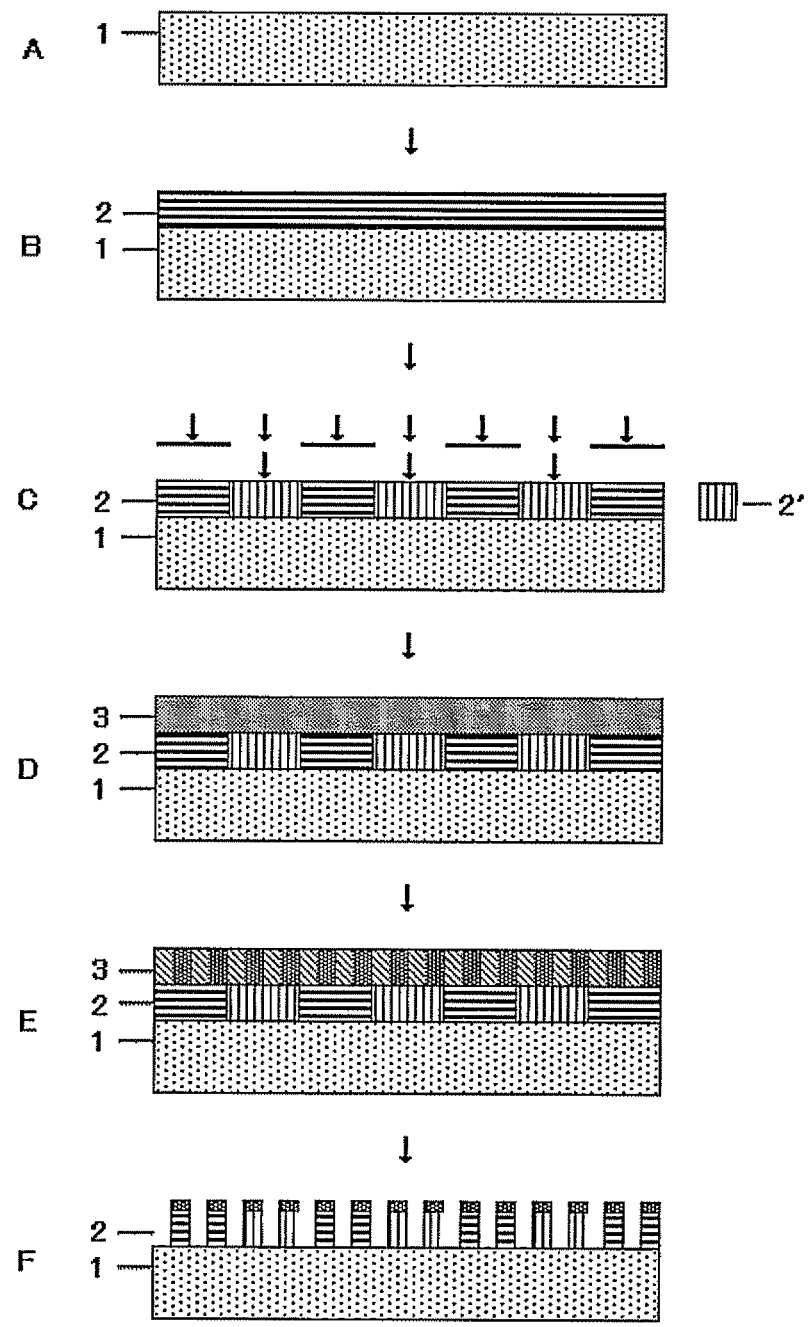

PATTERNING PROCESS

BACKGROUND OF THE INVENTION

1. Field of the Invention

The present invention relates to a patterning process using self-assembly.

2. Description of the Related Art

In 1980s, photo-exposure using a g-beam (436 nm) or an i-beam (365 nm) of a mercury lamp as a light source had been widely used in the resist patterning. As a means for further miniaturization, shifting to a shorter wavelength of the exposure light was assumed to be effective, so that, in mass production process after the DRAM (Dynamic Random Access Memory) with 64 megabits (processing dimension of 0.25 µm or less) in 1990s, a KrF excimer laser (248 nm), a shorter wavelength than the i-beam (365 nm), had been used in place of the i-beam as an exposure light source. However, in production of DRAMs with integration of 256 MB and 1 GB or higher which require further miniaturized process technologies (processing dimension of 0.2 µm or less), a light source with further short wavelength is required, and thus, a photolithography using an ArF excimer laser (193 nm) has been investigated seriously since about a decade ago. At first, the ArF lithography was planned to be applied to manufacturing of a device starting from a 180-nm node device, but the life of the KrF excimer lithography was prolonged to mass production of the 130-nm node device; and thus, a full-fledged application of the ArF lithography started from the 90-nm node. Further, mass production of the 65-nm node device is now underway by combining thereof with a lens having an increased NA till 0.9. Further shortening of wavelength of the exposure light is progressing in the next 45-nm node device; and for that, the $F_2$-lithography with 157 nm wavelength became a candidate. However, there are many problems with the $F_2$ lithography: cost-up of a scanner due to use of a large quantities of expensive $CaF_2$ single crystals for a projection lens; extremely poor sustainability of a soft pellicle, which leads to change of an optical system due to introduction of a hard pellicle; decrease in etching resistance of a resist film, and so forth. Because of these problems, development of the $F_2$ lithography was suspended, and the ArF immersion lithography was introduced.

In the ArF immersion lithography, water having refractive index of 1.44 is introduced between a projection lens and a wafer by a partial fill method thereby enabling high speed scanning; and thus, mass production of the 45-nm node device is now underway by using a lens with a NA class of 1.3.

For the 32-nm node lithography technology, a lithography with an extreme ultraviolet beam (EUV) of 13.5 nm wavelength is considered to be a candidate. Problems to be solved in the EUV lithography are to obtain a higher output power of the laser, a higher sensitivity of the resist film, a higher resolution power, a lower line edge roughness (LER), a non-defect MoSi laminate mask, a lower aberration of the reflective mirror, and so forth; and thus, there are mounting problems to be solved.

Development of the immersion lithography with a high refractive index, another candidate for the 32-nm node, was suspended, because transmittance of LUAG, a candidate for a high refractive index lens, is low, and refractive index of the liquid could not reach an aimed value of 1.8.

As mentioned above, in the photo-exposure used as a general technology, resolution power based on the wavelength of a light source is approaching to its inherent limit. Therefore, in recent years, development by an organic solvent, with which a very fine hole pattern that could not be achieved by a patterning process with a positive tone by a conventional alkaline development is formed by a patterning process with a negative tone by the organic solvent development, is receiving an attention again. This is a patterning process with which a negative pattern is formed by the organic solvent development by using a positive resist composition having a high resolution power. Further, an investigation to obtain a doubled resolution power by combining two developments of the alkaline development and the organic solvent development is now underway. However, under the present situation, patterning to form a fine pattern by a lithography with 30 nm or less, especially by a lithography with 10 nm or less is difficult.

In recent years, a pattern having a regularity could be successively obtained by using a self-assembling technology of a block copolymer without using a lithography process (For example, Patent Documents 1 to 3). In addition, patterning of about 30 nm by a combination with the ArF immersion lithography was reported (Non-Patent Document 1).

However, the pattern obtained by these self-assembly materials has many problems in uniformity and regularity of the pattern form even though the pattern thereof is 30 nm in its size, so that this has not been realized as a practical method; and thus, these problems are required to be solved.

PRIOR ART DOCUMENTS

Patent Documents

Patent Document 1: Japanese Patent Laid-Open Publication No. 2005-7244
Patent Document 2: Japanese Patent Laid-Open Publication No. 2005-8701
Patent document 3: Japanese Patent Laid-Open Publication No. 2005-8882

Non-Patent Documents

Non-patent document 1: J. Vac. Sci. Technol. B 28(6), 06B30 November/December(2010)

SUMMARY OF THE INVENTION

The present invention was made in view of the situation mentioned above, and has an object to provide a patterning process especially suitable for a fine patterning material to be used in manufacturing of a very large scale integrated circuit by obtaining a pattern having a microdomain structure formed by self-assembly with excellent uniformity and regularity, the pattern having been difficult to be obtained by a conventional self-assembly polymer.

The present invention was made to solve the problems mentioned above, and provides a patterning process which uses self-assembly, wherein the patterning process comprises:

a step of forming a silicon-containing film by applying a silicon-containing film composition which contains a silicon-containing compound containing an organic substituent group having a hydroxyl group thereof substituted with an acid labile group or a carboxyl group thereof substituted with an acid labile group onto a substrate to be processed, which is then followed by heating this, a step of pattern-exposing of the silicon-containing film to a high energy beam, which is then followed by a heat treatment thereof, a step of forming a polymer film by applying a self-assembling polymer onto the silicon-containing film, a step of self-assembling the polymer film by a heat treatment to form a microdomain structure, a step of forming a pattern by dry-etching of the polymer film having the microdomain formed, a step of transferring the pattern to the silicon-containing film by dry-etching by using the pattern formed on the polymer as a mask, and a step of transferring the pattern to the substrate to be processed by dry-etching by using the pattern transferred to the silicon-containing film as a mask.

According to the patterning processed of the present invention, a pattern having a microdomain structure formed by self-assembly with excellent uniformity and regularity, the pattern having been difficult to be obtained by a conventional self-assembly polymer, can be obtained because this process includes the steps shown above; and thus, the present invention can provide a patterning process especially suitable for a fine patterning material to be used in manufacturing of a very large scale integrated circuit and the like.

Further, it is preferable that the silicon-containing film composition contain a photo acid generator.

When the silicon-containing film composition used in the present invention is made to contain a photo acid generator, there appears a clear difference in contact angles between the exposed area and the unexposed area so that self-assembly of the self-assembling polymer takes place readily.

As the substrate to be processed that is used in the present invention, a substrate formed thereon an organic hard mask mainly comprised of carbon formed by a CVD method or an organic film of an application type may be used.

By forming a CVD film or an organic underlayer film under the silicon-containing film used in the present invention and by optimizing a combination thereof with a film to be processed, a fine pattern by self-assembly can be transferred to an inorganic film and a semiconductor device substrate in a further lower layer without causing transfer difference in size.

According to the patterning process of the present invention, self-assembly of the self-assembling polymer can be accelerated so that fine patterning that cannot be reached by a lithography using a high beam energy can be obtained and pattern transfer by using this film as an etching mask becomes possible.

BRIEF DESCRIPTION OF THE DRAWING

FIG. 1 is a flow chart showing the patterning process of the present invention.

DESCRIPTION OF THE PREFERRED EMBODIMENTS

Hereinafter, the present invention will be explained in detail, but the present invention is not limited to these descriptions.

The present invention includes a step of forming a silicon-containing film by applying a silicon-containing film composition which contains a silicon-containing compound containing an organic substituent group having a hydroxyl group thereof substituted with an acid labile group or a carboxyl group thereof substituted with an acid labile group onto a substrate to be processed, which is then followed by heating this, and a step of pattern-exposing of the silicon-containing film to a high energy beam, which is then followed by a heat treatment thereof.

The silicon-containing film releases an acid labile group by virtue of the effect of an acid generated inside thereof by photo-exposure thereby generating a hydrophilic hydroxyl group or carboxyl group in the exposed area. Because of this, a difference in contact angles between the exposed area and the unexposed area appears. It is known that generally a self-assembling polymer undergoes self-assembly by heating by using as a driving force the part where the contact angle changes on the film surface. If the silicon-containing film of the present invention is formed in the underlayer of the self-assembling polymer in advance, self-assembly takes place readily so that a pattern that is formed by self-assembly can be obtained.

As to the silicon-containing film composition which contains the silicon-containing compound, a silicon-containing film composition which contains a silicon-containing compound having one or more partial structures shown by the following general formulae (A), (B), and (C).

wherein $R^1$ represents an organic group having a hydroxyl group thereof substituted with an acid labile group or a carboxyl group thereof substituted with an acid labile group.

wherein $R^1$ represents an organic group having a hydroxyl group thereof substituted with an acid labile group or a carboxyl group thereof substituted with an acid labile group; and $R^2$ represents the same meaning as $R^1$, a hydrogen atom, or a monovalent organic group having 1 to 30 carbon atoms.

wherein $R^1$ represents an organic group having a hydroxyl group thereof substituted with an acid labile group or a carboxyl group thereof substituted with an acid labile group; $R^2$ represents the same meaning as $R^1$, a hydrogen atom, or a monovalent organic group having 1 to 30 carbon atoms; and $R^3$ represents the same meaning as $R^1$, a hydrogen atom, or a monovalent organic group having 1 to 30 carbon atoms.

Illustrative example of the organic group, shown by $R^1$, having a hydroxyl group thereof substituted with an acid labile group or a carboxyl group thereof substituted with an acid labile group in the partial structures (A), (B), and (C) of the silicon-containing compound of the present invention includes the structures shown by the following general formulae. Meanwhile, in the following general formulae, (Si) is described to show the bonding site to a silicon atom.

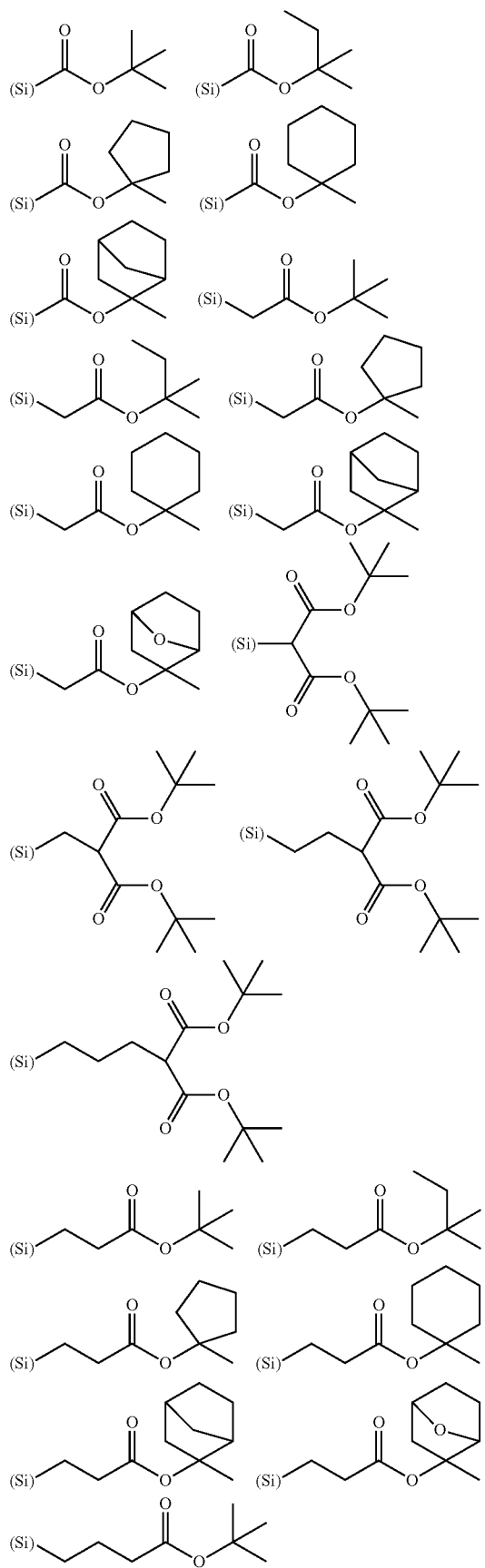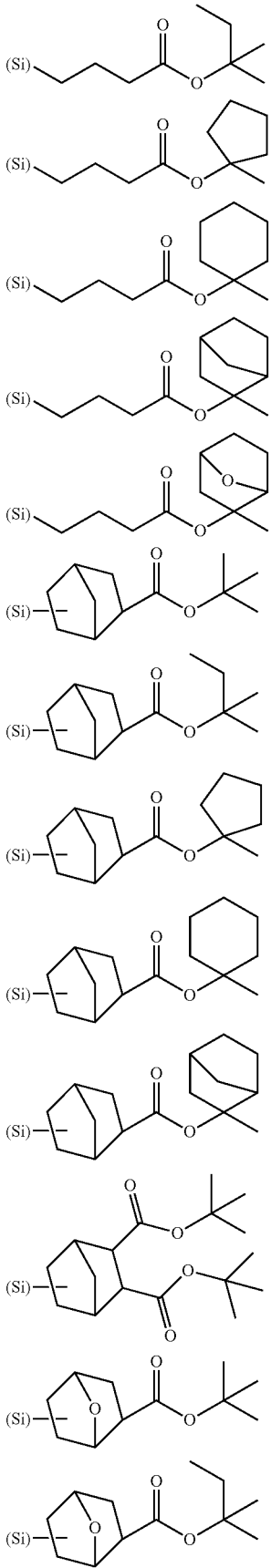

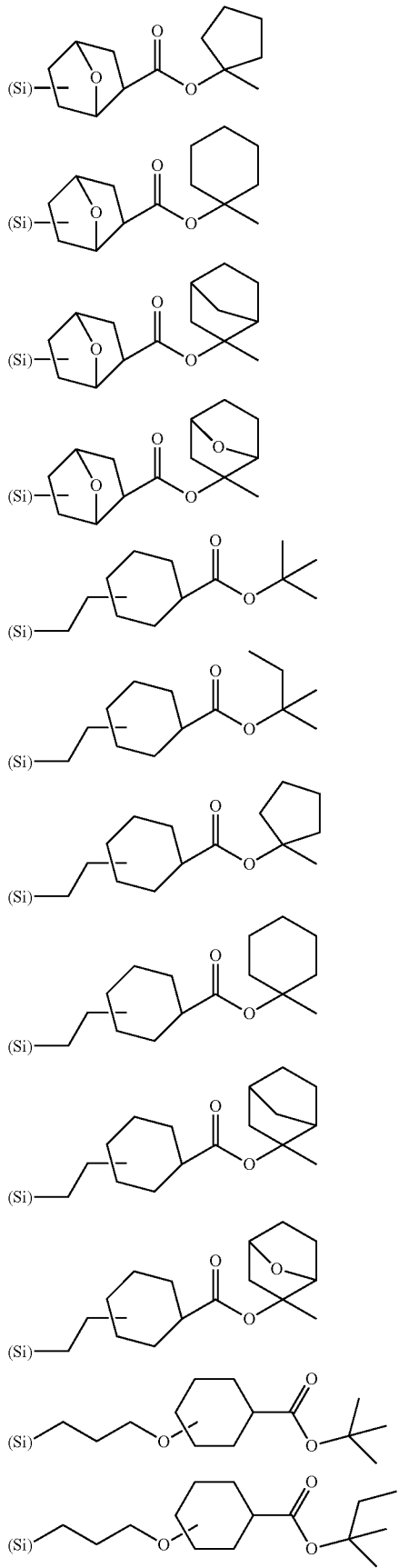
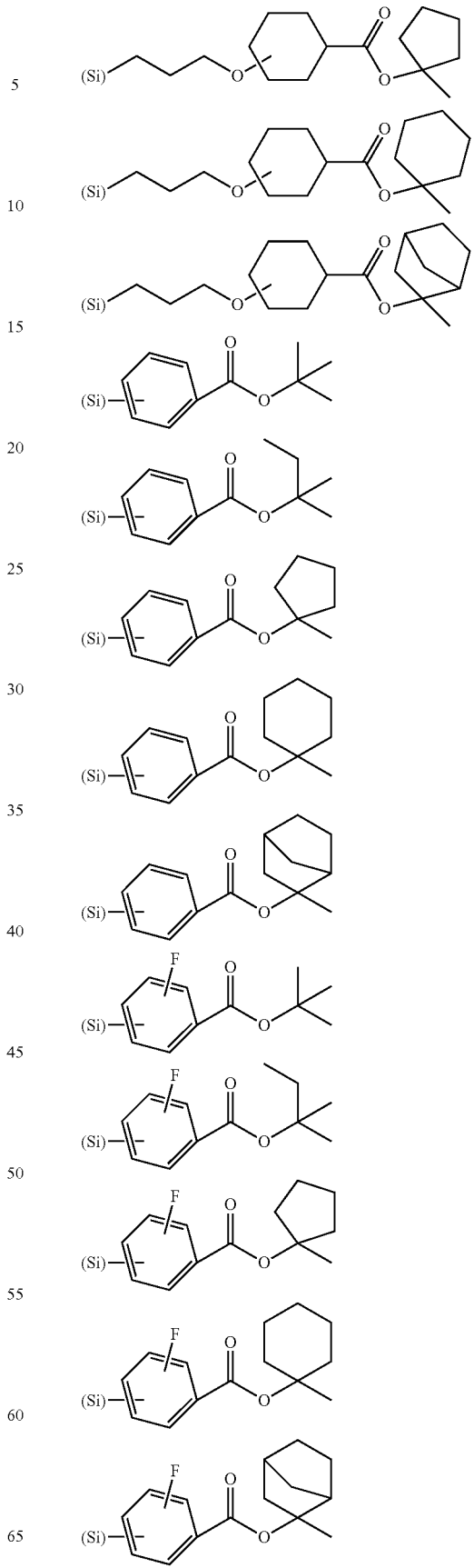

-continued
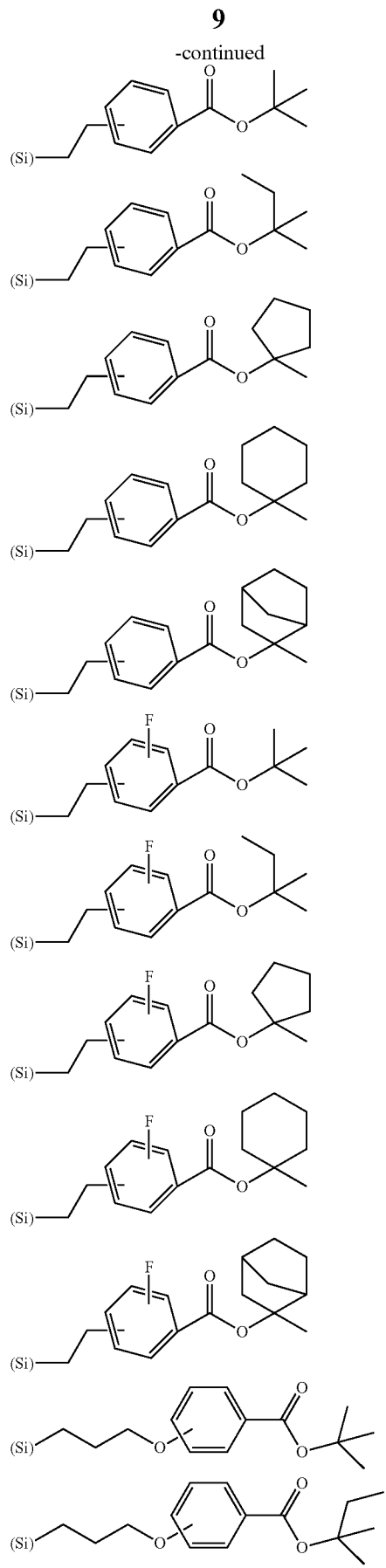
-continued
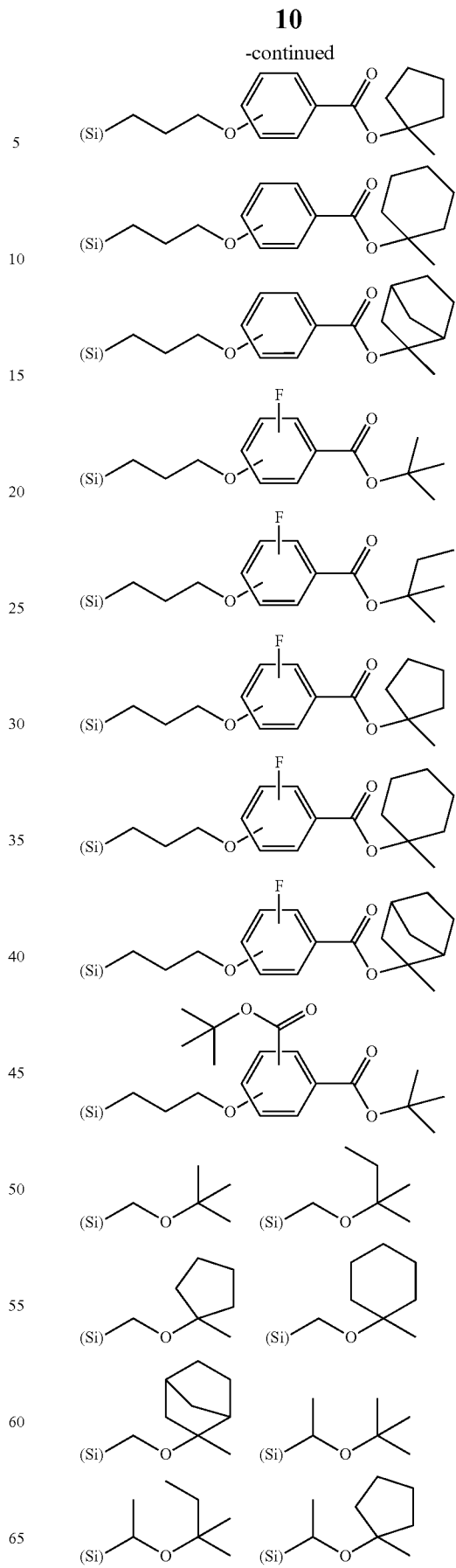

-continued
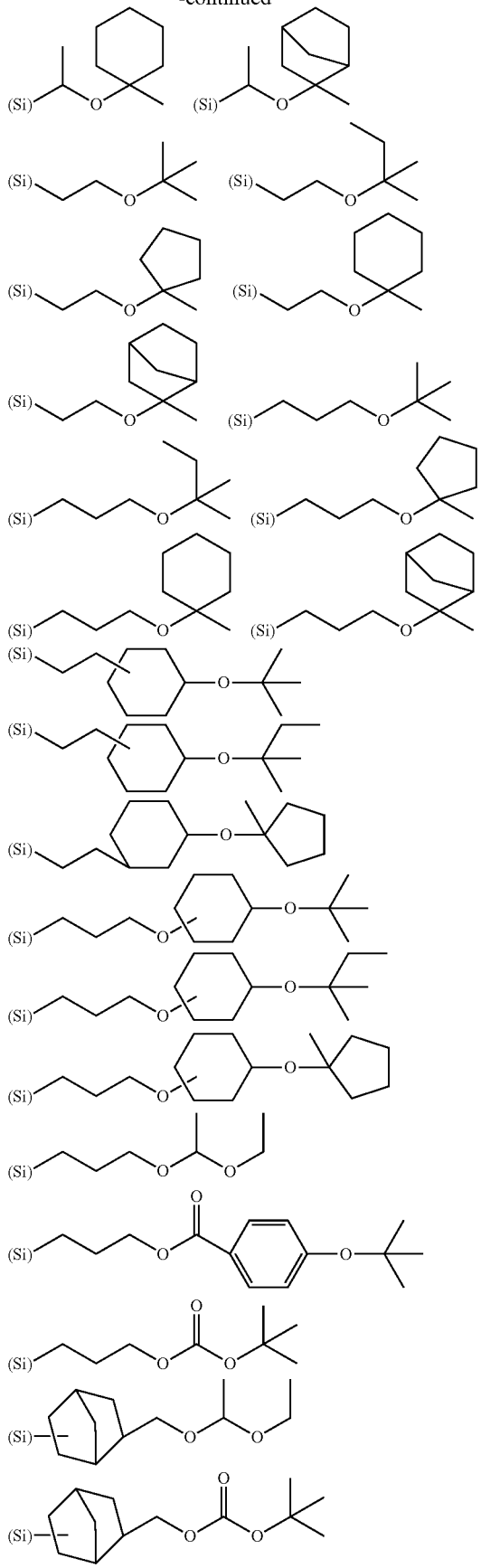
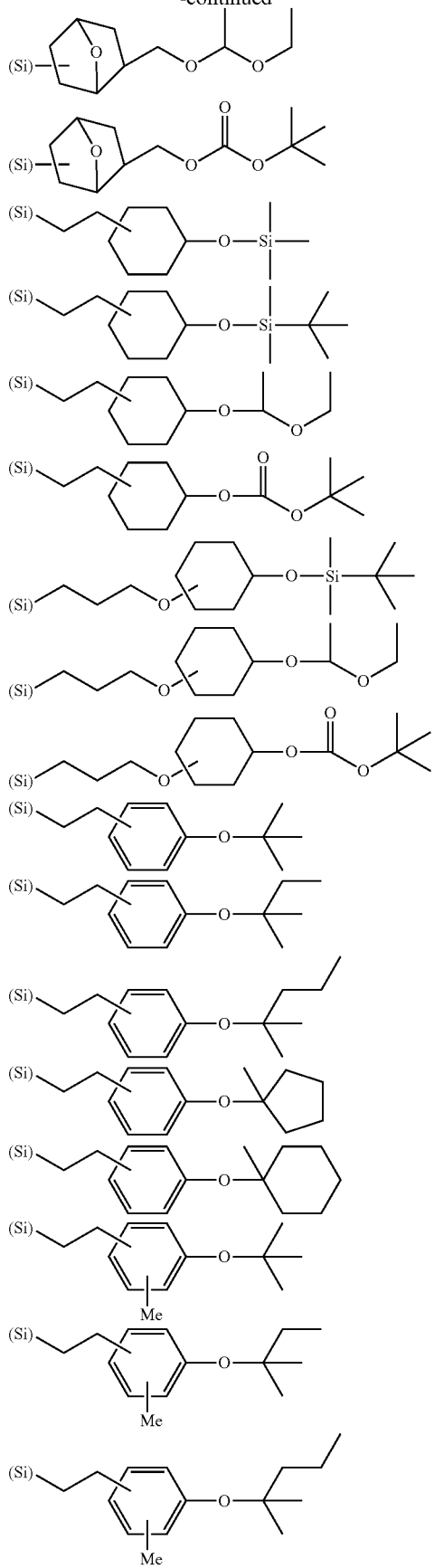

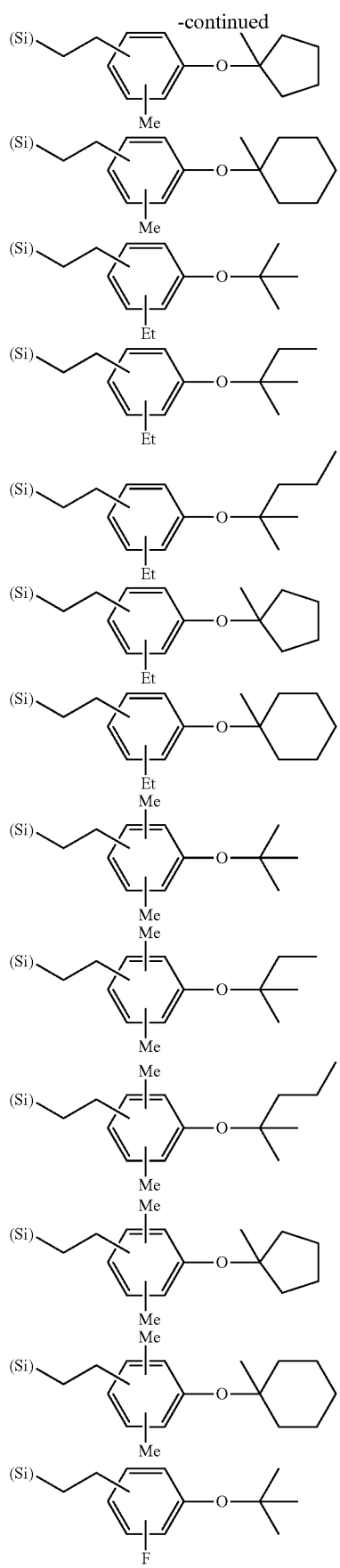
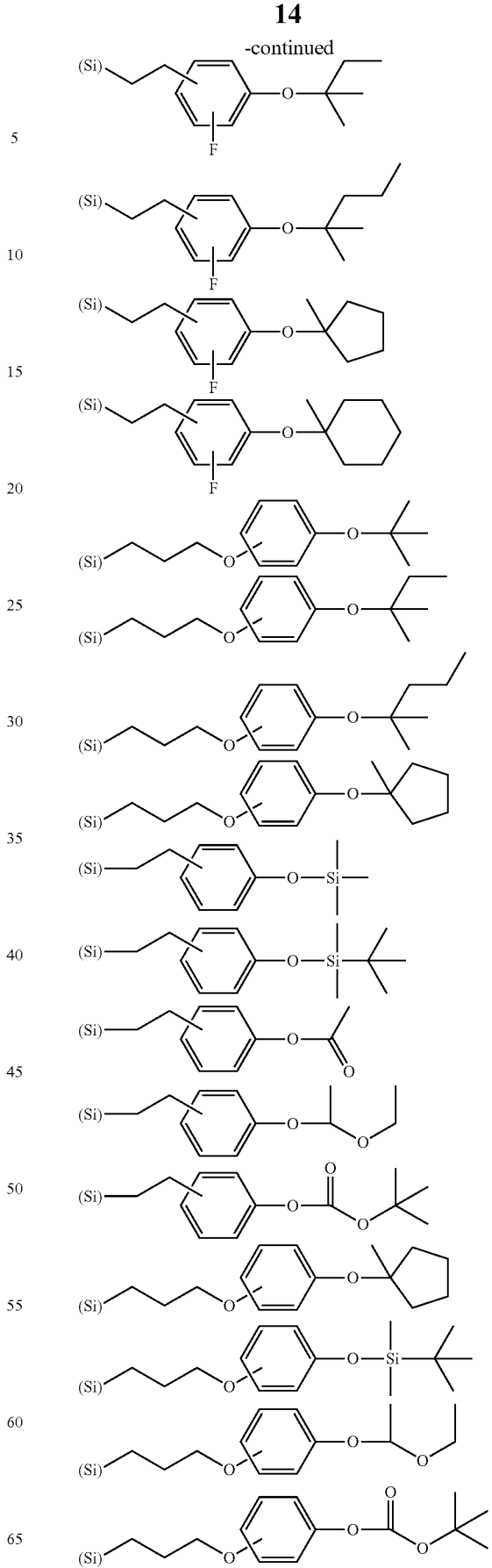

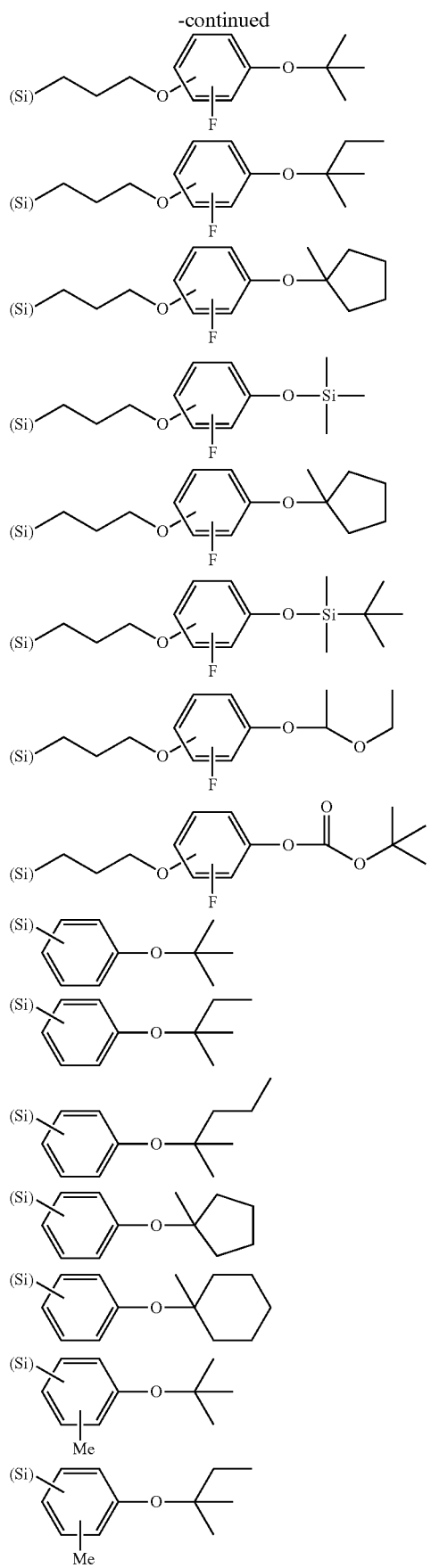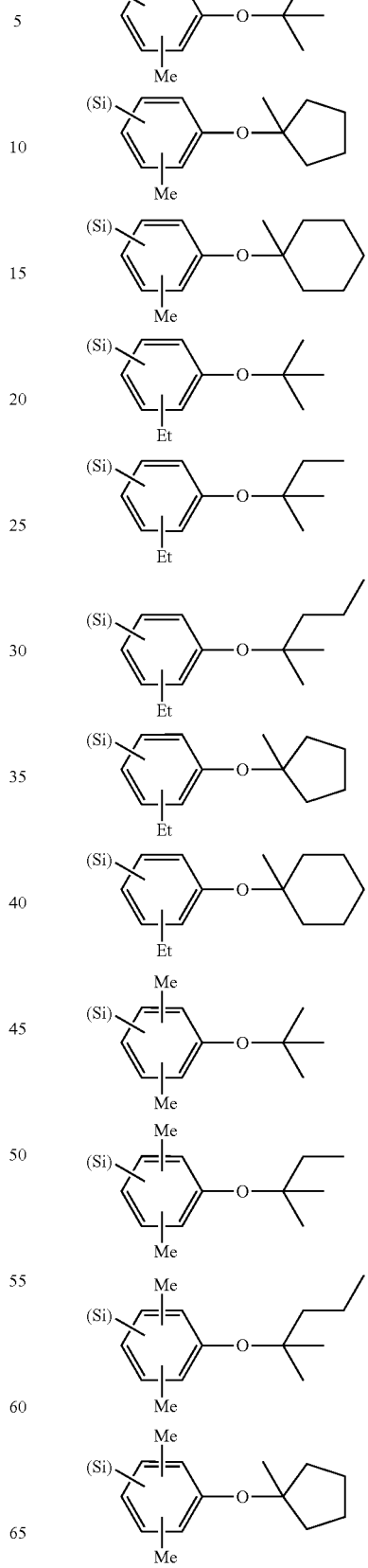

17
-continued
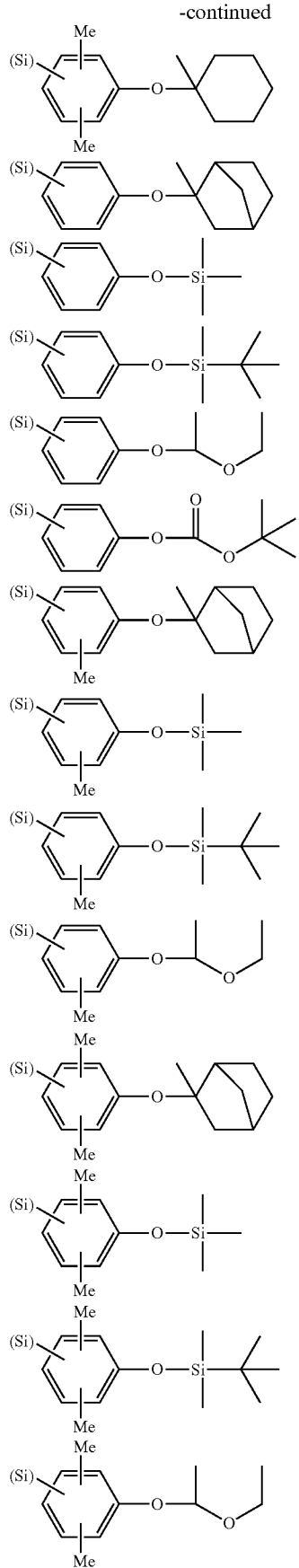
18
-continued
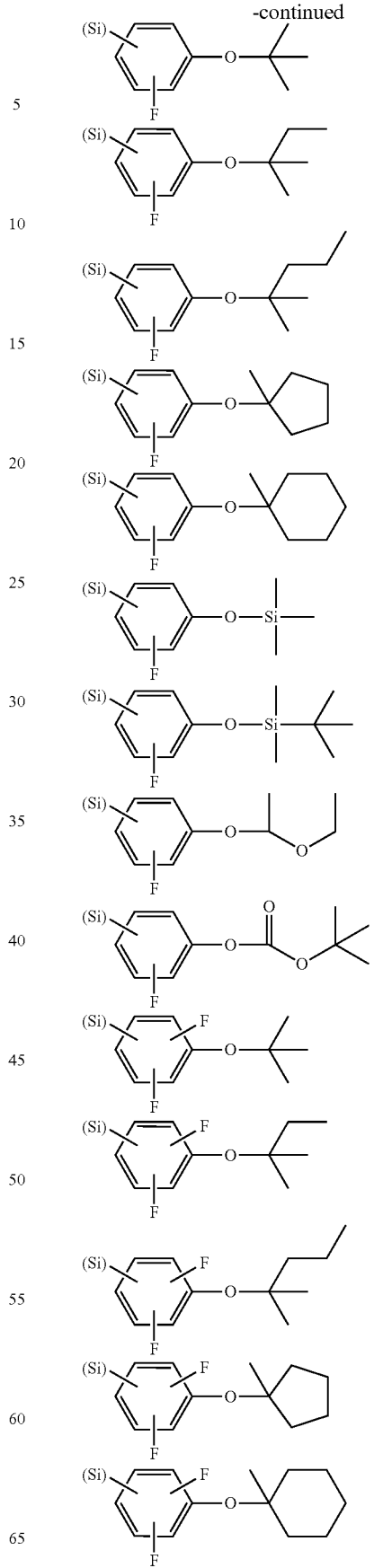

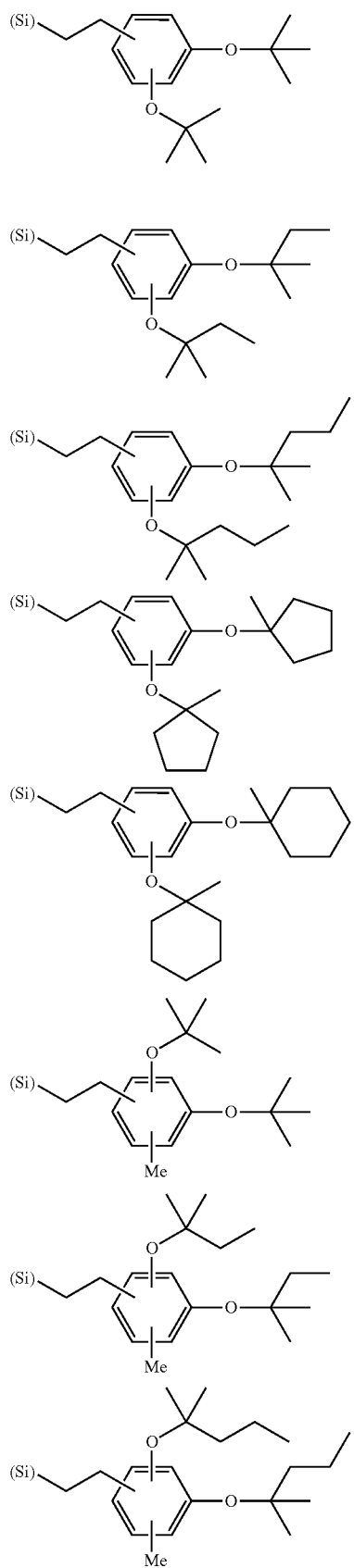
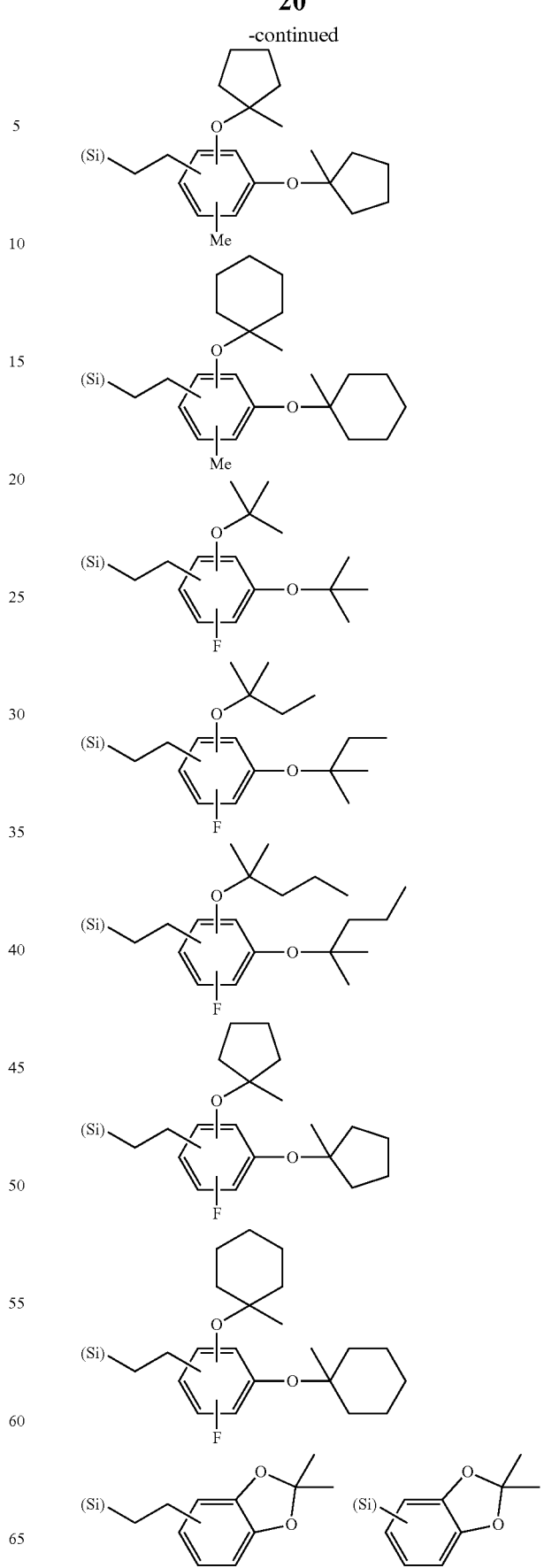

-continued

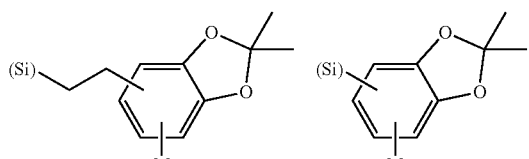
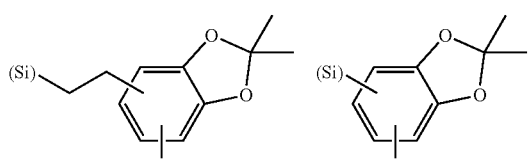
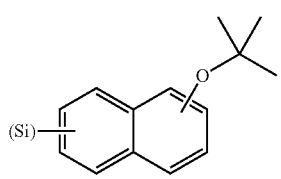
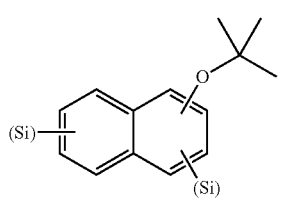
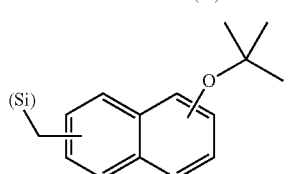
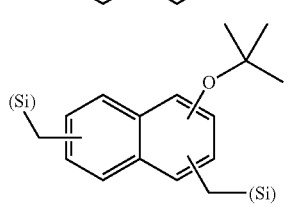
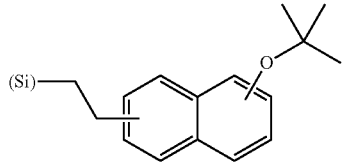
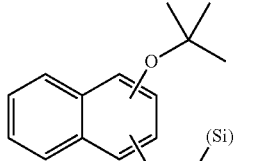
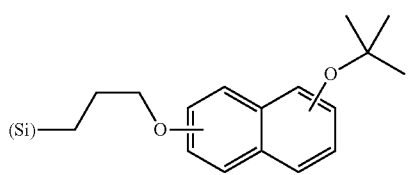

-continued

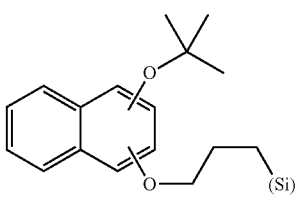

Illustrative example of the hydrolysable silicon compound used as a raw material to form the structure of the silicon-containing compound used in the present invention includes a compound having the foregoing structures on a silicon atom while containing, as the hydrolysable group, one, two, or three of chlorine, bromine, iodine, an acetoxy group, a methoxy group, an ethoxy group, a propoxy group, a butoxy group, or the like, and further a hydrogen atom or a monovalent organic group having 1 to 30 carbon atoms as $R^2$ and $R^3$.

Other illustrative example of the hydrolysable silicon compound used as a raw material to form the structure of the silicon-containing compound used in the present invention includes the following compounds.

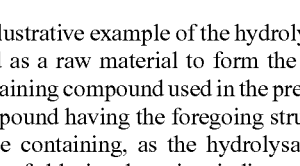
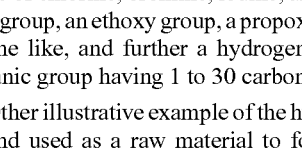
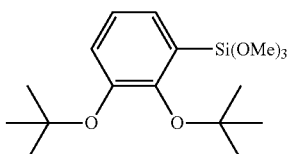
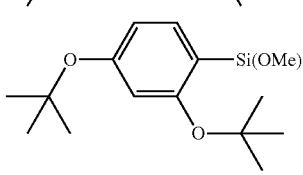
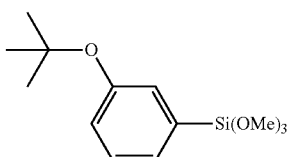
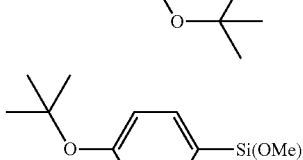
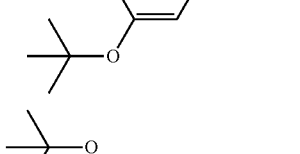
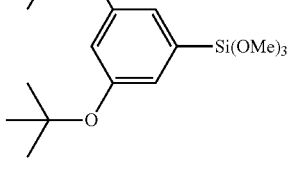

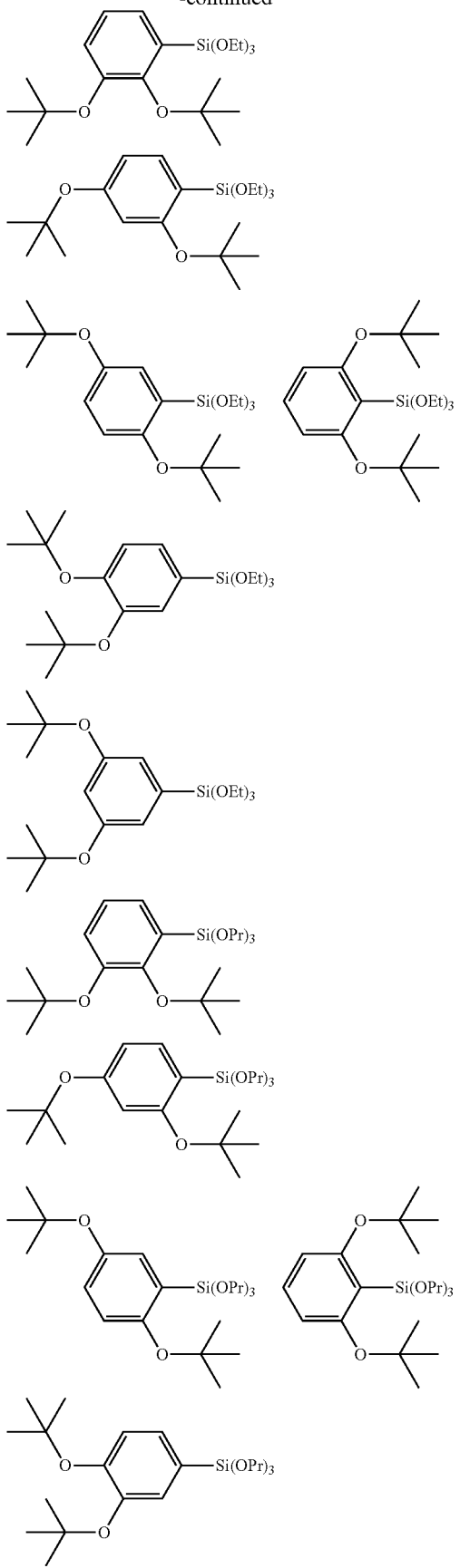
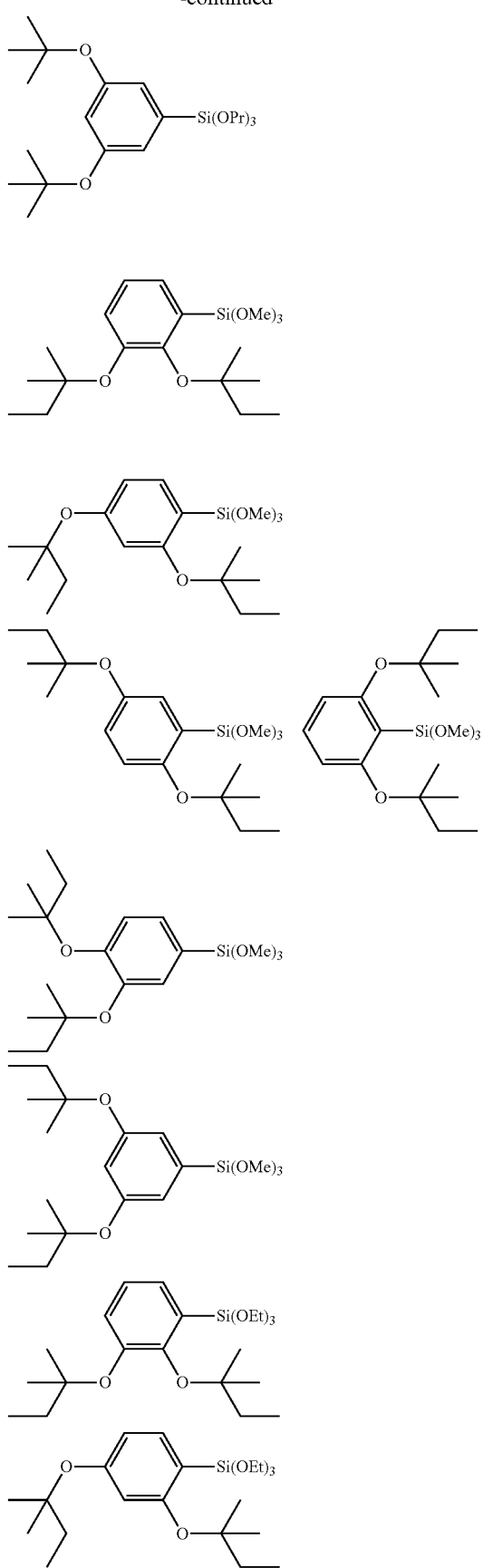

-continued
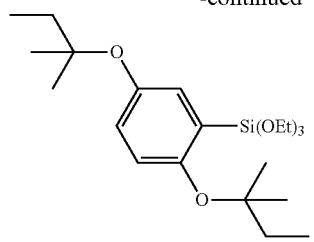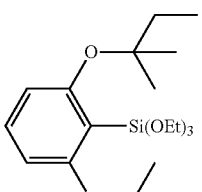
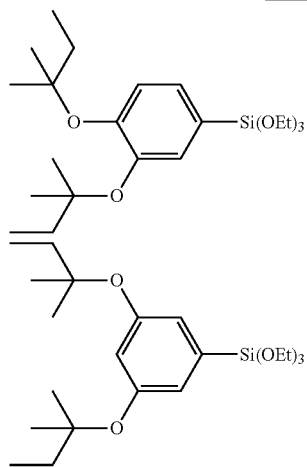
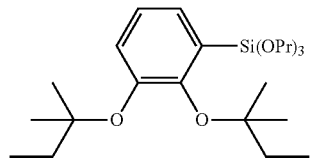
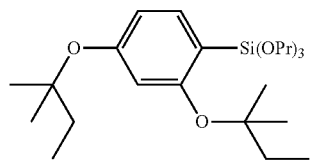
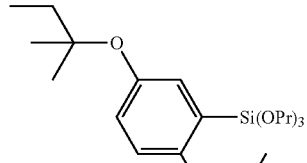
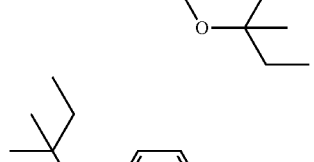
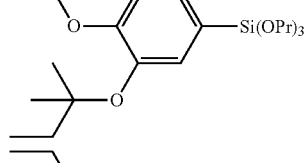
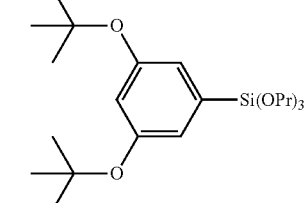
-continued
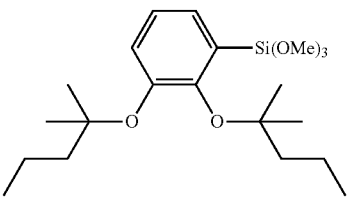
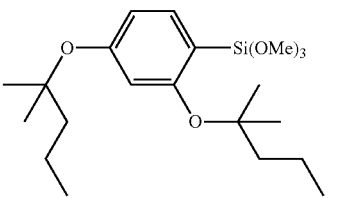
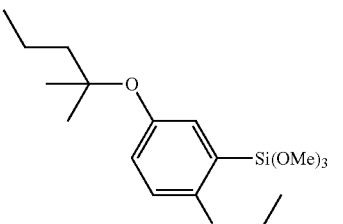
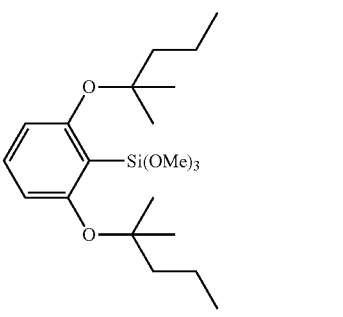
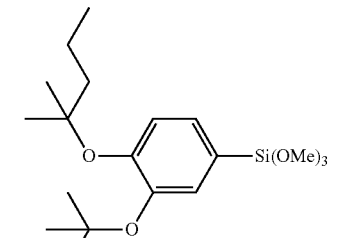
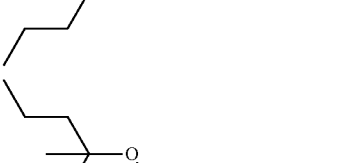
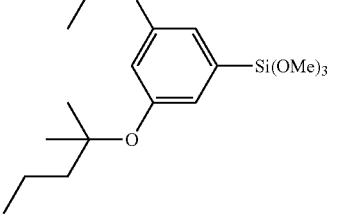

-continued
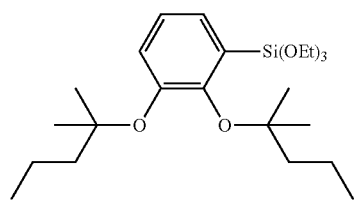
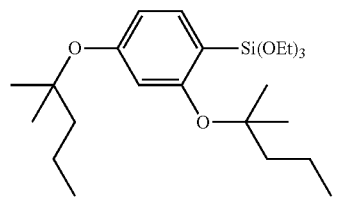
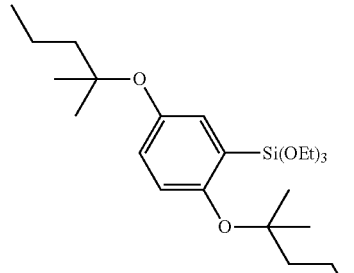
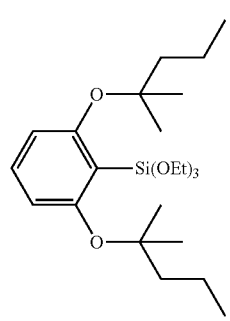
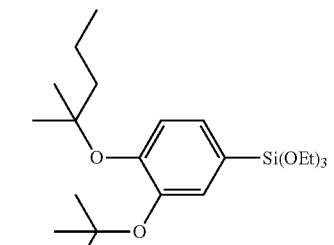
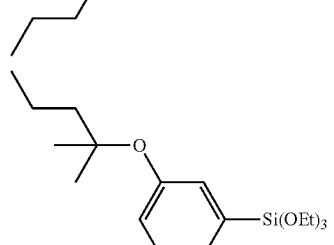
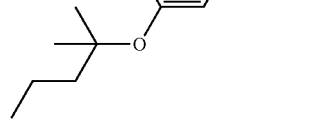
-continued
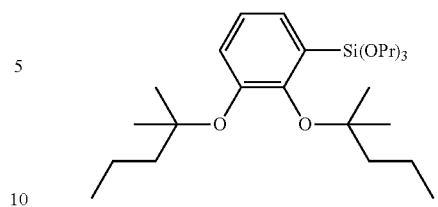
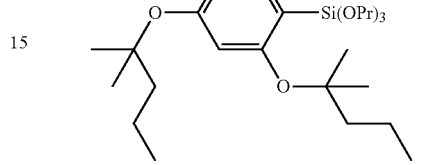
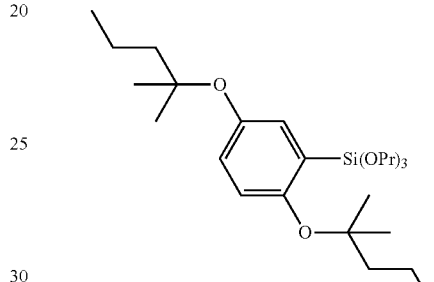
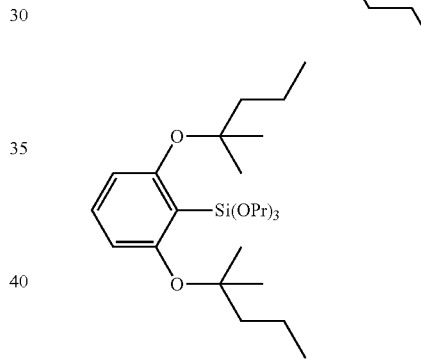
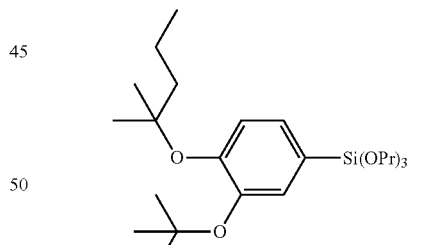
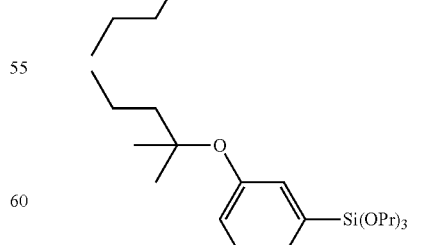
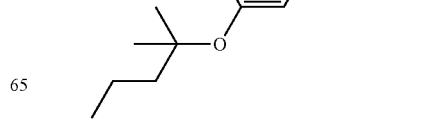

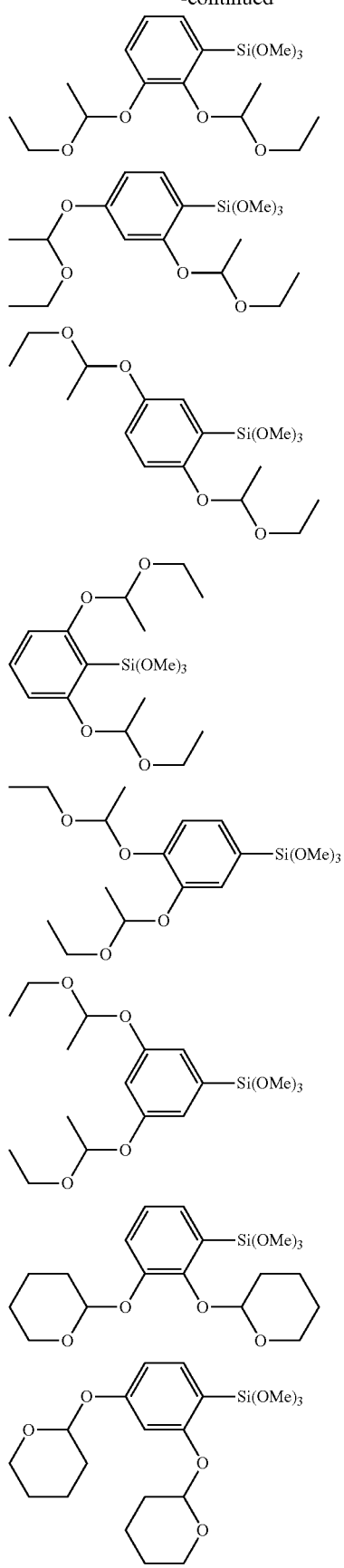
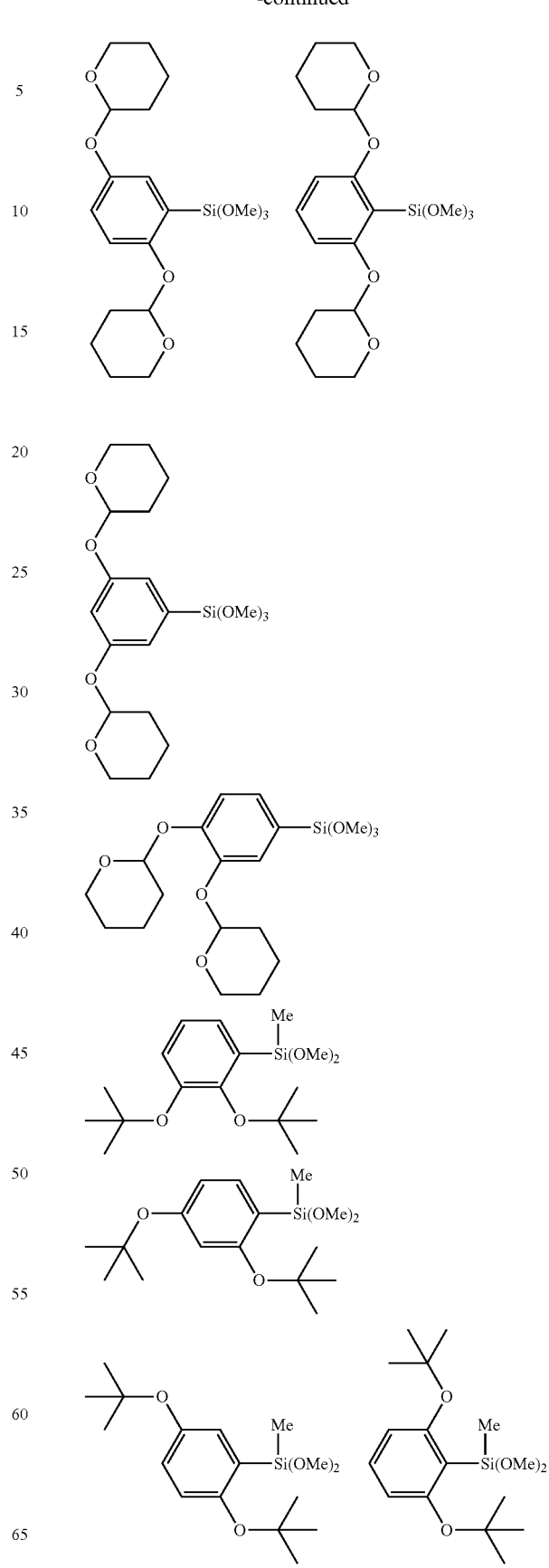

-continued
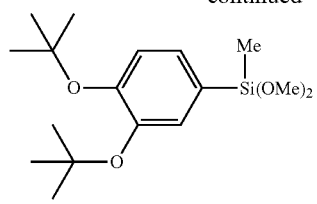
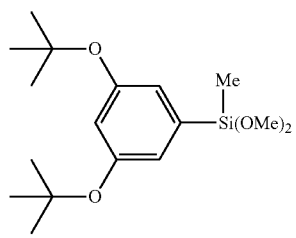
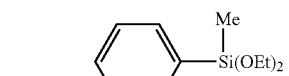
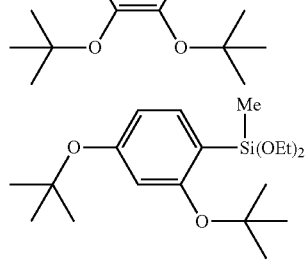
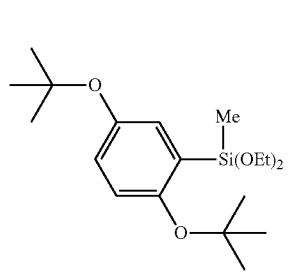
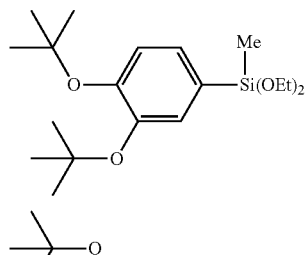
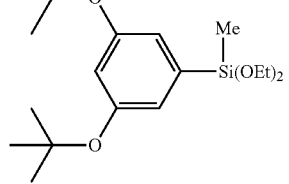
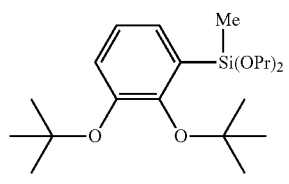
-continued
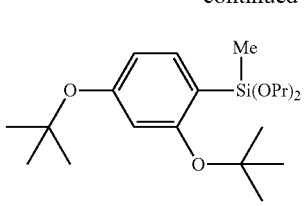
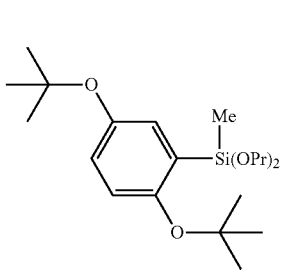
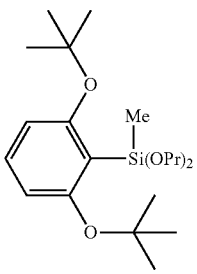
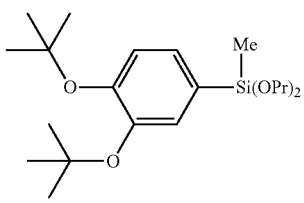
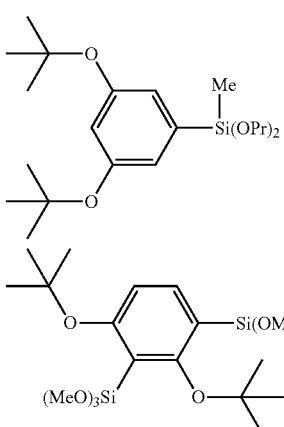
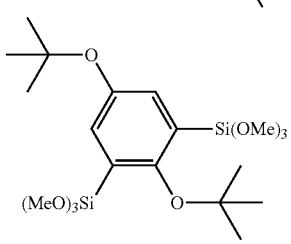
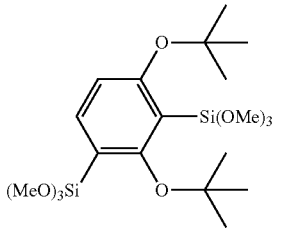

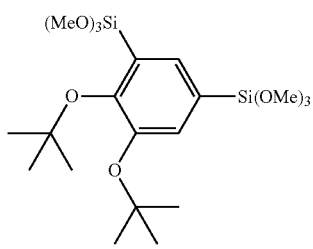
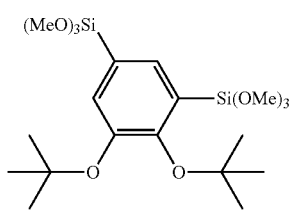
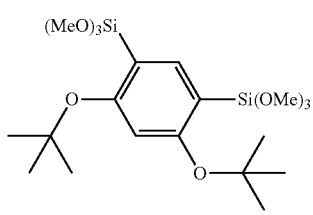
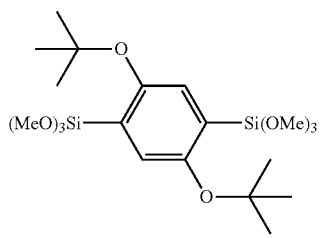
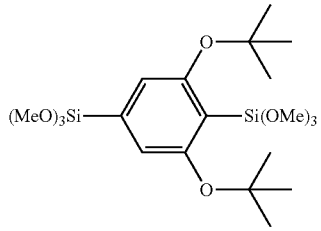
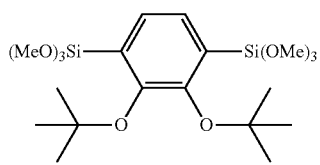
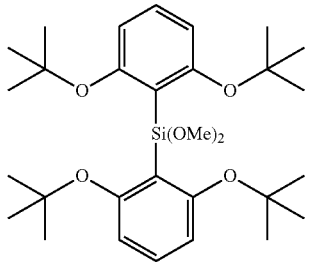

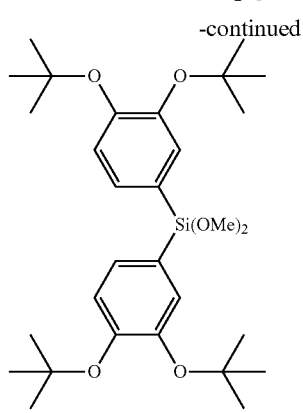
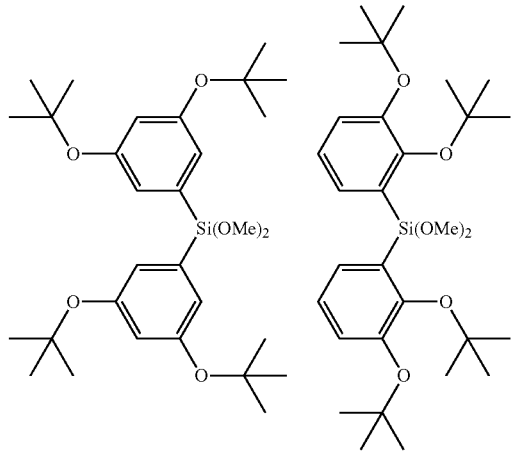
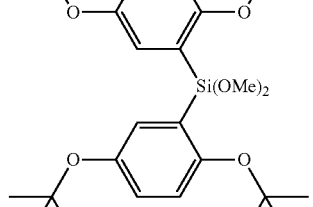

In addition, the silicon-containing compound that can be used in the patterning process of the present invention may be produced by hydrolysis condensation of a mixture which contains following hydrolysable monomers.

Illustrative example of the hydrolysable monomer includes tetramethoxy silane, tetraethoxy silane, tetrapropoxy silane, tetraisopropoxy silane, trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, t-butyl trimethoxy silane, t-butyl triethoxy silane, t-butyl tripropoxy silane, t-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctayl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantly trimethoxy silane, adamantly triethoxy silane, adamantly tripropoxy silane, adamantly triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, anisyl trimethoxy silane, anisyl triethoxy silane, anisyl tripropoxy silane, anysil triisopropoxy silane, tolyl trimethoxy silane, tolyl triethoxy silane, tolyl tripropoxy silane, tolyl triisopropoxy silane, phenetyl trimethoxy silane, phenetyl triethoxy silane, phenetyl tripropoxy silane, phenetyl triisopropoxy silane, naphthyl trimethoxy silane, naphthyl triethoxy silane, naphthyl tripropoxy silane, naphthyl triisopropoxy silane, dimethyl dimethoxy silane, dimethyl diethoxy silane, methyl ethyl dimethoxy silane, methyl ethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-sec-butyl diethoxy silane, di-sec-butyl dipropoxy silane, di-sec-butyl diisopropoxy silane, di-t-butyl dimethoxy silane, di-t-butyl diethoxy silane, di-t-butyl dipropoxy silane, di-t-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl) dimethoxy silane, bis(bicycloheptenyl) diethoxy silane, bis(bicycloheptenyl) dipropoxy silane, bis(bicycloheptenyl) diisopropoxy silane, bis(bicycloheptyl) dimethoxy silane, bis(bicycloheptyl) diethoxy silane, bis(bicycloheptyl) dipropoxy silane, bis(bicycloheptyl) diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, and dimethyl phenethyl ethoxy silane.

Preferable example of the hydrolysable monomers mentioned above includes tetramethoxy silane, tetraethoxy silane, methyl trimethoxy silane, methyl triethoxy silane, ethyl trimethoxy silane, ethyl triethoxy silane, vinyl trimethoxy silane, vinyl triethoxy silane, propyl trimethoxy silane, propyl triethoxy silane, isopropyl trimethoxy silane, isopropyl triethoxy silane, butyl trimethoxy silane, butyl triethoxy silane, isobutyl trimethoxy silane, isobutyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, tolyl trimethoxy silane, tolyl triethoxy silane, anisyl trimethoxy silane, anisyl triethoxy silane, phenetyl trimethoxy silane, phenetyl triethoxy silane, dimethyl dimethoxy silane, dimethyl diethoxy silane, diethyl dimethoxy silane, diethyl diethoxy silane, methyl ethyl dimethoxy silane, methyl ethyl diethoxy silane, dipropyl dimethoxy silane, dibutyl dimethoxy silane, methyl phenyl dimethoxy silane, methyl phenyl diethoxy silane, trimethyl methoxy silane, dimethyl ethyl methoxy silane, dimethyl phenyl methoxy silane, dimethyl benzyl methoxy silane, and dimethyl phenethyl methoxy silane.

Illustrative example of the organic group shown by $R^2$ and $R^3$ includes an organic group having one or more of a carbon-oxygen single bond or a carbon-oxygen double bond. Specifically an organic group having one or more of a group selected from the group consisting of an epoxy group, an ester group, an alkoxy group, and a hydroxyl group may be mentioned. Illustrative example thereof includes the group shown by the following general formula (1).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \qquad (1)$$

wherein P represents a hydrogen atom, a hydroxyl group, an epoxy ring, epoxy ring

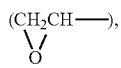

an alkoxy group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$ and $Q_4$ independently represents $-C_qH_{(2q-p)}P_p$- wherein P represents the same meaning as before; p represents an integer of 0 to 3; q represents an integer of 0 to 10 (however, q=0 means a single bond)); u represents an integer of 0 to 3; each of $S_1$ and $S_2$ independently represents —O—, —CO—, —OCO—, —COO—, or —OCOO—. Each of v1, v2, and v3 independently represents 0 or 1. Concurrently with the above, T represents an alicyclic or an aromatic divalent group optionally containing a heteroatom, and illustrative example of the alicyclic or the aromatic T optionally containing a heteroatom such as an oxygen atom includes those shown below. In T, respective bonding sites to $Q_2$ and to $Q_3$ are not particularly restricted; and the sites are appropriately selected by considering reactivity due to a steric factor, availability of a commercially available reagent, and so on.

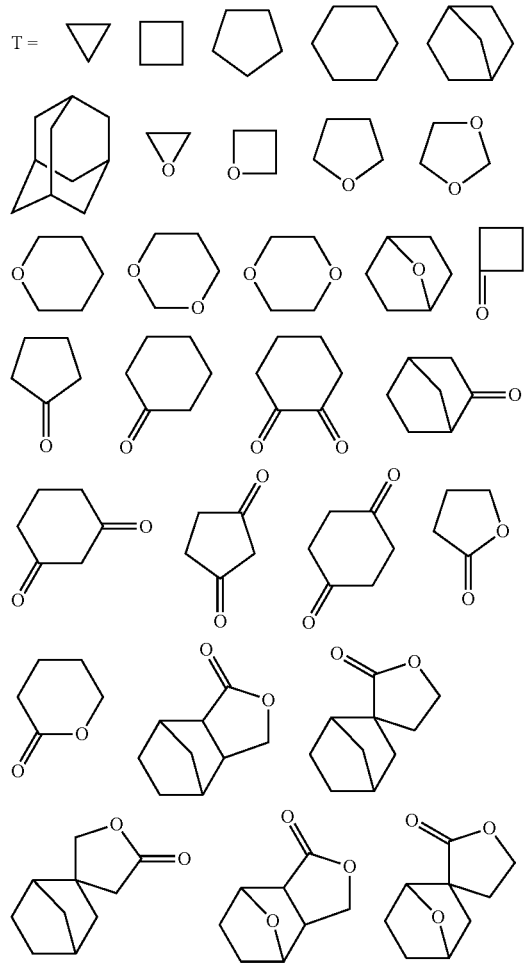

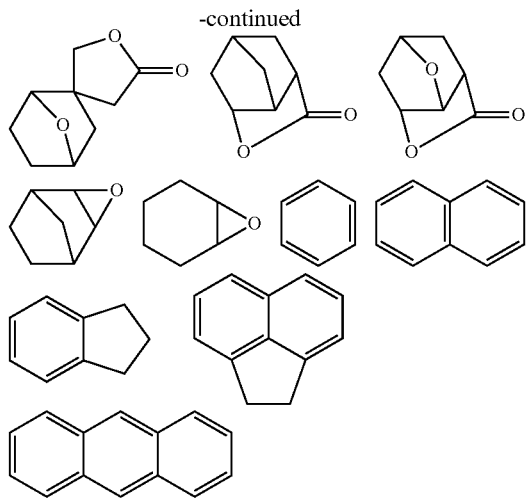

Preferable example of the organic group which is shown by the general formula (1) and has one or more of a carbon-oxygen single bond or a carbon-oxygen double bond includes those shown below.

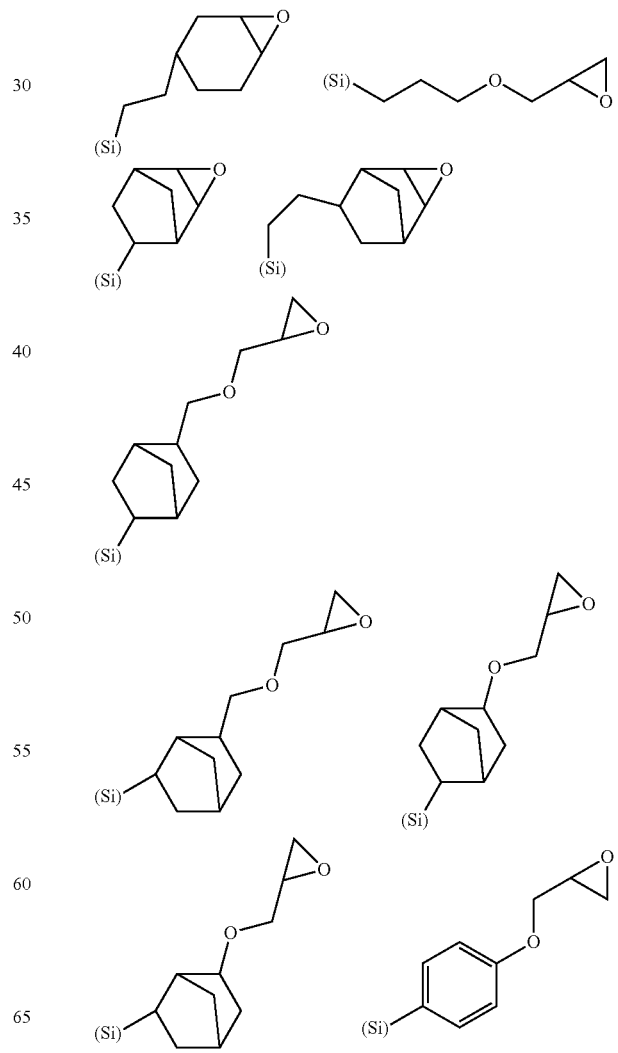

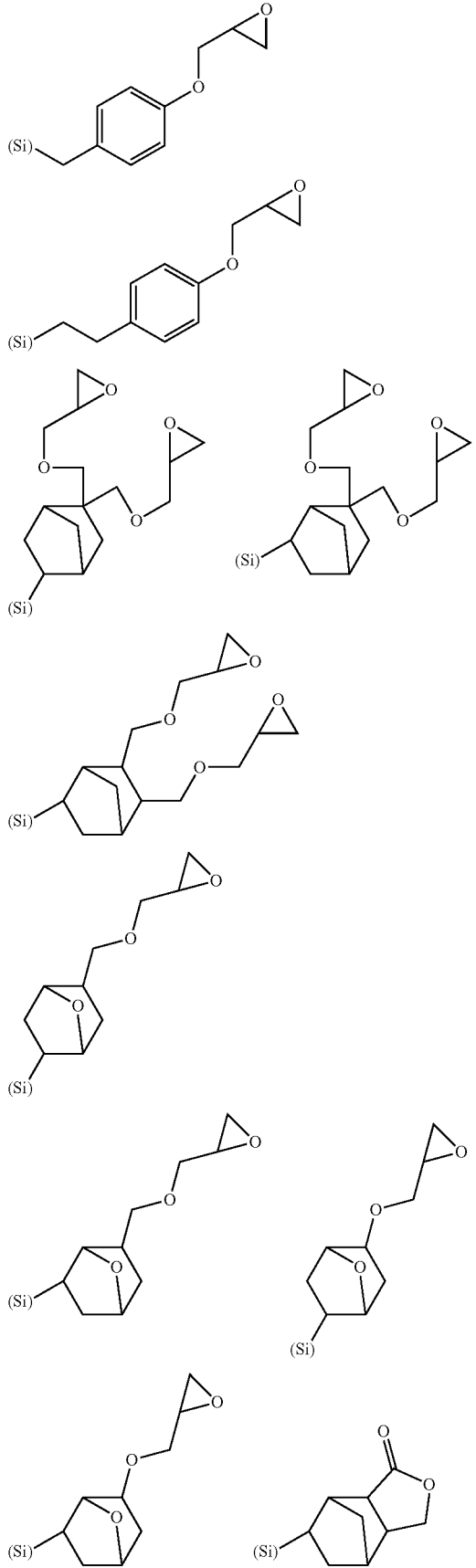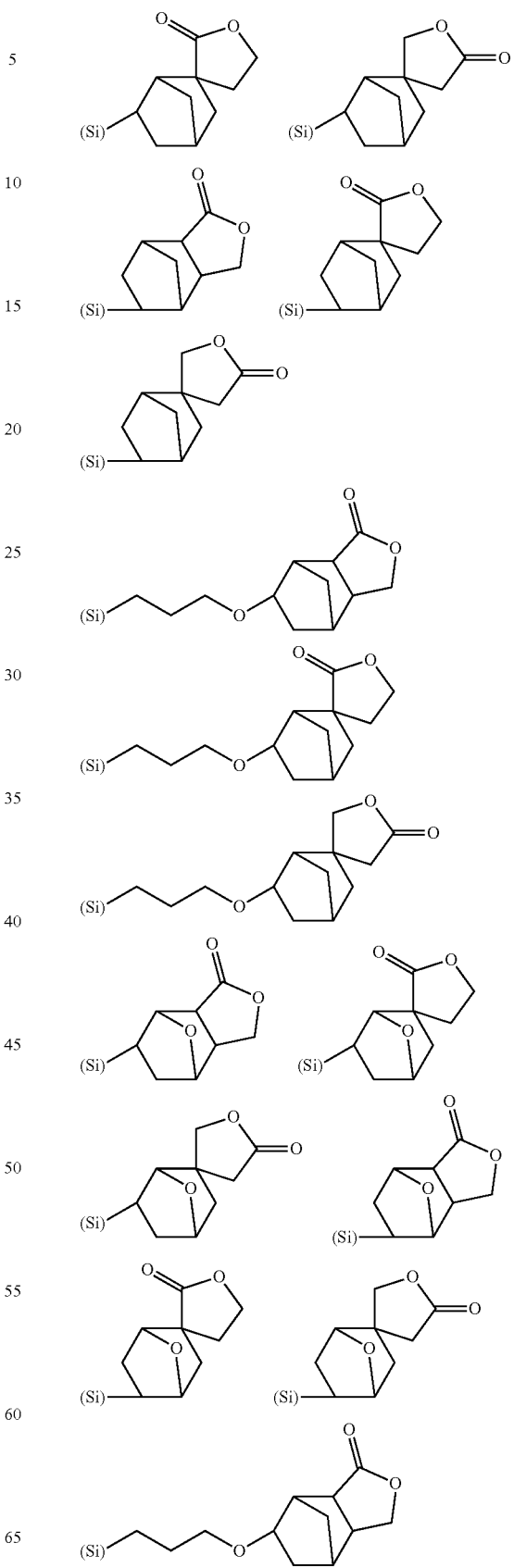

41
-continued
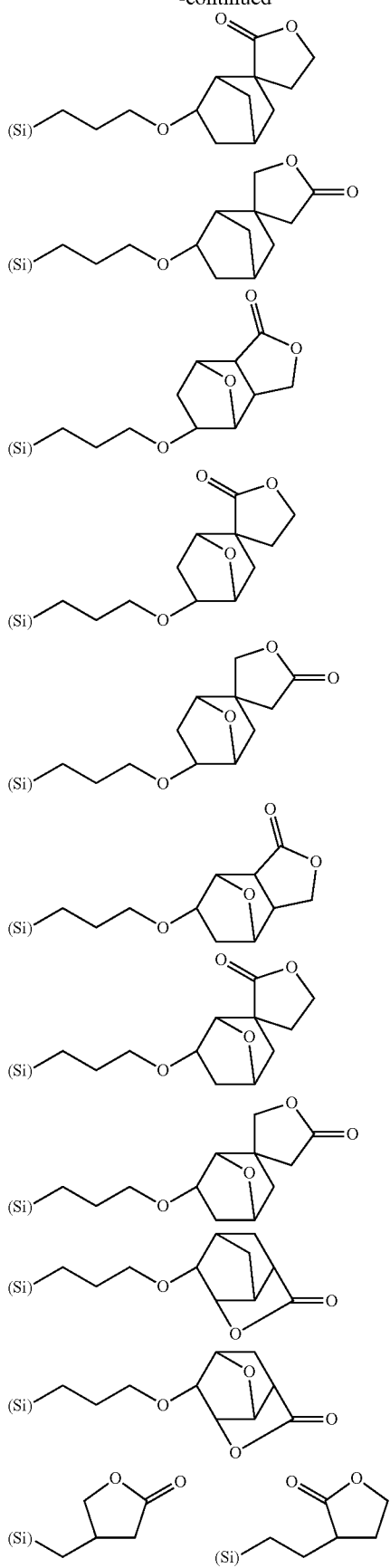
42
-continued
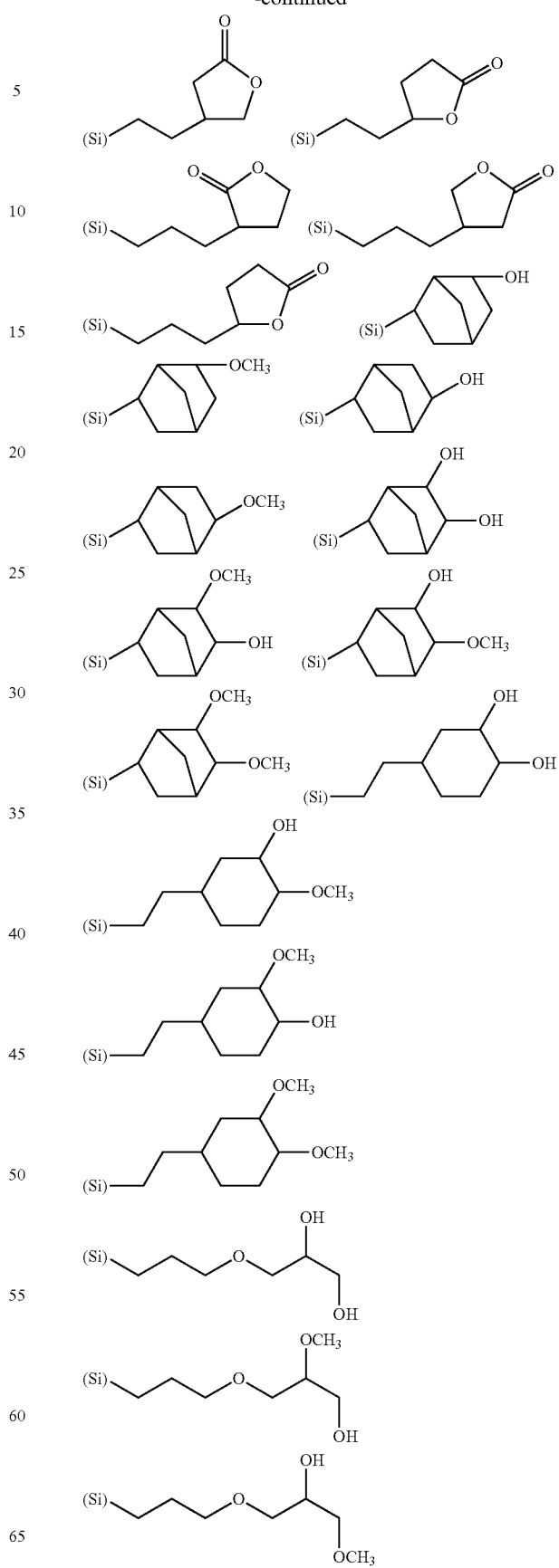

-continued

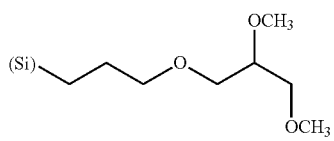
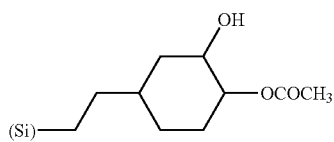
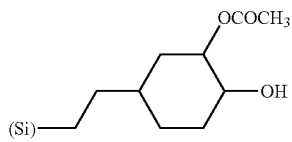
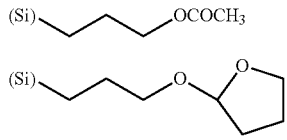
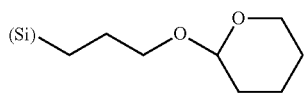
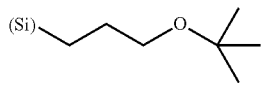
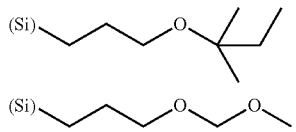
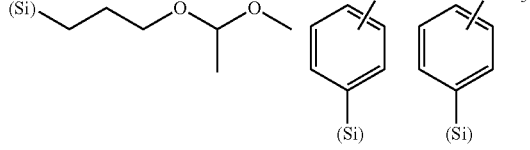
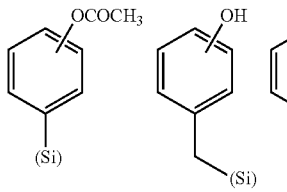
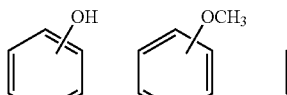
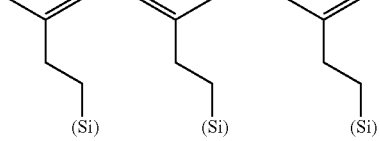

Alternatively, illustrative example of the organic group shown by $R^2$ and $R^3$ includes an organic group having a silicon-silicon bond. Groups shown below are the specific examples thereof.

Synthesis Methods of the Silicon-Containing Compound
Synthesis Method 1: Acid Catalyst The silicon-containing compound used in the present invention may be produced, for example, by hydrolysis condensation of a raw material that contains the hydrolysable silicon compound mentioned above in the presence of an acid catalyst.

Illustrative example of the acid catalyst used for this hydrolysis condensation includes an organic acid such as formic acid, acetic acid, oxalic acid, and maleic acid; and hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. Use amount of the catalyst is $1\times10^{-6}$ to 10 moles, preferably $1\times10^{-5}$ to 5 moles, or more preferably $1\times10^{-4}$ to 1 mole, relative to 1 mole of the monomer.

Amount of water to obtain the silicon-containing compound by the hydrolysis condensation of the raw material that contains the hydrolysable silicon compound is preferably 0.01 to 100 moles, more preferably 0.05 to 50 moles, or still more preferably 0.1 to 30 moles, relative to 1 mole of the hydrolysable substituent which is bonded to the raw material that contains the hydrolysable silicon compound. When the amount is 100 moles or less, small equipment can be used for the reaction; and thus, it is economical.

Operational procedure of adding the raw material that contains the hydrolysable silicon compound into an aqueous catalyst solution is employed to start the hydrolysis condensation reaction. At this time, an organic solvent may be added in the aqueous catalyst solution, or the raw material that contains the hydrolysable silicon compound may be diluted by an organic solvent, or both of them may be done. The reaction temperature is 0 to 100° C., or preferably 5 to 80° C. A method, wherein the temperature thereof is kept at 5 to 80° C. during the time of gradual addition of the raw material that contains the hydrolysable silicon compound, and then, aging is done at 20 to 80° C., is preferable.

Preferable example of the organic solvent which can be added to the aqueous catalyst solution or can dilute the raw material that contains the silicon compound includes methanol, ethanol, 1-propanol, 2-propanol, 1-butanol, 2-butanol, 2-methyl-1-propanol, acetone, acetonitrile, tetrahydrofuran, toluene, hexane, ethyl acetate, acetone, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and a mixture of these solvents.

Among these organic solvents, a water-soluble solvent is preferable. Illustrative example thereof includes an alcohol such as methanol, ethanol, 1-propanol, and 2-propanol; a polyol such as ethylene glycol and propylene glycol; a polyol condensation derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, and tetrahydrofuran. Among them, a solvent having a boiling point of 100° C. or lower is particularly preferable.

Meanwhile, use amount of the organic solvent is preferably 0 to 1,000 mL, or especially preferably 0 to 500 mL, relative to 1 mole of the raw material that contains the hydrolysable silicon compound. Less use amount of the organic solvent is more economical because its reaction vessel becomes smaller.

Thereafter, if necessary, a neutralization reaction of the catalyst is carried out to obtain an aqueous reaction mixture solution. Use amount of a alkaline substance for neutralization is preferably 0.1 to 2 equivalents relative to the acid used as the catalyst. Any alkaline substance may be used as far as the substance shows a alkaline property in water.

Then, it is preferable to remove byproducts such as an alcohol produced by the hydrolysis condensation reaction from the reaction mixture under reduced pressure or the like. Temperature to heat the reaction mixture in this operation is preferably 0 to 100° C., more preferably 10 to 90° C., or still more preferably 15 to 80° C., though it depends on kinds of an added organic solvent and an alcohol produced by the reaction. Degree of the reduced pressure in this operation is preferably an atmospheric pressure or lower, more preferably 80 kPa or lower in the absolute pressure, or still more preferably 50 kPa or lower in the absolute pressure, though it depends on kinds of an organic solvent, an alcohol, and so forth to be removed, an exhausting equipment, a condensation equipment, and heating temperature. Although it is difficult to know exactly an amount of the alcohol removed, it is preferable that about 80% or more by mass of a produced alcohol and so forth be removed.

Then, the acid catalyst used in the hydrolysis condensation reaction may be removed from the reaction mixture. The acid catalyst may be removed by mixing the reaction mixture with water, and then extracting the silicon-containing compound by an organic solvent. The organic solvent which can dissolve the silicon-containing compound while can be separated into two layers when mixed with water is preferably used. Illustrative example of the organic solvent includes methanol, ethanol, 1-propanol 2-propanol, 1-butanol, 2-butanol, 2-methyl-1-propanol, acetone, tetrahydrofuran, toluene, hexane, ethyl acetate, acetone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and a mixture of them.

In addition, a mixture of a water-soluble organic solvent and a poorly water-soluble organic solvent may also be used. Illustrative examples of the preferable mixture include a mixture of methanol and ethyl acetate, a mixture of ethanol and ethyl acetate, a mixture of 1-propanol and ethyl acetate, a mixture of 2-propanol and ethyl acetate, a mixture of butanediol monomethyl ether and ethyl acetate, a mixture of propylene glycol monomethyl ether and ethyl acetate, a mixture of ethylene glycol monomethyl ether and ethyl acetate, a mixture of butanediol monoethyl ether and ethyl acetate, a mixture of propylene glycol monoethyl ether and ethyl acetate, a mixture of ethylene glycol monoethyl ether and ethyl acetate, a mixture of butanediol monopropyl ether and ethyl acetate, a mixture of propylene glycol monopropyl ether and ethyl acetate, a mixture of ethylene glycol monopropyl ether and ethyl acetate, a mixture of methanol and methyl isobutyl ketone, a mixture of ethanol and methyl isobutyl ketone, a mixture of 1-propanol and methyl isobutyl ketone, a mixture of 2-propanol and methyl isobutyl ketone, a mixture of propylene glycol monomethyl ether and methyl isobutyl ketone, a mixture of ethylene glycol monomethyl ether and methyl isobutyl ketone, a mixture of propylene glycol monoethyl ether and methyl isobutyl ketone, a mixture of ethylene glycol monoethyl ether and methyl isobutyl ketone, a mixture of propylene glycol monopropyl ether and methyl isobutyl ketone, a mixture of ethylene glycol monopropyl ether and methyl isobutyl ketone, a mixture of methanol and cyclopentyl methyl ether, a mixture of ethanol and cyclopentyl methyl ether, a mixture of 1-propanol and cyclopentyl methyl ether, a mixture of 2-propanol and cyclopentyl methyl ether, a mixture of propylene glycol monomethyl ether and cyclopentyl methyl ether, a mixture of ethylene glycol monomethyl ether and cyclopentyl methyl ether, a mixture of propylene glycol monoethyl ether and cyclopentyl methyl ether, a mixture of ethylene glycol monoethyl ether and cyclopentyl methyl ether, a mixture of propylene glycol monopropyl ether and cyclopentyl methyl ether, a mixture of ethylene glycol monopropyl ether and cyclopentyl methyl ether, a mixture of methanol and propylene glycol methyl ether acetate, a mixture of ethanol and propylene glycol methyl ether acetate, a mixture of 1-propanol and propylene glycol methyl ether acetate, a mixture of 2-propanol and propylene glycol methyl ether acetate, a mixture of propylene glycol monomethyl ether and propylene glycol methyl ether acetate, a mixture of ethylene glycol monomethyl ether and propylene glycol methyl ether acetate, a mixture of propylene glycol monoethyl ether and propylene glycol methyl ether acetate, a mixture of ethylene glycol monoethyl ether and propylene glycol methyl ether acetate, a mixture of propylene glycol monopropyl ether and propylene glycol methyl ether acetate, and a mixture of ethylene glycol monopropyl ether and propylene glycol methyl ether acetate, though the combination is not limited to the above.

Meanwhile, mixing ratio of the water-soluble organic solvent to the poorly water-soluble organic solvent is appropriately selected; but the amount of the water-soluble organic solvent is 0.1 to 1,000 parts by mass, preferably 1 to 500 parts by mass, or more preferably 2 to 100 parts by mass, relative to 100 parts by mass of the poorly water-soluble organic solvent.

Then, washing by neutral water may be done. So-called de-ionized water or ultrapure water may be used. Amount of this water is 0.01 to 100 liters, preferably 0.05 to 50 liters, or more preferably 0.1 to 5 liters, relative to 1 liter of the silicon-containing compound solution. This washing operation may be done in such a way that the both solutions are mixed in a vessel by agitation, and then settled to separate a water layer. Number of washing is 1 or more, or preferably about 1 to about 5, because washing of 10 times or more is not worth to have full effects.

Alternatively, the acid catalyst may be removed by use of an ion-exchange resin, or in such a way that it is neutralized by an epoxy compound such as ethylene oxide and propylene oxide, and then removed. These methods may be selected appropriately according to the acid catalyst used in the reaction.

In this operation of water-washing, number of washing and amount of water for washing may be determined appropriately in view of effects of catalyst removal and fractionation because there is an instance that a part of the silicon-containing compound escapes into a water layer, thereby substantially the same effect as fractionation operation can be obtained.

To any of the silicon-containing compound solution having the remaining acid catalyst therein and the silicon-containing compound solution having the acid catalyst removed therefrom is added a final solvent, and then, the solvents therein are exchanged under reduced pressure to obtain an intended solution of the silicon-containing compound. Temperature at the time of this solvent exchange operation is preferably 0 to 100° C., more preferably 10 to 90° C., or still more preferably 15 to 80° C., though it is depending on the reaction solvent and the extraction solvent to be removed. Degree of the reduced pressure in this operation is preferably an atmospheric pressure or lower, more preferably 80 kPa or lower in the absolute pressure, or still more preferably 50 kPa or lower in the absolute pressure, though it depends on kinds of the extraction solvent to be removed, an exhausting equipment, a condensation equipment, and heating temperature.

In this operation, in order to improve stability of the silicon-containing compound during the time of solvent exchange, an alcohol having a cyclic ether substituent with the valency thereof being one, or two or higher, examples thereof being described in paragraphs of [0181] to [0182] in the Japanese Patent Laid-Open Publication No. 2009-126940, may be added as a stabilizer. Adding amount thereof is 0 to 25 parts by mass, preferably 0 to 15 parts by mass, and more preferably 0 to 5 parts by mass, or 0.5 parts or more by mass when it is added, relative to 100 parts by mass of the silicon-containing compound contained in the solution before the solvent exchange. The solvent exchange may be done, if the stabilizer is added therein, by adding an alcohol having a cyclic ether substituent with the valency thereof being one, or two or higher into the solution before the solvent exchange.

There is a risk that the silicon-containing compound undergoes a condensation reaction further when it is concentrated beyond a certain concentration level whereby changing to the state where it cannot be dissolved into an organic solvent again; and thus, it is preferable that the compound be kept in the state of solution with proper concentration. However, if the concentration thereof is too dilute, amount of the solvent becomes excessively large; and thus, to keep the solution in the state of proper concentration is economical and preferable. The concentration thereof at this time is preferably in the range of 0.1 to 20% by mass.

A preferable solvent finally added to the silicon-containing compound solution is an alcohol solvent; and especially preferable solvents thereof are monoalkyl ether derivatives of ethylene glycol, diethylene glycol, triethylene glycol, propylene glycol, dipropylene glycol, butanediol, and so on. Specific example of the preferable solvent includes butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether.

Alternatively, if these solvents are a main solvent, a non-alcoholic solvent may be added thereinto as an adjuvant solvent. Illustrative example of this adjuvant solvent includes acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, and cyclopentyl methyl ether.

In an alternative operational procedure using an acid catalyst, the hydrolysis reaction is started by adding water or a water-containing organic solvent into the raw material that contains the hydrolysable silicon compound or into an organic solution of this. In this operation, the catalyst may be added into the raw material that contains the hydrolysable silicon compound or the organic solution of this, or into water or the water-containing organic solvent. The reaction temperature is 0 to 100° C., or preferably 10 to 80° C. A method, wherein the temperature thereof is kept at 10 to 50° C. during the time of gradual addition of water, and then, aging is done at 20 to 80° C., is preferable.

When the organic solvent is used, a water-soluble solvent is preferable. Illustrative example thereof includes methanol, ethanol, 1-propanol, 2-propanol, 1-butanol, 2-butanol, 2-methyl-1-propanol, acetone, tetrahydrofuran, and acetonitrile; a polyol condensation derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether acetate; and a mixture of these solvents.

Use amount of these organic solvents is preferably 0 to 1,000 mL, or especially preferably 0 to 500 mL, relative to 1 mole of the raw material that contains the hydrolysable silicon compound. Less use amount of the organic solvent is more economical because the reaction vessel thereof becomes smaller. Work-up of the reaction mixture thus obtained is done in a manner similar to those mentioned before, whereby obtaining the silicon-containing compound.

Synthesis Method 2: Alkaline Catalyst

Alternatively, the silicon-containing compound may be produced, for example, by hydrolysis condensation of a raw material that contains the hydrolysable silicon compound in the presence of an alkaline catalyst. Illustrative example of the alkaline catalyst used in this reaction includes methylamine, ethylamine, propylamine, butylamine, ethylene diamine, hexamethylene diamine, dimethylamine, diethylamine, ethyl methyl amine, trimethylamine, triethylamine, tripropylamine, tributylamine, cyclohexylamine, dicyclohexylamine, monoethanol amine, diethanol amine, dimethyl monoethanol amine, monomethyl diethanol amine, triethanol amine, diazabicyclooctane, diazabicyclocyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethyl ammonium hydroxide, cholin hydroxide, tetrapropyl ammonium hydroxide, tetrabutyl ammonium hydroxide, ammonia, lithium hydroxide, sodium hydroxide, potassium hydroxide, barium hydroxide, and calcium hydroxide. Use amount of the catalyst is $1 \times 10^{-6}$ to 10 moles, preferably $1 \times 10^{-5}$ to 5 moles, or more preferably $1 \times 10^{-4}$ to 1 mole, relative to 1 mole of the raw material that contains the hydrolysable silicon compound.

Amount of water to obtain the silicon-containing compound by the hydrolysis condensation reaction of the foregoing raw material that contains the hydrolysable silicon compound is preferably 0.1 to 50 moles, relative to 1 mole of the hydrolysable substituent which is bonded to the raw material that contains the hydrolysable silicon compound. When the amount is not more than 50 moles, small equipment can be used for the reaction; and thus, it is economical.

Operational procedure of adding the raw material that contains the hydrolysable silicon compound into an aqueous catalyst solution is employed to start the hydrolysis condensation reaction. At this time, an organic solvent may be added in the aqueous catalyst solution, or the raw material that contains the hydrolysable silicon compound may be diluted by an organic solvent, or both of them may be done. The reaction temperature is 0 to 100° C., or preferably 5 to 80° C. A method, wherein the temperature thereof is kept at 5 to 80° C. during the time of gradual addition of the raw material that contains the hydrolysable silicon compound, and then, aging is done at 20 to 80° C., is preferable.

Preferable organic solvents which can be added to the aqueous alkaline catalyst solution or can dilute the raw material that contains the hydrolysable silicon compound are similar to those mentioned as the examples of the organic solvent which can be added into the aqueous acid catalyst solution. Meanwhile, use amount of the organic solvent is preferably 0 to 1,000 mL relative to 1 mole of the raw material that contains the hydrolysable silicon compound to carry out the reaction economically.

Thereafter, if necessary, a neutralization reaction of the catalyst is carried out to obtain an aqueous reaction mixture solution. Use amount of an acidic substance for neutralization is preferably 0.1 to 2 equivalents relative to the alkaline substance used as the catalyst. Any acidic substance may be used as far as the substance shows an acidic property in water.

Then, it is preferable to remove byproducts such as an alcohol produced by the hydrolysis condensation reaction from the reaction mixture under reduced pressure or the like. Temperature to heat the reaction mixture in this operation is preferably 0 to 100° C., more preferably 10 to 90° C., or still more preferably 15 to 80° C., though it depends on kinds of the added organic solvent and the alcohol produced by the reaction. Degree of the reduced pressure in this operation is preferably an atmospheric pressure or lower, more preferably 80 kPa or lower in the absolute pressure, or still more preferably 50 kPa or lower in the absolute pressure, though it depends on kinds of the organic solvent and the alcohol to be removed, an exhausting equipment, a condensation equipment, and heating temperature. Although it is difficult to know exactly an amount of the alcohol removed, it is preferable that about 80% or more by mass of a produced alcohol be removed.

Then, to remove the alkaline catalyst used in the hydrolysis condensation reaction, the silicon-containing compound is extracted by an organic solvent. An organic solvent which can dissolve the silicon-containing compound while can be separated into two layers when mixed with water is preferably used. Alternatively, a mixture of a water-soluble organic solvent and a poorly water-soluble organic solvent may be used.

Specific examples of the organic solvent which can be used to remove the alkaline catalyst are similar to the organic solvents and the mixture of a water-soluble organic solvent and a poorly water-soluble organic solvent which were specifically shown to remove the acid catalyst previously.

Meanwhile, mixing ratio of the water-soluble organic solvent to the poorly water-soluble organic solvent is appropriately selected; but the amount of the water-soluble organic solvent is 0.1 to 1,000 parts by mass, preferably 1 to 500 parts by mass, or more preferably 2 to 100 parts by mass, relative to 100 parts by mass of the poorly water-soluble organic solvent.

Then, washing is done by neutral water. So-called deionized water or ultrapure water may be used. Amount of this water is 0.01 to 100 liters, preferably 0.05 to 50 liters, or more preferably 0.1 to 5 liters, relative to 1 liter of the silicon-containing compound solution. This washing operation may be done in such a way that the both solutions are mixed in a vessel by agitation, and then settled to separate a water layer. Number of washing is 1 or more, or preferably about 1 to about 5, because washing of 10 times or more is not worth to have full effects.

To the silicon-containing compound solution after washing is added a final solvent, and then solvents therein are exchanged under reduced pressure to obtain an intended solution containing the silicon-containing compound. Temperature at the time of the solvent exchange is preferably 0 to 100°

C., more preferably 10 to 90° C., or still more preferably 15 to 80° C., though it depends on the extraction solvent to be removed. Degree of the reduced pressure in this operation is preferably an atmospheric pressure or lower, more preferably 80 kPa or lower in the absolute pressure, or still more preferably 50 kPa or lower in the absolute pressure, though it depends on kinds of the extraction solvent to be removed, an exhausting equipment, a condensation equipment, and heating temperature.

A preferable solvent finally added to the silicon-containing compound solution is an alcohol solvent; and especially preferable solvents thereof are a monoalkyl ether of ethylene glycol, diethylene glycol, triethylene glycol, and so on; and a monoalkyl ether of propylene glycol, dipropylene glycol, and so on. Specific example of the preferable solvent includes propylene glycol monomethyl ether, ethylene glycol monomethyl ether, propylene glycol monoethyl ether, ethylene glycol monoethyl ether, propylene glycol monopropyl ether, and ethylene glycol monopropyl ether.

In an alternative operational procedure using an alkaline catalyst, the hydrolysis reaction is started by adding water or a water-containing organic solvent into the raw material that contains the hydrolysable silicon compound or into an organic solution of this. In this operation, the catalyst may be added into the raw material that contains the hydrolysable silicon compound or into the organic solution of this, or into water or the water-containing organic solvent. The reaction temperature is 0 to 100° C., or preferably 10 to 80° C. A method, wherein the temperature thereof is kept at 10 to 50° C. during the time of gradual addition of water, and then, aging is done at 20 to 80° C., is preferable.

The organic solvent which can be used in the organic solution of the raw material that contains the hydrolysable silicon compound or in the water-containing organic solvent is preferably water-soluble; and illustrative example thereof includes methanol, ethanol, 1-propanol, 2-propanol, 1-butanol, 2-butanol, 2-methyl-1-propanol, acetone, tetrahydrofuran, and acetonitrile; a polyol condensation derivative such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether acetate; and a mixture of these solvents.

Molecular weight of silicon-containing compound obtained by the Synthesis Methods 1 or 2 mentioned above can be controlled not only by selection of the hydrolysable silicon compound but also by control of reaction conditions during the time of polymerization, wherein the molecular weight thereof is preferably 100,000 or less, more preferably 200 to 50,000, or still more preferably 300 to 30,000, because foreign matters or coating smears may be formed as the case may be. Meanwhile, the data of the weight-average molecular weight are of the polystyrene-equivalent molecular weight based on the standard polystyrene, wherein the data are obtained by a gel permeation chromatography (GPC) using RI as a detector and tetrahydrofuran as an eluting solvent.

The silicon-containing compound used in the present invention may be produced by treating the raw material that contains the hydrolysable silicon compound under the condition of using the foregoing acid or alkaline catalyst.

In addition, a silicon-containing compound which is produced from a mixture of this raw material that contains the hydrolysable silicon compound with a hydrolysable metal compound shown by the following general formula (2) under the condition of using the foregoing acid or alkaline catalyst may be used as the component of the composition usable in the present invention,

$$U(OR^7)_{m7}(OR^8)_{m8} \quad (2)$$

wherein $R^7$ and $R^8$ represent an organic group having 1 to 30 carbon atoms; m7+m8 is a number which is equal to a valency that is determined by U; m7 and m8 represent an integer of 0 or more; and U represents elements belonging to the groups III, IV, or V in the periodic table except for carbon and silicon elements.

Illustrative example of the hydrolysable metal compound (2) used therein includes the following compounds. In the case that U is boron, illustrative example of the compound shown by the general formula (2) includes, as the monomer, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

In the case that U is aluminum, illustrative example of the compound shown by the general formula (2) includes, as the monomer, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum 2,4-pentanedionate, and aluminum 2,2,6,6-tetramethyl-3,5-heptanedionate.

In the case that U is gallium, illustrative example of the compound shown by the general formula (2) includes, as the monomer, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium 2,4-pentanedionate, and gallium 2,2,6,6-tetramethyl-3,5-heptanedionate.

In the case that U is yttrium, illustrative example of the compound shown by the general formula (2) includes, as the monomer, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium 2,4-pentanedionate, and yttrium 2,2,6,6-tetramethyl-3,5-heptanedionate.

In the case that U is germanium, illustrative example of the compound shown by the general formula (2) includes, as the monomer, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

In the case that U is titanium, illustrative example of the compound shown by the general formula (2) includes, as the monomer, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis-2,4-pentanedionate, and titanium dibutoxy bis-2,4-pentanedionate.

In the case that U is hafnium, illustrative example of the compound shown by the general formula (2) includes, as the monomer, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis-2,4-pentanedionate, and hafnium dibutoxy bis-2,4-pentanedionate.

In the case that U is tin, illustrative example of the compound shown by the general formula (2) includes, as the monomer, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

In the case that U is arsenic, illustrative example of the compound shown by the general formula (2) includes, as the monomer, methoxy arsenic, ethoxy arsenic, propoxy arsenic, butoxy arsenic, and phenoxy arsenic.

In the case that U is antimony, illustrative example of the compound shown by the general formula (2) includes, as the monomer, methoxy antimony, ethoxy antimony, propoxy antimony, butoxy antimony, phenoxy antimony, antimony acetate, and antimony propionate.

In the case that U is niobium, illustrative example of the compound shown by the general formula (2) includes, as the monomer, methoxy niobium, ethoxy niobium, propoxy niobium, butoxy niobium, and phenoxy niobium.

In the case that U is tantalum, illustrative example of the compound shown by the general formula (2) includes, as the monomer, methoxy tantalum, ethoxy tantalum, propoxy tantalum, butoxy tantalum, and phenoxy tantalum.

In the case that U is bismuth, illustrative example of the compound shown by the general formula (2) includes, as the monomer, methoxy bismuth, ethoxy bismuth, propoxy bismuth, butoxy bismuth, and phenoxy bismuth.

In the case that U is phosphorous, illustrative example of the compound shown by the general formula (2) includes, as the monomer, trimethyl phosphate, triethyl phosphate, tripropyl phosphate, trimethyl phosphite, triethyl phosphite, tripropyl phosphite, and diphosphorous pentaoxide.

In the case that U is vanadium, illustrative example of the compound shown by the general formula (2) includes, as the monomer, vanadium oxide bis(2,4-pentanedionate), vanadium 2,4-pentanedionate, vanadium tributoxide oxide, and vanadium tripropoxide oxide.

In the case that U is zirconium, illustrative example of the compound shown by the general formula (2) includes, as the monomer, methoxy zirconium, ethoxy zirconium, propoxy zirconium, butoxy zirconium, phenoxy zirconium, zirconium dibutoxide bis(2,4-pentanedionate), and zirconium dipropoxide bis(2,2,6,6-tetramethyl-3,5-heptanedionate).

In addition, a silicon-containing compound shown by the general formula (D) having repeating units shown by the following general formulae (D-1) and (D-1) as its partial structure may also be used.

(D)

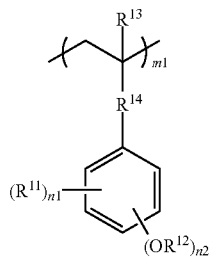
(D-1)

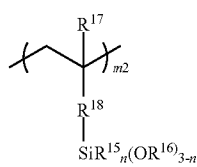
(D-2)

wherein $R^{11}$ represents a hydroxyl group or an organic group having 1 to 20 carbon atoms; $R^{12}$ represents an acid labile group; $0 \le n1 \le 3$, $1 \le n2 \le 3$, and $1 \le n1 \le 5$; $R^{13}$ represents a hydrogen atom or a methyl group; $R^{14}$ represents a single bond or a divalent organic group having 1 to 20 carbon atoms; $R^{15}$ represents a hydrogen atom or an organic group having 1 to 30 carbon atoms; $R^{16}$ represents an alkyl group having 1 to 6 carbon atoms; $R^{17}$ represents a hydrogen atom or a methyl group; $R^{18}$ represents a single bond or a divalent organic group having 1 to 20 carbon atoms; $0 \le n \le 2$; and m1 and m2 represent a molar ratio of the polymer that contains the above-mentioned partial structures with $0<m1<1$, $0<m2<1$, and $0<m1+m2 \le 1$.

Illustrative example of the silicon-containing compounds (D-1) and (D-2) that can be used in the patterning process of the present invention includes the structures shown by the following general formulae.

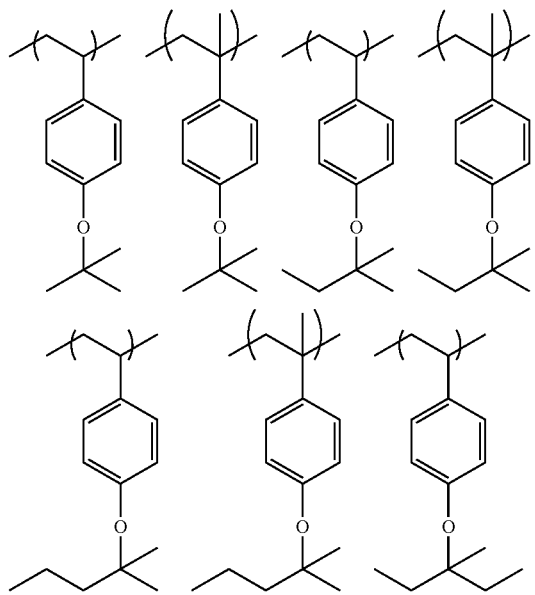

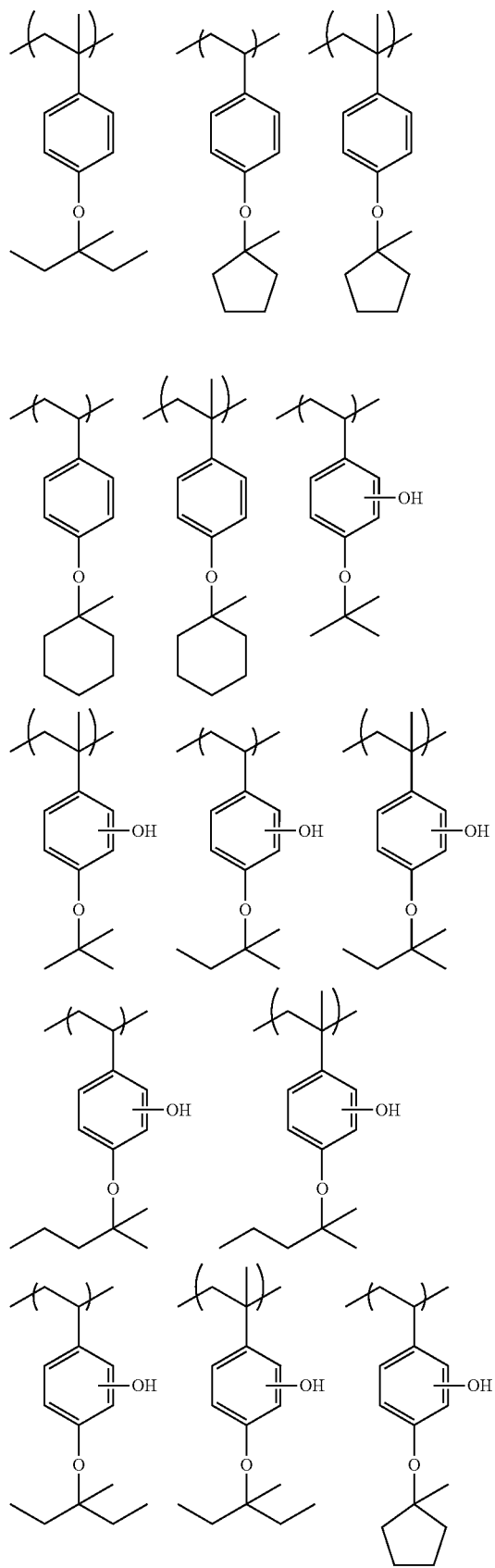
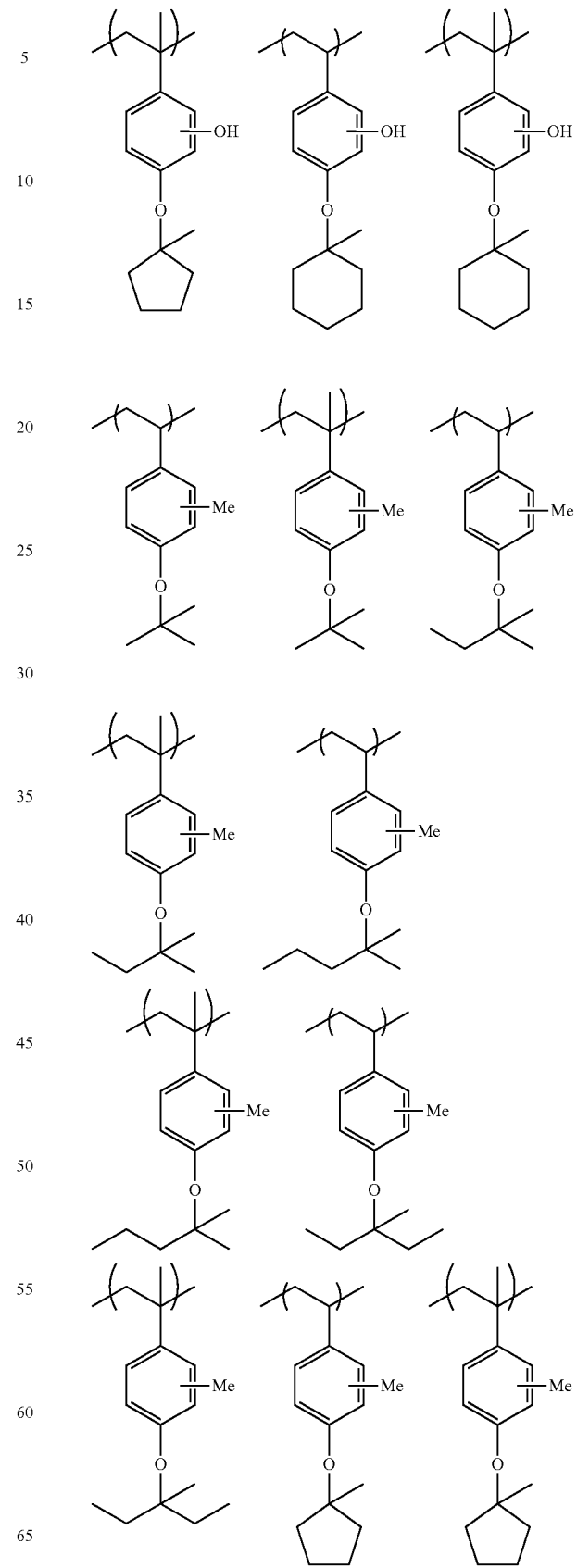

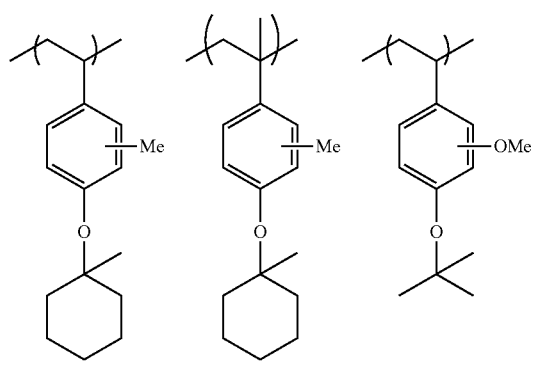
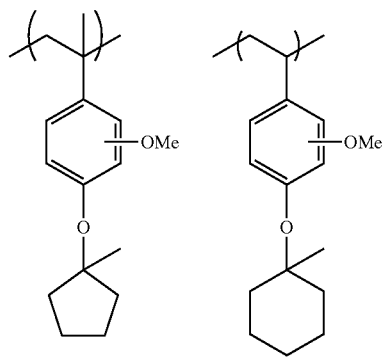
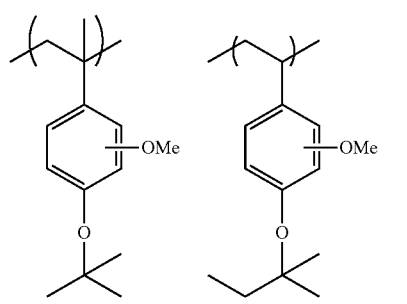
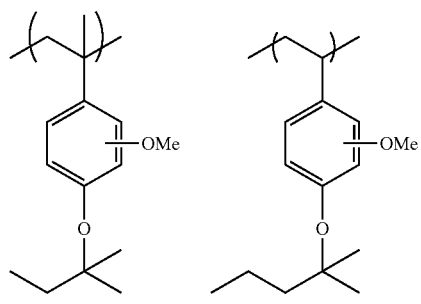
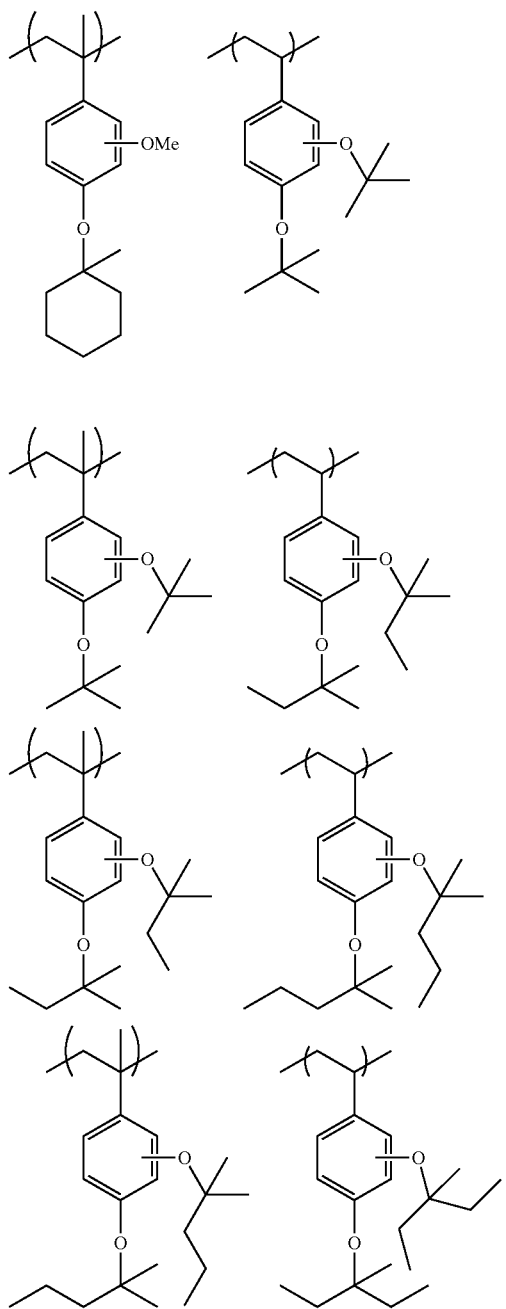

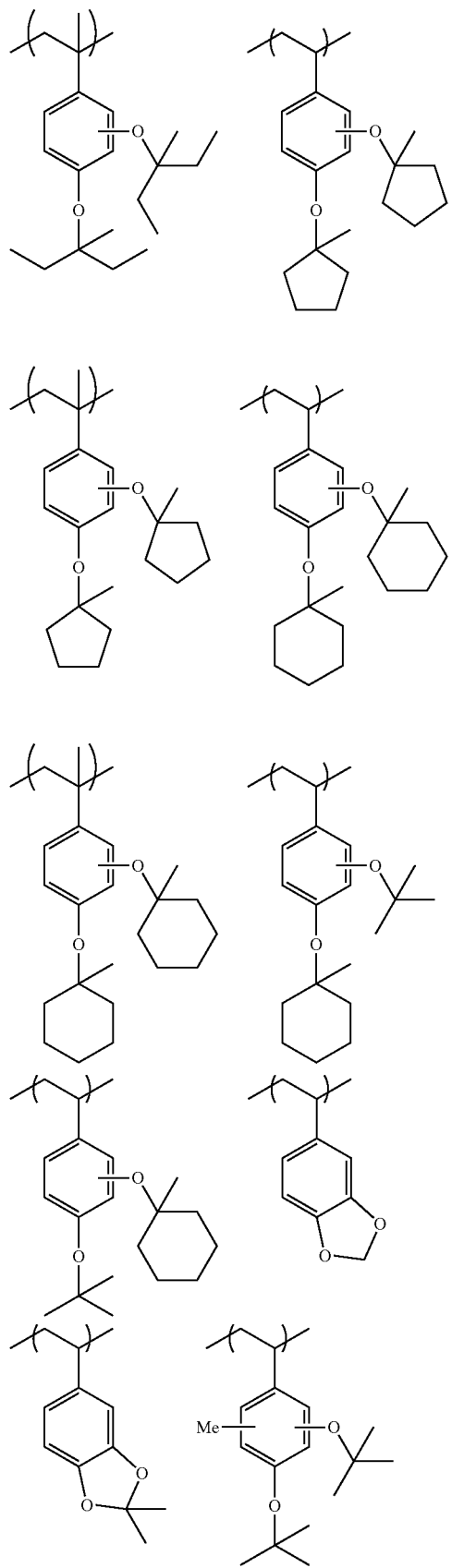
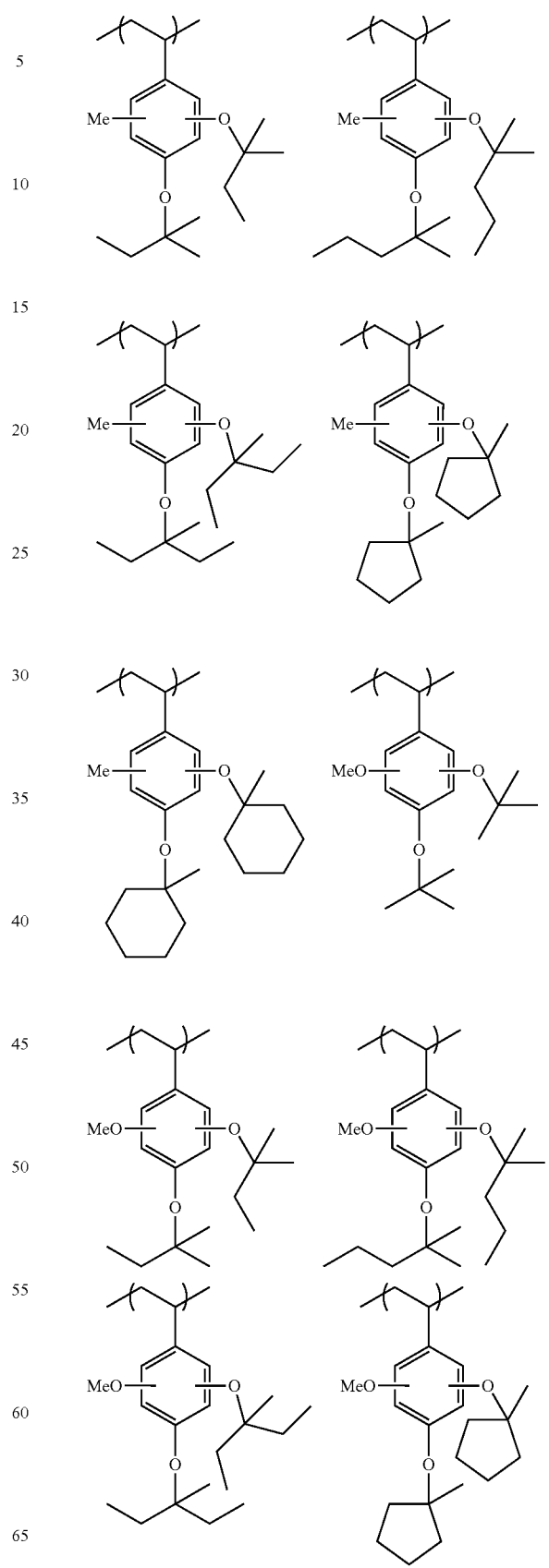

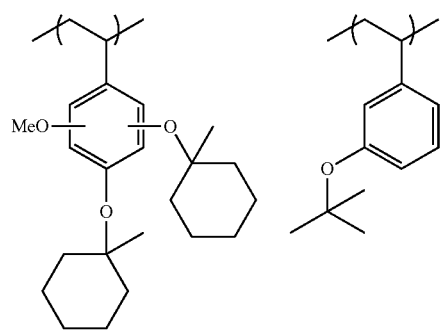
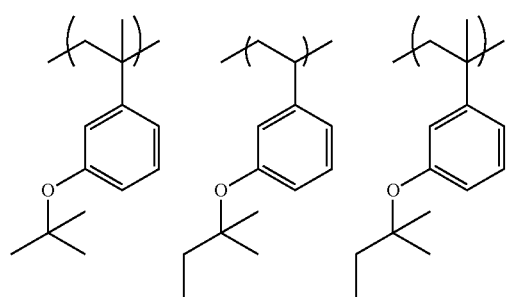
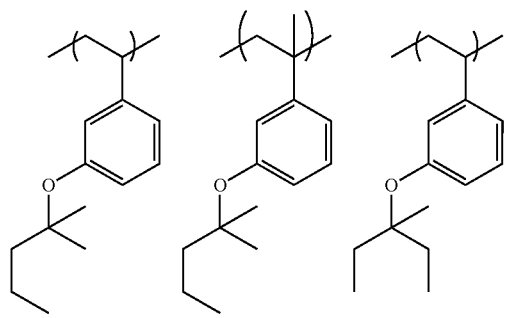
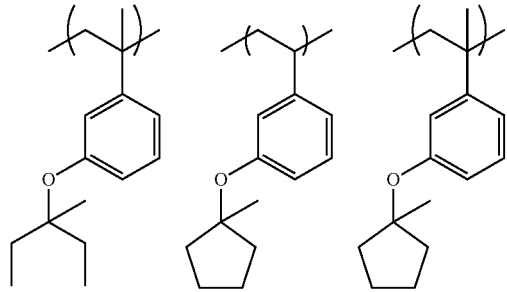
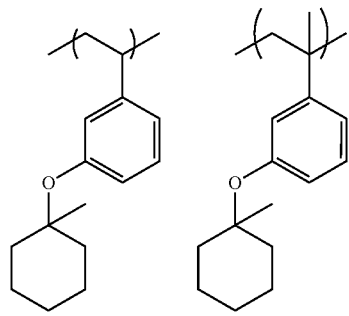
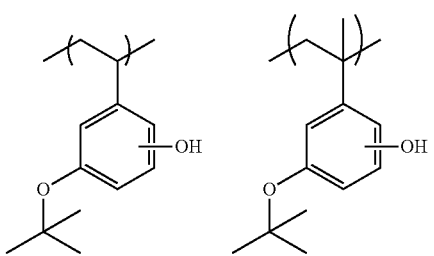
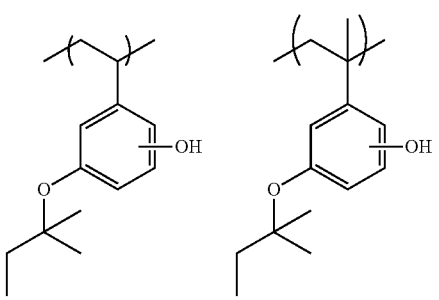
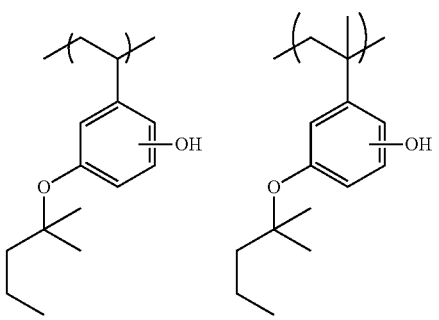
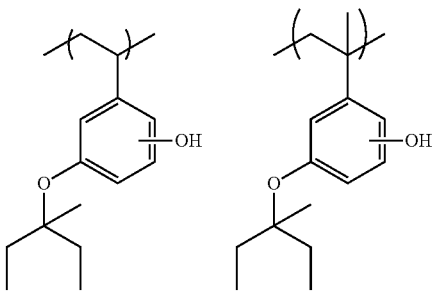
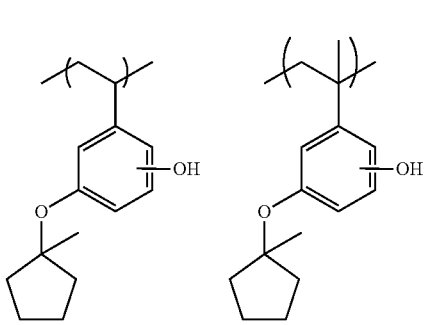

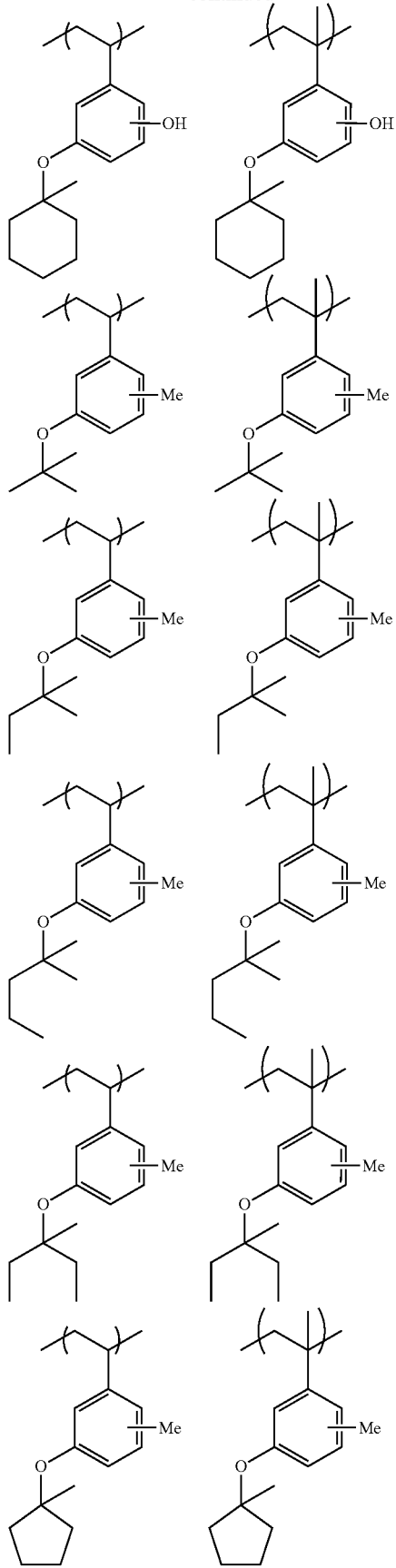
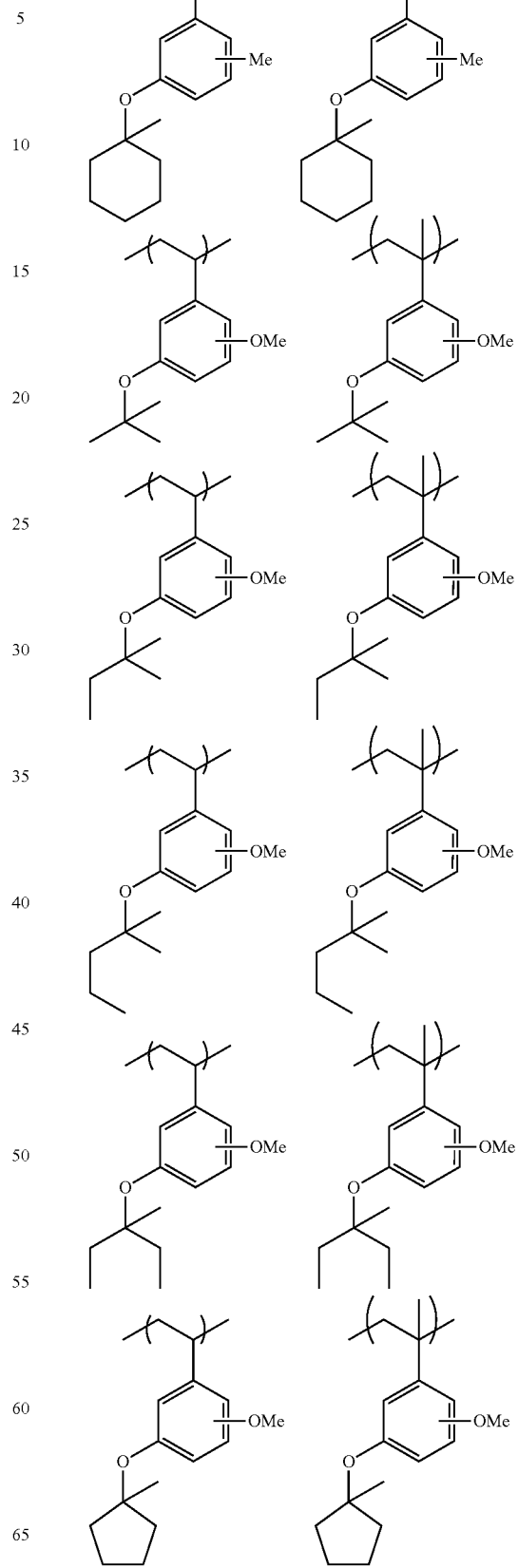

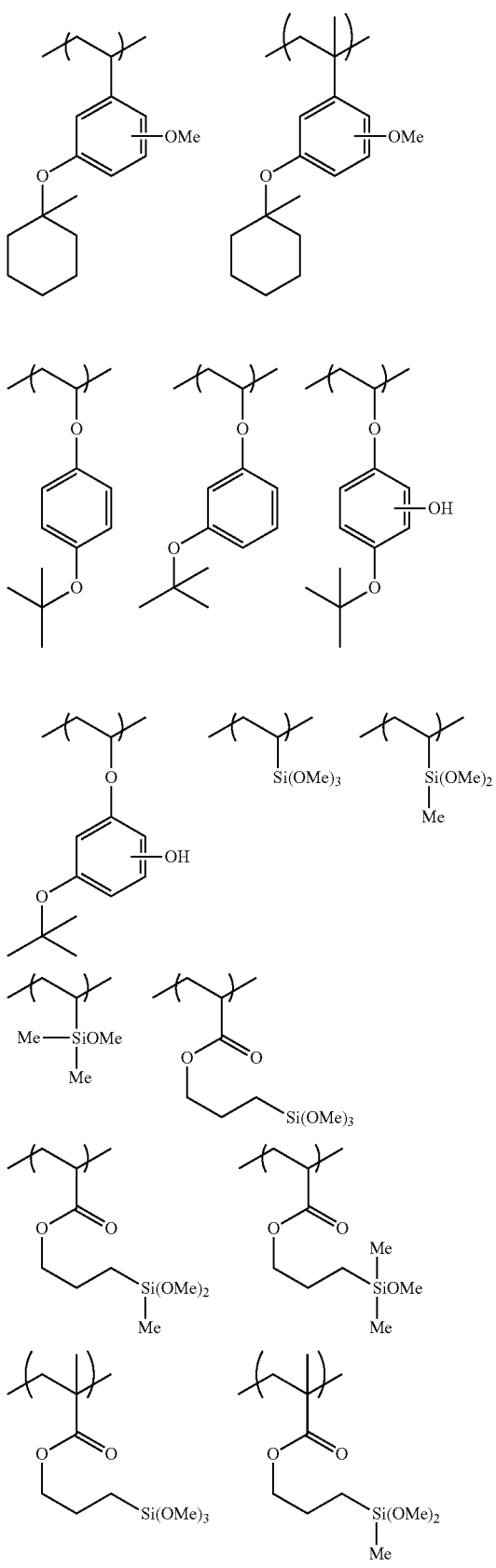
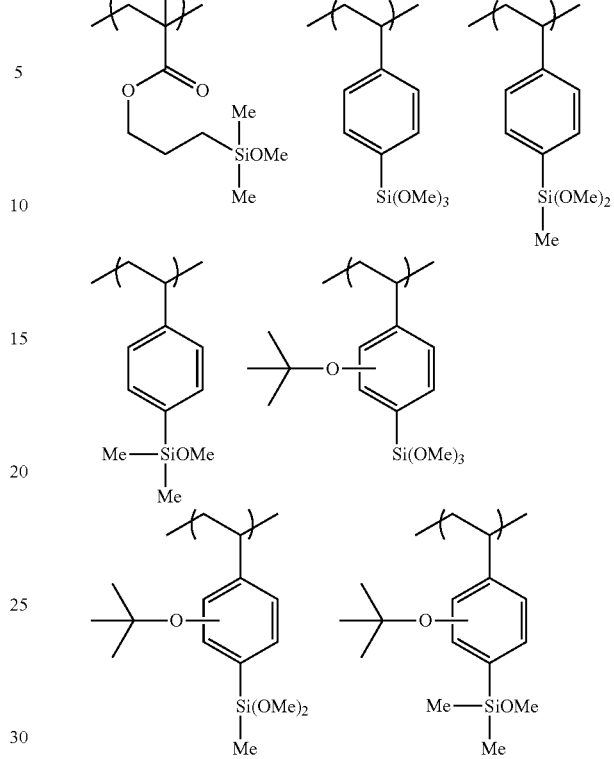

Other Components

Photo Acid Generator

It is preferable that the silicon-containing film composition used in the present invention contain a photo acid generator. By so doing, there appears a clear difference in contact angles between the exposed area and the unexposed area.

Illustrative example of the photo acid generator includes the followings:

(A-I): An onium salt shown by the following general formula (P1a-1), (P1a-2), or (P1b), (A-II) A diazomethane derivative shown by the following general formula (P2), (A-III) A glyoxime derivative shown by the following general formula (P3), (A-IV) A bissulfone derivative shown by the following general formula (P4), (A-V) A sulfonate ester of N-hydroxyimide compound shown by the following general formula (P5), (A-VI) A β-ketosulfonic acid derivative, (A-VII) A disulfone derivative, (A-VIII) A nitrobenzyl sulfonate derivative, and (A-IX) A sulfonate ester derivative.

wherein $R^{101a}$, $R^{101b}$, and $R^{101c}$ each represents a linear, a branched, or a cyclic alkyl group having 1 to 12 carbon atoms, an alkenyl group, an oxoalkyl group or an oxoalkenyl group, an optionally substituted aryl group having 6 to 20 carbon atoms, or an aralkyl group or an aryloxoalkyl group having 7 to 12 carbon atoms, wherein a part or all of hydrogen atoms in these groups may be substituted by an alkoxy group and the like. $R^{101b}$ and $R^{101c}$ may form a ring, and when a ring is formed, $R^{101b}$ and $R^{101c}$ each represents an alkylene group having 1 to 6 carbon atoms. $K^-$ represents a non-nucleophilic counter ion.

Each of $R^{101a}$, $R^{101b}$, and $R^{101c}$ in the above general formulae may be the same or different, and specific example of the alkyl group thereof includes, a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an admantyl group. Specific example of the alkenyl group includes a vinyl group, an allyl group, a propenyl group, a butenyl group, a hexenyl group, and a cyclohexenyl group. Specific example of the oxoalkyl group includes a 2-oxocyclopentyl group, 2-oxocyclohexyl group, a 2-oxopropyl group, a 2-cyclopentyl-2-oxoethyl group, a 2-cyclohexyl-2-oxoethyl group, and a 2-(4-methyl-cyclohexyl)-2-oxoethyl group. Specific example of the aryl group includes a phenyl group, and a naphthyl group; an alkoxyphenyl group such as a p-methoxyphenyl group, a m-methoxyphenyl group, an o-methoxyphenyl group, an ethoxyphenyl group, a p-tert-butoxyphenyl group, and a m-tert-butoxyphenyl group; an alkylphenyl group such as a 2-methylphenyl group, a 3-methylphenyl group, a 4-methylphenyl group, an ethylphenyl group, a 4-tert-butylphenyl group, a 4-butylphenyl group, and a dimethylphenyl group; an alkylnaphthyl group such as a methylnaphthyl group and an ethylnaphthyl group; an alkoxynaphthyl group such as a methoxynaphthyl group and an ethoxynaphtyl group; a dialkylnaphthyl group such as a dimethylnaphthyl group and a diethylnaphthyl group; and a dialkoxynaphthyl group such as dimethoxynaphthyl group and a diethoxynaphthyl group. Specific example of the aralkyl group includes a benzyl group, a phenylethyl group, and a phenetyl group. Specific example of the aryloxoalkyl group includes a 2-aryl-2-oxoethyl group such as a 2-phenyl-2-oxoethyl group, a 2-(1-naphthyl)-2-oxoethyl group, and a 2-(2-naphthyl)-2-oxoethyl group. Specific example of the non-nucleophilic counter ion $K^-$ includes a halide ion such as a chloride ion and a bromide ion; a fluoroalkyl sulfonate such as triflate, 1,1,1-trifluoroethane sulfonate, and nonafluorobutane sulfonate; an aryl sulfonate such as tosylate, benzene sulfonate, 4-fluorobenzene sulfonate, and 1,2,3,4,5-pentafluorobenzene sulfonate; an alkyl sulfonate such as mesylate and butane sulfonate.

group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group, and a cyclohexylmethyl group. Specific example of $R^{103}$ includes a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group, and a 1,4-cyclohexanedimethylene group. Specific examples of $R^{104a}$ and $R^{104b}$ include a 2-oxopropyl group, a 2-oxocyclopentyl group, a 2-oxocyclohexyl group, and a 2-oxocycloheptyl group. Specific example of $K^-$ includes the same groups as those explained in the formulae (P1a-1) and (P1a-2).

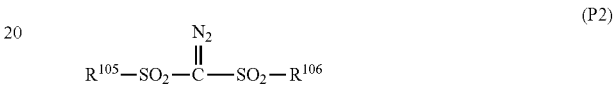
(P2)

wherein $R^{105}$ and $R^{106}$ represent a linear, a branched, or a cyclic alkyl group or a halogenated alkyl group having 1 to 12 carbon atoms, an optionally substituted aryl group or a halogenated aryl group having 6 to 20 carbon atoms, or an aralkyl group having 7 to 12 carbon atoms.

Illustrative example of the alkyl group in $R^{105}$ and $R^{106}$ of the above general formula includes a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a norbornyl group, and an admantyl group. Illustrative examples of the halogenated alkyl group includes a trifluoromethyl group, a 1,1,1-trifluoroethyl group, a 1,1,1-trichloroethyl group, and a nonafluorobutyl group. Illustrative of the aryl group includes a phenyl group; an alkoxyphenyl group such as a p-methoxyphenyl group, a m-methoxyphenyl group, an o-methoxyphenyl group, an ethoxyphenyl group, a p-tert-butoxyphenyl group, and a m-tert-butoxyphenyl group; and an alkylphenyl group such as a 2-methylphenyl group, a 3-methylphenyl group, a 4-methylphenyl group, an ethylphenyl group, a 4-tert-butylphenyl group, a 4-butylphenyl group, and a dimethylphenyl group. Illustrative example of the halogenated aryl group includes a fluorophenyl group, a chlorophenyl group, and a 1,2,3,4,5-pentafluorophenyl group. Illustrative example of the aralkyl group includes a benzyl group and a phenetyl group.

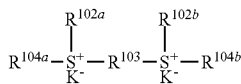
(P1b)

wherein $R^{101a}$ and $R^{102b}$ each represents a linear, a branched, or a cyclic alkyl group having 1 to 8 carbon atoms. $R^{103a}$ represents a linear, a branched, or a cyclic alkylene group having 1 to 10 carbon atoms. $R^{104a}$ and $R^{104b}$ each represents a 2-oxoalkyl group having 3 to 7 carbon atoms. $K^-$ represents a non-nucleophilic counter ion.

Specific examples of $R^{102a}$ and $R^{102b}$ in the above general formula include a methyl group, an ethyl group, a propyl

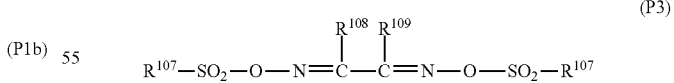
(P3)

wherein $R^{107}$, $R^{108}$, and $R^{109}$ represent a linear, a branched, or a cyclic alkyl group or a halogenated alkyl group having 1 to 12 carbon atoms, an aryl group or a halogenated aryl group having 6 to 20 carbon atoms, or an aralkyl group having 7 to 12 carbon atoms. $R^{108}$ and $R^{109}$ may form a ring structure by bonding with each other, and when a ring structure is formed, $R^{108}$ and $R^{109}$ each represents a linear or a branched alkylene group having 1 to 6 carbon atoms.

The alkyl group, the halogenated alkyl group, an aryl group, a halogenated aryl group, and aralkyl group in $R^{107}$, $R^{108}$, and $R^{109}$ in the above general formula may be the same groups as those explained in $R^{105}$ and $R^{106}$. Here, illustrative example of the alkylene group in $R^{108}$ and $R^{109}$ includes a methylene group, an ethylene group, a propylene group, a butylene group, and a hexylene group.

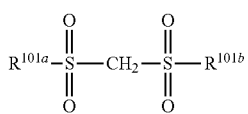
(P4)

wherein $R^{101a}$ and $R^{101b}$ each represents a linear, a branched, or a cyclic alkyl group having 1 to 12 carbon atoms, an alkenyl group, an oxoalkyl group or an oxoalkenyl group, an optionally substituted aryl group having 6 to 20 carbon atoms, or an aralkyl group or an aryloxyalkyl group having 7 to 12 carbon atoms, wherein a part or all of hydrogen atoms in these groups may be substituted by an alkoxy group and the like.

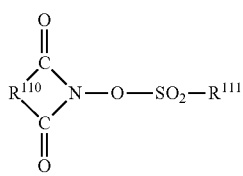
(P5)

wherein $R^{110}$ represents an arylene group having 6 to 10 carbon atoms, an alkylene group having 1 to 7 carbon atoms, or an alkenylene group having 2 to 6 carbon atoms, wherein a part or all of hydrogen atoms in these groups may be further substituted by a linear or a branched alkyl group or an alkoxy group having 1 to 4 carbon atoms, a nitro group, an acetyl group, or a phenyl group. $R^{111}$ represents a linear, a branched, or a cyclic alkyl group having 1 to 8 carbon atoms, an alkenyl group or an alkoxy group, a phenyl group, or a naphthyl group, wherein a part of or all of hydrogen atoms in these groups may be substituted further by an alkyl group or an alkoxy group having 1 to 4 carbon atoms; a phenyl group optionally substituted by an alkyl group having 1 to 4 carbon atoms, an alkoxy group, a nitro group, or an acetyl group; a heteroaromatic group having 3 to 5 carbon atoms; or a chlorine atom and a fluorine atom.

Here, illustrative example of the arylene group in $R^{110}$ of the above general formula includes a 1,2-phenylene group and a 1,8-naphthylene group; illustrative example of the alkylene group includes a methylene group, an ethylene group, a trimethylene group, a tetramethylene group, a phenylethylene group, and a norobornane-2,3-diyl group; and illustrative example of the alkenylene group includes a 1,2-vinylene group, a 1-phenyl-1,2-vinylene group, and a 5-norbornene-2,3-diyl group. Illustrative example of the alkyl group in $R^{111}$ includes a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantyl group; illustrative example of the alkenyl group includes a vinyl group, a 1-propenyl group, an allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group, and a 7-octenyl group; and illustrative example of the alkoxyalkyl group includes a methoxymethyl group, an ethoxymethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a pentyloxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group, and a methoxyheptyl group.

Here, illustrative example of the alkyl group having 1 to 4 carbon atoms that may optionally substitute the hydrogen atom of $R^{110}$ includes a methyl group, an ethyl group, a propyl group, an isopropyl group, a n-butyl group, an isobutyl group, and a tert-butyl group; illustrative example of the alkoxy group having 1 to 4 carbon atoms includes a methoxy group, an ethoxy group, a propoxy group, an isopropoxy group, a n-butoxy group, an isobutoxy group, and a tert-butoxy group; illustrative example of the phenyl group optionally substituted by an alkyl group having 1 to 4 carbon atoms, an alkoxy group, a nitro group, or an acetyl group includes a phenyl group, a tollyl group, a p-tert-butoxyphenyl group, a p-acetylphenyl group, and a p-nitrophenyl group; and illustrative example of the heteroaromatic group having 3 to 5 carbon atoms includes a pyridyl group and a furyl group.

Specific example of the photo acid generator includes the following substances. Onium salt: diphenyliodonium trifluoromethanesulfate, (p-tert-butoxyphenyl)phenyliodonium trifluoromethanesulfate, diphenyliodonium p-toluenesulfate, (p-tert-butoxyphenyl)phenyliodonium p-toluenesulfate, triphenylsulfonium trifluoromethanesulfate, (p-tert-butoxyphenyl) diphenylsulfonium trifluoromethanesulfate, bis(p-tert-butoxyphenyl)phenylsulfonium trifluoromethanesulfate, tris(p-tert-butoxyphenyl)sulfonium trifluoromethanesulfate, triphenylsulfonium p-toluenesulfate, (p-tert-butoxyphenyl) diphenylsulfonium p-toluenesulfate, bis(p-tert-butoxyphenyl)phenylsulfonium p-toluenesulfate, tris(p-tert-butoxyphenyl)sulfonium p-toluenesulfate, triphenylsulfonium nonafluolobutanesulfate, triphenylsulfonium, butanesulfate, trimethylsulfonium trifluoromethanesulfate, trimethylsulfonium p-toluenesulfate, cyclohexylmethyl(2-oxocyclohexyl) sulfonium trifluoromethanesulfate, cyclohexylmethyl(2-oxocyclohexyl)sulfonium p-toluenesulfate, dimethylphenylsulfonium trifluoromethanesulfate, dimethylphenylsulfonium p-toluenesulfate, dicyclohexylphenylsulfonium trifluoromethanesulfate, dicyclohexylphenylsulfonium p-toluenesulfate, trinaphthylsulfonium trifluoromethanesulfate, cyclohexylmethyl(2-oxocyclohexyl)sulfonium trifluoromethanesulfate, (2-norbonyl)methyl(2-oxocyclohexyl)sulfonium trifluoromethanesulfate, ethylenebis[methyl(2-oxocyclopentyl) sulfonium trifluoromethanesulfonate], 1,2'-naphthylcarbonyl methyl tetrahydrothiophenium triflate, and the like.

The diazomethane derivative: bis(benzenesulfonyl) diazomethane, bis(p-toluenesulfonyl) diazomethane, bis(xylenesulfonyl) diazomethane, bis(cyclohexylsulfonyl) diazomethane, bis(cyclopentylsulfonyl) diazomethane, bis(n-butylsulfonyl) diazomethane, bis(isobutylsulfonyl) diazomethane, bis(sec-butylsulfonyl) diazomethane, bis(n-propylsulfonyl) diazomethane, bis(isopropylsulfonyl) diazomethane, bis(tert-butylsulfonyl) diazomethane, bis(n-amylsulfonyl) diazomethane, bis(isoamylsulfonyl) diazomethane, bis(sec-amylsulfonyl) diazomethane, bis(tert-amylsulfonyl)

diazomethane, 1-cyclohexylsulfonyl-1-(tert-butylsulfonyl) diazomethane, 1-cyclohexylsulfonyl-1-(tert-amylsulfonyl) diazomethane, 1-tert-amylsulfonyl-1-(tert-butylsulfonyl) diazomethane, and the like.

The glyoxime derivative: bis-O-(p-toluenesulfonyl)-α-dimethyl glyoxime, bis-O-(p-toluenesulfonyl)-α-diphenyl glyoxime, bis-O-(p-toluenesulfonyl)-α-dicyclohexyl glyoxime, bis-O-(p-toluenesulfonyl)-2,3-pentanedione glyoxime, bis-O-(p-toluenesulfonyl)-2-methyl-3,4-pentanedione glyoxime, bis-O-(n-butanesulfonyl)-α-dimethyl glyoxime, bis-O-(n-butanesulfonyl)-α-diphenyl glyoxime, bis-O-(n-butanesulfonyl)-α-dicyclohexyl glyoxime, bis-O-(n-butanesulfonyl)-2,3-pentanedione glyoxime, bis-O-(n-butanesulfonyl)-2-methyl-3,4-pentanedione glyoxime, bis-O-(methanesulfonyl)-α-dimethyl glyoxime, bis-O-(trifluoromethanesulfonyl)-α-dimethyl glyoxime, bis-O-(1,1,1-trifluoroethanesulfonyl)-α-dimethyl glyoxime, bis-O-(tert-butanesulfonyl)-α-dimethyl glyoxime, bis-O-(perfluorooctanesulfonyl)-α-dimethyl glyoxime, bis-O-(cyclohexanesulfonyl)-α-dimethyl glyoxime, bis-O-(benzenesulfonyl)-α-dimethyl glyoxime, bis-O-(p-fluorobenzenesulfonyl)-α-dimethyl glyoxime, bis-O-(p-tert-butylbenzenesulfonyl)-α-dimethyl glyoxime, bis-O-(xylenesulfonyl)-α-dimethyl glyoxime, bis-O-(camphersulfonyl)-α-dimethyl glyoxime, and the like.

The bissulfone derivative: bisnaphthyl sulfonyl methane, bistrifluoromethyl sulfonyl methane, bismethyl sulfonyl methane, bisethyl sulfonyl methane, bispropyl sulfonyl methane, bisisopropyl sulfonyl methane, bis-p-toluene sulfonyl methane, bisbenzene sulfonyl methane, and the like.

The β-keto sulfone derivative: 2-cyclohexylcarbonyl-2-(p-toluenesulfonyl) propane, 2-isopropylcarbonyl-2-(p-toluenesulfonyl) propane, and the like.

The disulfone derivative such as diphenyl disulfone derivative and dicyclohexyl disulfone; the nitrobenzyl sulfonate derivative such as 2,6-dinitrobenzyl p-toluene sulfonate and 2,4-dinitrobenzyl p-toluene sulfonate.

The sulfonate ester derivative: 1,2,3-tris(methanesulfonyloxy)benzene, 1,2,3-tris(trifluoromethanesulfonyloxy)benzene, 1,2,3-tris(p-toluenesulfonyloxy)benzene, and the like.

The sulfonate ester derivative of an N-hydroxyimide compound: N-hydroxysuccinimide methanesulfonate ester, N-hydroxysuccinimide trifluoromethanesulfonate ester, N-hydroxysuccinimide ethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide 1-octanesulfonate ester, N-hydroxysuccinimide p-toluenesulfonate ester, N-hydroxysuccinimide p-methoxybenzenesulfonate ester, N-hydroxysuccinimide 2-chloroethanesulfonate ester, N-hydroxysuccinimide benzenesulfonate ester, N-hydroxysuccinimide 2,4,6-trimethylbenzenesulfonate ester, N-hydroxysuccinimide 1-naphthalenesulfonate ester, N-hydroxysuccinimide 2-naphthalenesulfonate ester, N-hydroxy-2-phenylsuccinimide methanesulfonate ester, N-hydroxymaleimide methanesulfonate ester, N-hydroxymaleimide ethanesulfonate ester, N-hydroxy-2-phenylmaleimide methanesulfonate ester, N-hydroxyglutarimide methanesulfonate ester, N-hydroxyglutarimide benzenesulfonate ester, N-hydroxyphthalimide methanesulfonate ester, N-hydroxyphthalimide benzenesulfonate ester, N-hydroxyphthalimide trifluoromethanesulfonate ester, N-hydroxyphthalimide p-toluenesulfonate ester, N-hydroxynaphthalimide methanesulfonate ester, N-hydroxynaphthalimide benzenesulfonate ester, N-hydroxy-5-norbornene-2,3-dicarboxylmide methanesulfonate ester, N-hydroxy-5-norbornene-2,3-dicarboxylmide p-toluenesulfonate ester, and the like.

Among them, especially preferably used photo acid generators are: the onium salt such as triphenylsulfonium trifluoromethanesulfate, (p-tert-buthoxyphenyl) diphenylsulfonium trifluoromethanesulfate, tris(p-tert-buthoxyphenyl) sulfonium trifluoromethanesulfate, triphenylsulfonium p-toluenesulfate, (p-tert-buthoxyphenyl)diphenylsulfonium p-toluenesulfate, tris(p-tert-buthoxyphenyl)sulfonium p-toluenesulfate, trinaphthylsulfonium trifluoromethanesulfate, cyclohexylmethyl(2-oxocyclohexyl)sulfonium trifluoromethanesulfate, (2-norbonyl)methyl(2-oxocyclohexyl)sulfonium trifluoromethanesulfate, and 1,2'-naphthylcarbonylmethyltetrahydrothiophenium triflate; the diazomethane derivative such as bis(benzenesulfonyl) diazomethane, bis(p-toluenesulfonyl) diazomethane, bis(cyclohexylsulfonyl) diazomethane, bis(n-butylsulfonyl) diazomethane, bis(isobutylsulfonyl) diazomethane, bis(sec-butylsulfonyl) diazomethane, bis(n-propylsulfonyl) diazomethane, bis(isopropylsulfonyl) diazomethane, and bis(tert-butylsulfonyl) diazomethane; the glyoxime derivative such as bis-O-(p-toluenesulfonyl)-α-dimethyl glyoxime and bis-O-(n-butanesulfonyl)-α-dimethyl glyoxime; the bissulfone derivative such as bisnaphthyl sulfonyl methane; and the sulfonate ester derivatives of a N-hydroxyimide compound such as N-hydroxysuccinimide methanesulfonate ester, N-hydroxysuccinimide trifluoromethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide p-toluenesulfonate ester, N-hydroxynaphthalimide methanesulfonate ester, and N-hydroxynaphthalimide benzenesulfonate ester.

Meanwhile, the above-mentioned photo acid generators may be used singly or as a combination of two or more of them. Adding amount of the acid generator is preferably in the range of 0.01 to 50 parts by mass, or more preferably 0.05 to 40 parts by mass, relative to 100 parts by mass of the silicon-containing compound contained in the silicon-containing film composition.

Thermal Crosslinking Accelerator

In the present invention, a thermal crosslinking accelerator may be blended to the silicon-containing film composition to be used in the present invention. Examples of the thermal crosslinking accelerator which can be blended therein are compounds shown by the following general formula (3) or (4). Specific examples that can be added therein are those described in the Japanese Patent No. 4716037,

$$L_a H_b X \qquad (3)$$

wherein L represents lithium, sodium, potassium, rubidium, or cesium; X represents a hydroxyl group, or an organic acid group having 1 to 30 carbon atoms with the valency thereof being one, or two or higher; reference character "a" represents an integer of one or more, reference character "b" represents 0 or an integer of one or more, and a+b is a valency of the hydroxyl group or the organic acid group,

$$MY \qquad (4)$$

wherein M represents sulfonium, iodonium, or ammonium; and Y represents a non-nucleophilic counter ion.

Meanwhile, the foregoing thermal crosslinking accelerators may be used solely or in a combination of two or more of them. Adding amount of the thermal crosslinking accelerator is preferably 0.01 to 50 parts by mass, or more preferably 0.1 to 40 parts by mass, relative to 100 parts by mass of the silicon-containing compound contained in the silicon-containing film composition.

Organic Acid

To improve stability of the composition to be used in the present invention, it is preferable to add an organic acid having 1 to 30 carbon atoms with the valency thereof being one, or two or higher be added thereinto. Illustrative example of the acid to be added herein includes formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Especially, oxalic acid, maleic acid, formic acid, acetic acid, propionic acid, citric acid, and the like are preferable. To keep storage stability, two or more kinds of these acids may be used as a mixture. Adding amount thereof is 0.001 to 25 parts by mass, preferably 0.01 to 15 parts by mass, or more preferably 0.1 to 5 parts by mass, relative to 100 parts by mass of the silicon-containing compound contained in the silicon-containing film composition.

Alternatively, the above-mentioned organic acid may be added such that pH of the composition may become preferably $0 \leq pH \leq 7$, more preferably $0.3 \leq pH \leq 6.5$, or still more preferably $0.5 \leq pH \leq 6$.

Water

In the present invention, water may be added to the composition. When water is added thereinto, the silicon-containing compound in the composition is hydrated whereby improving a lithography performance. Water content in the solvent component of the composition is 0 to 50% by mass (both not inclusive), especially preferably 0.3 to 30% by mass, or still further more preferably 0.5 to 20% by mass.

Use amount of entirety of the solvent including water is preferably 100 to 100,000 parts by mass, or especially preferably 200 to 50,000 parts by mass, relative to 100 parts by mass of the silicon-containing compound contained in the silicon-containing film composition.

Stabilizer

In addition, as a stabilizer, an alcohol having a cyclic ether substituent with the valency thereof being one, or two or higher may be added to the composition to be used in the present invention. Especially, addition of stabilizers described in paragraphs [0181] to [0182] of the Japanese Patent Laid-Open Publication No. 2009-126940 can improve stability of the composition to be used in the present invention.

Surfactant

Further, a surfactant may be added to the composition to be used in the present invention, if necessary. Specific examples thereof are those materials described in paragraph [0185] of the Japanese Patent Laid-Open Publication No. 2009-126940.

Further, a high boiling point solvent having a boiling point of 180° C. or higher may be added to the composition to be used in the present invention, if necessary. Illustrative example of this high boiling point solvent includes 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropyelene glycol, glycerin, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, and dipropylene glycol monoethyl ether acetate.

The present invention includes a step of applying a self-assembling polymer onto a silicon-containing film to form a polymer film and a step of self-assembling this polymer film by heat treatment to form a microdomain structure.

As to the self-assembling polymer to form the polymer film on the silicon-containing film of the present invention, any self-assembling polymer including a heretofore known polystyrene-poly(meth)acrylate ester block copolymer may be used; and specific example thereof includes polybutadiene-polydimethyl siloxane, polybutadiene-4-vinylpyridine, polybutadiene-methyl methacrylate, polybutadiene-poly-t-butyl methacrylate, polybutadiene-t-butyl acrylate, poly-t-butyl methacylate-poly-4-vinylpyridine, polyethylene-polymethyl methacrylate, poly-t-butyl methacrylate-poly-2-vinylpyridine, polyethylene-poly-2-vinylpyridine, polyethylene-poly-4-vinylpyridine, polyisoprene-poly-2-vinylpyridine, polymethyl methacrylate-polystyrene, poly-t-butyl methacrylate-polystyrene, polymethyl acrylate-polystyrene, polybutadiene-polystyrene, polyisoprene-polystyrene, polystyrene-poly-2-vinylpyridine, polystyrene-poly-4-vinylpyridine, polystyrene-polydimethyl siloxane, polystyrene-poly-N,N-dimethylacrylamide, sodium polybutadiene-polyacrylate, polybutadiene-polyethyleneoxide, poly-t-butyl methacrylate-polyethyleneoxide, polystyrene-polyacrylic acid, and polystyrene-polymethacrylic acid.

Illustrative example of the self-assembling polymers used in the present invention includes an AB type diblock copolymer having a structure in which two kinds of polymer chains, A-polymer chain and B-polymer chain, are bonded, an ABA type triblock copolymer, an ABC type block copolymer comprising three or more kinds of polymers, and a star block copolymer in which each block is bonded at one point and an optimum polymer may be selected in accordance with the form of the intended microdomain structure.

Polystyrene-equivalent mass-average molecular weight of the self-assembling polymer used in the present invention is preferably in the range of 1,000 to 20,000, more preferably 3,000 to 15,000, or still more preferably 5,000 to 12,000 by gel permeation chromatography (GPC). If the mass-average molecular weight is in the above-mentioned ranges, the self-assembly phenomenon takes place with sure so that a fine pattern can be obtained.

In addition, if the molecular weight distribution (Mw/Mn) of the self-assembling polymer used in the present invention is of narrow dispersity such as in the range of 1.0 to 1.3, especially in the range of 1.0 to 1.2, variability of the polymer's molecular weight is so small that deterioration in characteristics such as uniformity and regularity of the pattern having the microdomain structure formed by self-assembly thereof can be prevented.

In the self-assembling polymer used in the present invention, illustrative example of the organic solvent that can dissolve the polymer includes butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methyl pyrrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone; though not limited to them. Especially preferable organic solvents thereamong are a propylene glycol alkyl ether acetate and an alkyl lactate ester. These solvents may be used singly or as a mixture of two or more of them. Meanwhile, illustrative example of the alkyl group of the propylene glycol alkyl ether acetate in the present invention includes those having 1 to 4 carbon atoms, such as a methyl group, an ethyl group, and a propyl group; though a methyl group and an ethyl group are especially preferable. Because this propylene glycol alkyl ether acetate has a 1,2-substitution and 1,3-substitution, there are three isomers according to a combination of the substitution sites; but it may be any of a single body and a mixture thereof.

Illustrative example of the alkyl group of the alkyl lactate ester includes those having 1 to 4 carbon atoms, such as a methyl group, an ethyl group, and a propyl group; though a methyl group and an ethyl group are preferable.

If the propylene glycol alkyl ether acetate is added as the solvent, adding amount thereof is preferably 50% or more by mass relative to totality of the solvent; and if the alkyl lactate ester is added, adding amount thereof is preferably 50% or more by mass relative to totality of the solvent. If a mixed solvent of the propylene glycol alkyl ether acetate and the alkyl lactate ester is used as the solvent, sum of them is preferably 50% or more by mass relative to totality of the solvent. In this case, more preferably the rate of the propylene glycol alkyl ether acetate is 60 to 95% by mass and the rate of the alkyl lactate ester is 5 to 40% by mass. If the propylene glycol alkyl ether acetate is added with the rate as mentioned above, problems such as deterioration of coating properties and insufficient solubility may be avoided.

Adding amount of the foregoing solvents is usually in the range of 300 to 8,000 parts by mass, or preferably 400 to 3,000 parts by mass, relative to 100 parts by mass of the solid portion of the polymer; but the amount is not limited to this if the concentration thereof is applicable to a conventional coating method.

Into the self-assembling polymer used in the present invention may be added a surfactant to improve coating properties thereof.

The surfactant is not particularly restricted, while illustrative example thereof includes a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane aliphatic acid ester such as sorbitane monolaurate, sorbitane monopalmitate, and sorbitane monostearate; a nonionic surfactant of a polyoxyethylene sorbitane aliphatic acid ester such as polyoxyethylene sorbitane monolaurate, polyoxyethylene sorbitane monopalmitate, polyoxyethylene sorbitane monostearate, polyoxyethylene sorbitane trioleate, and polyoxyethylene sorbitane tristearate; a fluoro surfactant such as F-Top EF301, EF303, and EF352 (manufactured by Tochem Products Co., Ltd.), Megafac F171, F172, and F173 (manufactured by Dainippon Ink & Chemicals, Inc.), Flolade FC430 and FC431 (manufactured by Sumitomo 3M Ltd.), Asahi Guard AG710, Surflon S-381, S-382, SC101, SC102, SC103, SC104, SC105, SC106, Surfinol 51004, KH-10, KH-20, KH-30, and KH-40 (manufactured by Asahi Glass Co., Ltd.); an organosiloxane polymer KP-341, X-70-092, and X-70-093 (manufactured by Shin-Etsu Chemical Co., Ltd.); and an acrylate or a methacrylate polymer such as Polyflow No. 75 and No. 95 (manufactured by Kyoeisha Yushikagaku Kogyo K. K.). Among them, FC430, Surflon S-381, Surfinol E1004, KH-20, and KH-30 are preferable. These may be used singly or as a combination of two or more of them.

Adding amount of the surfactant in the self-assembling polymer used in the present invention is 2 or less parts by mass, or preferably 1 or less parts by mass, relative to 100 parts by mass of the solid portion of the polymer. Meanwhile, the lower limit thereof is not particularly stipulated, but preferably 0.1 or more parts by mass.

The patterning process of the present invention is as follows (refer to FIG. 1).

In this process, at first, a silicon-containing film composition is applied onto a substrate to be processed 1, and then, it is heated to form a silicon-containing film 2 (A and B). Then, the silicon-containing film 2 is exposed so that it is changed to a silicon-containing film 2' having a changed contact angle thereby forming a pattern (C). Then, a self-assembling polymer is applied onto the silicon-containing films 2 and 2' after exposure thereby forming a self-assembling polymer film 3 (O). The self-assembling polymer film 3 is self-organized by heating as well as by virtue of the difference in contact angles between the silicon-containing films 2 and 2' (E). Thereafter, the self-assembling polymer film 3 and the silicon-containing films 2 and 2' are etched to transfer the pattern to the substrate to be processed 1 (F).

The polymer which can be self-organized and is used in the present invention is applied onto the silicon-containing film having been pattern-exposed, with the thickness of the polymer film being preferably in the range of 0.005 to 0.05 μm, especially 0.01 to 0.03 μm, and then it is subjected to concurrent baking and annealing processes in the temperature range of 100 to 300° C., especially 100 to 150° C., and for the time of 5 to 600 minutes, especially 5 to 100 minutes, thereby forming by self-assembly a pattern having a microdomain structure with the size of 20 nm or less, especially 10 nm or less.

The present invention includes a step of forming a pattern by dry-etching of the polymer film having the microdomain structure formed.

In the present invention, difference in etching rate relative to the self-reactive ion etching (RIE) or to other etching methods can be utilized in the patterning process of the polymer film. For example, in the case that a self-assembling polymer comprised of polystyrene and polybutadiene is used, development treatment to leave only a pattern comprised of the polystyrene block may be possible by using an oxidative gas. In the self-organized pattern comprised of polystyrene and polymethyl methacrylate, polystyrene is more resistant to RIE that uses an oxygen gas and a fluorocarbon gas than polymethyl methacrylate. By utilizing this property, a pattern may be formed by selectively removing a partial structure by RIE from the polymer film having the formed microdomain structure comprised of polymethyl methacrylate.

The present invention includes a step of transferring the pattern to the silicon-containing film by dry-etching by using the polymer film's pattern as a mask and a step of transferring the pattern to the substrate to be processed by dry-etching by using the pattern that is transferred to the silicon-containing film as a mask.

Unlikely the self-assembling organic polymer, the silicon-containing film has an etching selectivity because of the silicon-containing compound contained therein, thereby functioning as an etching hard mask; and thus, the pattern formed by self-assembly can be transferred to the substrate to be processed in a further lower layer.

A self-organized pattern can be transferred to an inorganic film or to a semiconductor device substrate in a further lower layer without causing transfer difference in size by forming self-organized pattern in virtue of the difference in contact angles on the silicon-containing film used in the present invention and by optimizing a combination with a CVD film and an organic underlayer film.

EXAMPLES

Hereunder, the present invention will be specifically explained by showing Synthesis Examples, Examples, and Comparative Examples; but the present invention is no limited by these descriptions. Meanwhile, shown in the following examples means "% by mass", and molecular weight measurement was done with GPC.

Synthesis of Silicon-Containing Compounds

Synthesis Example 1-1

Into a mixture of 220 g of methanol, 0.2 g of methanesulfonic acid, and 80 g of deionized water was added a mixture of 25.9 g of Monomer 101, 41.9 g of Monomer 102, and 9.5 g of Monomer 120; and then, they were kept at 40° C. for 12 hours to carry out the hydrolysis condensation reaction. After the reaction, 200 g of propylene glycol ethyl ether (PGEE) was added thereinto; and then, the by-produced alcohol was distilled out under reduced pressure. Then, 1000 mL of ethyl acetate and 300 g of PGEE were added thereinto to separate the water layer. To the remained organic layer was added 100 mL of ion-exchanged water; and then, the resulting mixture was stirred, settled, and separated into the layers. This operation was repeated for three times. The remained organic layer was concentrated under reduced pressure to obtain 330 g of PGEE solution containing the silicon-containing compound 1-1 (compound concentration of 10%). The polystyrene-equivalent molecular weight of this compound was measured to be Mw=2,200.

Synthesis Examples 1-2 to 1-16 and Synthesis Examples 1-20 to 1-24 were carried out by using the monomers shown in Table 1 under the conditions similar to those in Synthesis Example 1-1 to obtain each of the intended products.

Synthesis Example 1-17

Into a mixture of 400 g of ethanol, 5 g of 25% tetramethyl ammonium hydroxide, and 200 g of deionized water was added a mixture of 20.4 g of Monomer 101, 7.6 g of Monomer 102, and 95.5 g of Monomer 128; and then, they were kept at 40° C. for 4 hours to carry out the hydrolysis condensation reaction. After the reaction, 2 g of acetic acid was added thereinto for neutralization, and then, the by-produced alcohol was distilled out under reduced pressure. Then, 1200 mL of ethyl acetate and 400 g of PGEE were added thereinto to separate the water layer. To the remained organic layer was added 100 mL of ion-exchanged water; and then, the resulting mixture was stirred, settled, and separated into the layers. This operation was repeated for three times. The remained organic layer was concentrated under reduced pressure to obtain 410 g of PGEE solution containing the silicon-containing compound 1-17 (compound concentration of 20%). The polystyrene-equivalent molecular weight of this compound was measured to be Mw=2,300.

Synthesis Example 1-18 and Synthesis Example 1-19 were carried out by using the monomers shown in Table 1 under the conditions similar to those in Synthesis Example 1-17 to obtain each of the intended products.

Synthesis Example 1-25

Into a mixture of 120 g of methanol, 0.1 g of 70% nitric acid, and 60 g of deionized water was added a mixture of 5.0 g of Monomer 100, 3.4 g of Monomer 101, and 68.5 g of Monomer 102; and then, they were kept at 40° C. for 12 hours to carry out the hydrolysis condensation reaction. After the reaction, 300 g of PGEE was added thereinto; and then, the by-produced alcohol and excess water were distilled out under reduced pressure to obtain 310 g of PGEE solution containing the silicon-containing film composition 1-25 (polymer concentration of 10%). The polystyrene-equivalent molecular weight of this compound was measured to be Mw=2,200.

Synthesis Example 1-26 to Synthesis Example 1-30 were carried out by using the monomers shown in Table 1 under the conditions similar to those in Synthesis Example 1-25 to obtain each of the intended products.

TABLE 1

| Synthesis Example | Raw materials for reaction | Mw |
|---|---|---|
| 1-1 | [Monomer 101]: 25.9 g, [Monomer 102]: 41.9 g, [Monomer 120]: 9.5 g | 2200 |
| 1-2 | [Monomer 101]: 25.9 g, [Monomer 102]: 41.9 g, [Monomer 121]: 10.5 g | 2300 |
| 1-3 | [Monomer 101]: 25.9 g, [Monomer 102]: 41.9 g, [Monomer 122]: 11.4 g | 2400 |
| 1-4 | [Monomer 101]: 25.9 g, [Monomer 102]: 41.9 g, [Monomer 123]: 12.0 g | 2400 |
| 1-5 | [Monomer 101]: 25.9 g, [Monomer 102]: 41.9 g, [Monomer 124]: 9.7 g | 2200 |
| 1-6 | [Monomer 101]: 25.9 g, [Monomer 102]: 41.9 g, [Monomer 125]: 8.9 g | 2200 |
| 1-7 | [Monomer 101]: 25.9 g, [Monomer 102]: 41.9 g, [Monomer 126]: 9.3 g | 2200 |
| 1-8 | [Monomer 101]: 25.9 g, [Monomer 102]: 41.9 g, [Monomer 127]: 11.1 g | 2200 |
| 1-9 | [Monomer 101]: 20.4 g, [Monomer 102]: 7.6 g, [Monomer 120]: 81.1 g | 1600 |
| 1-10 | [Monomer 101]: 20.4 g, [Monomer 102]: 7.6 g, [Monomer 121]: 90.1 g | 1300 |
| 1-11 | [Monomer 101]: 20.4 g, [Monomer 102]: 7.6 g, [Monomer 122]: 97.9 g | 1600 |

TABLE 1-continued

| Synthesis Example | Raw materials for reaction | Mw |
|---|---|---|
| 1-12 | [Monomer 101]: 20.4 g, [Monomer 102]: 7.6 g, [Monomer 123]: 102.8 g | 1200 |
| 1-13 | [Monomer 101]: 20.4 g, [Monomer 102]: 7.6 g, [Monomer 124]: 83.5 g | 1500 |
| 1-14 | [Monomer 101]: 20.4 g, [Monomer 102]: 7.6 g, [Monomer 125]: 76.3 g | 1300 |
| 1-15 | [Monomer 101]: 20.4 g, [Monomer 102]: 7.6 g, [Monomer 126]: 79.9 g | 1500 |
| 1-16 | [Monomer 101]: 20.4 g, [Monomer 102]: 7.6 g, [Monomer 127]: 94.9 g | 1300 |
| 1-17 | [Monomer 101]: 20.4 g, [Monomer 102]: 7.6 g, [Monomer 128]: 95.5 g | 2300 |
| 1-18 | [Monomer 101]: 20.4 g, [Monomer 102]: 7.6 g, [Monomer 129]: 79.3 g | 2500 |
| 1-19 | [Monomer 101]: 20.4 g, [Monomer 102]: 7.6 g, [Monomer 130]: 94.3 g | 2300 |
| 1-20 | [Monomer 101]: 20.4 g, [Monomer 102]: 7.6 g, [Monomer 140]: 68.5 g | 1600 |
| 1-21 | [Monomer 101]: 22.5 g, [Monomer 102]: 41.9 g, [Monomer 110]: 4.7 g, [Monomer 120]: 9.5 g | 2100 |
| 1-22 | [Monomer 101]: 22.5 g, [Monomer 102]: 41.9 g, [Monomer 111]: 8.5 g, [Monomer 120]: 9.5 g | 1900 |
| 1-23 | [Monomer 101]: 20.4 g, [Monomer 102]: 3.8 g, [Monomer 112]: 9.1 g, [Monomer 120]: 81.1 g | 2500 |
| 1-24 | [Monomer 101]: 20.4 g, [Monomer 102]: 3.8 g, [Monomer 113]: 7.1 g, [Monomer 120]: 81.1 g | 2500 |
| 1-25 | [Monomer 100]: 5.0 g, [Monomer 101]: 3.4 g, [Monomer 102]: 68.5 g | 2200 |
| 1-26 | [Monomer 100]: 5.0 g, [Monomer 101]: 6.8 g, [Monomer 102]: 60.9 g, [Monomer 110]: 4.7 g | 3700 |
| 1-27 | [Monomer 100]: 5.0 g, [Monomer 101]: 6.8 g, [Monomer 102]: 60.9 g, [Monomer 111]: 8.5 g | 3700 |
| 1-28 | [Monomer 100]: 5.0 g, [Monomer 101]: 6.8 g, [Monomer 102]: 60.9 g, [Monomer 112]: 9.1 g | 3600 |
| 1-29 | [Monomer 100]: 5.0 g, [Monomer 101]: 6.8 g, [Monomer 102]: 60.9 g, [Monomer 113]: 7.1 g | 4000 |
| 1-30 | [Monomer 100]: 5.0 g, [Monomer 101]: 6.8 g, [Monomer 102]: 60.9 g, [Monomer 114]: 8.1 g | 3900 |

$PhSi(OCH_3)_3$, [Monomer 100]

$CH_3Si(OCH_3)_3$, [Monomer 101]

$Si(OCH_3)_3$, [Monomer 102]

$B(OC_3H_7)_3$, [Monomer 110]

$Ti(OC_4H_9)_4$, [Monomer 111]

$Ge(OC_4H_9)_4$, [Monomer 112]

$P_2O_5$, [Monomer 113]

$Al[CH_3COCH=C(O-)CH_3]_3$, [Monomer 114]

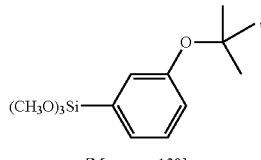

[Monomer 120]

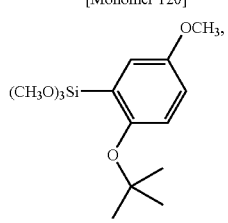

[Monomer 121]

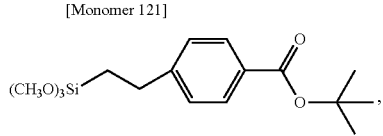

[Monomer 122]

TABLE 1-continued

| Synthesis Example | Raw materials for reaction | Mw |
|---|---|---|

[Monomer 123] — (CH₃O)₃Si-substituted benzene with two O-tBu groups

[Monomer 124] — (CH₃O)₃Si-(CH₂)₄-C(=O)-O-tBu

[Monomer 125] — (CH₃O)₂(CH₃)Si-C₆H₄-O-C(CH₃)₃

[Monomer 126] — CH₃O(CH₃)₂Si-CH₂CH₂-C₆H₄-O-C(CH₃)₃

[Monomer 127] — (CH₃O)₃Si-norbornyl-C(=O)-O-tBu

[Monomer 128] — (CH₃O)₃Si-norbornyl-CH₂-O-CH(CH₃)-O-C₂H₅

[Monomer 129] — (CH₃O)₃Si-(CH₂)₃-O-tetrahydropyranyl

[Monomer 130] — (CH₃O)₃Si-C₆H₃(C₂H₅)-O-CH(CH₃)-O-C₂H₅

[Monomer 140] — (CH₃O)₃Si-C₆H₄-OCH₃

Synthesis Example 1-31

A monomer solution was prepared from 27.3 g of 4-tert-butoxystyrene, 104.3 g of 4-trimethoxysilyl styrene, 4.2 g of MAIB (dimethyl-2,2'-azobis(isobutyrate)), and 100 g of PGMEA (propylene glycol monomethyl ether acetate). Under a nitrogen atmosphere, 50 g of PGMEA was taken into a flask, and then, after it was heated to 80° C. with stirring, the above-prepared monomer solution was gradually added thereinto over two hours. Thereafter, after the polymerization solution was stirred at 80° C. for 20 hours, heating thereof was stopped. The obtained polymerization solution was cooled to room temperature and then diluted with 200 g of PGMEA; and then, the resulting mixture was gradually added into 2000 g of methanol with stirring. The precipitated polymer was collected by filtration, washed with 600 g of methanol twice, and then dried under vacuum at 50° C. for 20 hours to obtain Polymer 1-31. The polystyrene-equivalent mass-average molecular weight (Mw) of this compound by GPO was 9,800, and the dispersity thereof (Mw/Mn) was 1.91. From the $^{13}$C-

NMR analysis, the ratio of the unit derived from 4-tert-butoxystyrene to the unit derived from 4-trimethoxysilyl styrene, the composition ratio of the copolymer, was 26 to 74.

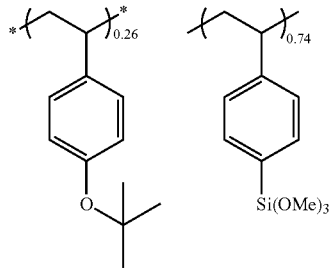

Polymer Composition Ratio:

unit derived from 4-tert-butoxystyrene/unit derived from 4-trimethoxysilyl styrene=26/74 (molar ratio)

Molecular weight (Mw): 9,800

Dispersity (Mw/Mn): 1.91

Each of the silicon-containing compounds (1-1) to (1-31) obtained in Synthesis Examples mentioned above was mixed with an acid, a thermal crosslinking accelerator, a solvent, and additives with the ratio shown in Tables 2 and 3; and then, the resulting mixture was filtrated through a 0.1-μm filter made of a fluorinated resin to obtain respective silicon-containing film composition solutions Sol. 1 to Sol. 41.

TABLE 2

| No. | Silicon-containing compound (parts by mass) | Thermal crosslinking accelerator (parts by mass) | Photo-sensitive acid generator (parts by mass) | Acid (parts by mass) | Solvent (parts by mass) | Water (parts by mass) |
|---|---|---|---|---|---|---|
| Sol. 1 | 1-1 (4.0) | TPSOH (0.04) | TPSNf (0.04) | Maleic acid (0.04) | PGEE (150) | Water (15) |
| Sol. 2 | 1-1 (4.0) | TPSHCO$_3$ (0.04) | TPSNf (0.04) | Oxalic acid (0.04) | PGEE (150) | Water (15) |
| Sol. 3 | 1-1 (4.0) | TPSOx (0.04) | TPSNf (0.04) | Maleic acid (0.04) | PGEE (150) | Water (15) |
| Sol. 4 | 1-1 (4.0) | TPSTFA (0.04) | TPSNf (0.04) | Maleic acid (0.04) | PGEE (150) | Water (15) |
| Sol. 5 | 1-1 (4.0) | TPSOCOPh (0.04) | TPSNf (0.04) | Oxalic acid (0.04) | PGEE (150) | Water (15) |
| Sol. 6 | 1-1 (4.0) | TPSH$_2$PO$_4$ (0.04) | TPSNf (0.04) | Oxalic acid (0.04) | PGEE (150) | Water (15) |
| Sol. 7 | 1-1 (4.0) | QMAMA (0.04) | TPSNf (0.04) | Maleic acid (0.04) | PGEE (150) | Water (15) |
| Sol. 8 | 1-1 (4.0) | QBANO$_3$ (0.04) | TPSNf (0.04) | Maleic acid (0.04) | PGEE (150) | Water (15) |
| Sol. 9 | 1-1 (4.0) | QMATFA (0.04) | TPSNf (0.04) | Maleic acid (0.04) | PGEE (150) | Water (15) |
| Sol. 10 | 1-1 (4.0) | Ph$_2$ICl (0.04) | TPSNf (0.04) | Maleic acid (0.04) | PGEE (150) | Water (15) |
| Sol. 11 | 1-1 (4.0) | TPSMA (0.04) | TPSNf (0.04) | Maleic acid (0.04) | PGEE (150) | Water (15) |
| Sol. 12 | 1-2 (4.0) | TPSMA (0.04) | TPSNf (0.04) | Maleic acid (0.04) | PGEE (150) | Water (15) |
| Sol. 13 | 1-3 (4.0) | TPSMA (0.04) | TPSNf (0.04) | Maleic acid (0.04) | PGEE (150) | Water (15) |
| Sol. 14 | 1-4 (4.0) | TPSMA (0.04) | TPSNf (0.04) | Maleic acid (0.04) | PGEE (150) | Water (15) |
| Sol. 15 | 1-5 (4.0) | TPSMA (0.04) | TPSNf (0.04) | Maleic acid (0.04) | PGEE (150) | Water (15) |
| Sol. 16 | 1-6 (4.0) | TPSMA (0.04) | TPSNf (0.04) | Oxalic acid (0.04) | PGEE (150) | Water (15) |
| Sol. 17 | 1-7 (4.0) | TPSMA (0.04) | TPSNf (0.04) | Maleic acid (0.04) | PGEE (150) | Water (15) |
| Sol. 18 | 1-8 (4.0) | TPSMA (0.04) | TPSNf (0.04) | Maleic acid (0.04) | PGEE (150) | Water (15) |
| Sol. 19 | 1-9 (0.1) 1-25 (3.9) | TPSMA (0.04) | TPSNf (0.04) | Maleic acid (0.04) | PGEE (150) | Water (15) |
| Sol. 20 | 1-10 (0.1) 1-25 (3.9) | TPSMA (0.04) | TPSNf (0.04) | Maleic acid (0.04) | PGEE (150) | Water (15) |
| Sol. 21 | 1-11 (0.1) 1-25 (3.9) | TPSMA (0.04) | TPSNf (0.04) | Maleic acid (0.04) | PGEE (150) | Water (15) |
| Sol. 22 | 1-12 (0.1) 1-25 (3.9) | TPSMA (0.04) | TPSNf (0.04) | Maleic acid (0.04) | PGEE (150) | Water (15) |
| Sol. 23 | 1-13 (0.1) 1-25 (3.9) | TPSMA (0.04) | TPSNf (0.04) | Maleic acid (0.04) | PGEE (150) | Water (15) |
| Sol. 24 | 1-14 (0.1) 1-25 (3.9) | TPSMA (0.04) | TPSNf (0.04) | Maleic acid (0.04) | PGEE (150) | Water (15) |
| Sol. 25 | 1-15 (0.1) 1-25 (3.9) | TPSMA (0.04) | TPSNf (0.04) | Maleic acid (0.04) | PGEE (150) | Water (15) |

TABLE 3

| No. | Silicon-containing compound (parts by mass) | Thermal cross-linking accelerator (parts by mass) | Photo-sensitive acid generator (parts by mass) | Acid (parts by mass) | Solvent (parts by mass) | Water (parts by mass) |
|---|---|---|---|---|---|---|
| Sol. 26 | 1-16 (0.1) 1-25 (3.9) | TPSMA (0.04) | TPSNf (0.04) | Maleic acid (0.04) | PGEE (150) | Water (15) |
| Sol. 27 | 1-17 (0.1) 1-25 (3.9) | TPSMA (0.04) | TPSNf (0.04) | Maleic acid (0.04) | PGEE (150) | Water (15) |
| Sol. 28 | 1-18 (0.1) 1-25 (3.9) | TPSMA (0.04) | TPSNf (0.04) | Maleic acid (0.04) | PGEE (150) | Water (15) |
| Sol. 29 | 1-19 (0.1) 1-25 (3.9) | TPSMA (0.04) | TPSNf (0.04) | Maleic acid (0.04) | PGEE (150) | Water (15) |
| Sol. 30 | 1-21 (0.1) 1-25 (3.9) | TPSMA (0.04) | TPSNf (0.04) | Maleic acid (0.04) | PGEE (150) | Water (15) |
| Sol. 31 | 1-22 (0.1) 1-25 (3.9) | TPSMA (0.04) | TPSNf (0.04) | Maleic acid (0.04) | PGEE (150) | Water (15) |
| Sol. 32 | 1-23 (0.1) 1-25 (3.9) | TPSMA (0.04) | TPSNf (0.04) | Maleic acid (0.04) | PGEE (150) | Water (15) |
| Sol. 33 | 1-24 (0.1) 1-25 (3.9) | TPSMA (0.04) | TPSNf (0.04) | Maleic acid (0.04) | PGEE (150) | Water (15) |
| Sol. 34 | 1-31 (0.1) 1-25 (3.9) | TPSMA (0.04) | TPSNf (0.04) | Maleic acid (0.04) | PGEE (150) | Water (15) |
| Sol. 35 | 1-9 (0.1) 1-26 (3.9) | TPSMA (0.04) | TPSNf (0.04) | Maleic acid (0.04) | PGEE (150) | Water (15) |
| Sol. 36 | 1-9 (0.1) 1-27 (3.9) | TPSMA (0.04) | TPSNf (0.04) | Maleic acid (0.04) | PGEE (150) | Water (15) |
| Sol. 37 | 1-9 (0.1) 1-28 (3.9) | TPSMA (0.04) | TPSNf (0.04) | Maleic acid (0.04) | PGEE (150) | Water (15) |
| Sol. 38 | 1-9 (0.1) 1-29 (3.9) | TPSMA (0.04) | TPSNf (0.04) | Maleic acid (0.04) | PGEE (150) | Water (15) |
| Sol. 39 | 1-9 (0.1) 1-30 (3.9) | TPSMA (0.04) | TPSNf (0.04) | Maleic acid (0.04) | PGEE (150) | Water (15) |
| Sol. 40 | 1-17 (0.1) 1-29 (3.9) | TPSMA (0.04) | TPSNf (0.04) | Maleic acid (0.04) | PGEE (150) | Water (15) |
| Sol. 41 | 1-20 (0.1) 1-25 (3.9) | TPSMA (0.04) | TPSNf (0.04) | Maleic acid (0.04) | PGEE (150) | Water (15) |

TPSOH: Triphenylsulfonium hydroxide
TPSHCO$_3$: Mono(triphenylsulfonium) carbonate
TPSOx: Mono(triphenylsulfonium) oxalate
TPSTFA: Triphenylsulfonium trifluoroacetate
TPSOCOPh: Triphenylsulfonium benzoate
TPSH$_2$PO$_4$: Mono(triphenylsulfonium) phosphate
TPSMA: Mono(triphenylsulfonium) maleate
TPSNf: Triphenylsulfonium nonafluorobutanesulfonate
QMAMA: Mono(tetramethylammonium) maleate
QMATFA: Tetramethylammonium trifluoroacetate
QBANO$_3$: Tetrabutylammonium nitrate
Ph$_2$ICl: Diphenyliodonium chloride
PGEE: Propylene glycol ethyl ether Synthesis Example 2-1

After a 2-L flask reactor was dried under reduced pressure, 1,500 g of tetrahydrofuran (this was dehydrated by distillation) was charged thereinto under a nitrogen atmosphere. After it was cooled to −75° C., 12.3 g of s-butyl lithium (1 N cyclohexane solution) was charged thereinto followed by gradual charge of 161 g of 4-ethoxyethoxystyrene (this was dehydrated by distillation). During this operation, care was taken such that temperature inside the reaction solution might not reach −60° C. or higher. After 15 minutes of the reaction, 98.7 g of 4-t-butoxystyrene (this was dehydrated by distillation) was gradually added thereinto; and then the reaction was carried out for 30 minutes. Thereafter, 10 g of methanol was charged to stop the reaction. The reaction solution thus obtained was heated to room temperature and then concentrated under reduced pressure; and then, 800 g of methanol was charged thereinto. After the resulting mixture was stirred and settled, the upper methanol layer was removed. This operation was repeated for three times to remove metal lithium. The underlayer polymer solution was concentrated; and then, 580 g of tetrahydrofuran, 507 g of methanol, and 5.0 g of oxalic acid were added thereinto; and then, the deprotection reaction was carried out at 40° C. for 40 hours. The reaction solution was neutralized by 3.5 g of pyridine, concentrated, dissolved into 0.6 liter of acetone, and then, this mixture was poured into 7.0 liters of water. Deposited white solid was washed, collected by filtration, and then dried at 40° C. under reduced pressure to obtain 166.2 g of white polymer.

The obtained polymer showed following analysis results by measurements with $^{13}$C-NMR, $^{1}$H-NMR, and GPC.
Copolymer Composition Ratio:
    Hydroxystyrene:4-t-butoxystyrene=57.7:42.3
Mass-average molecular weight (Mw): 9,300
Dispersity (Mw/Mn): 1.13
    This was designated as Diblock-A.

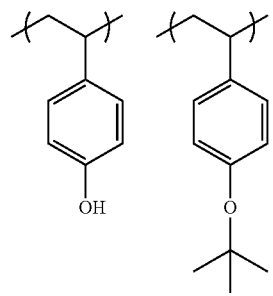

Synthesis Example 2-2

After a 2-L flask reactor was dried under reduced pressure, 1,500 g of tetrahydrofuran (this was dehydrated by distillation) was charged thereinto under a nitrogen atmosphere. After it was cooled to −75° C., 12.5 g of s-butyl lithium (1 N cyclohexane solution) was charged threinto followed by gradual charge of 41 g of 4-t-butoxystyrene (this was dehydrated by distillation). During this operation, care was taken such that temperature inside the reaction solution might not reach −60° C. or higher. After 15 minutes of the reaction, 154 g of 4-ethoxyethoxystyrene (this was dehydrated by distillation) was gradually added thereinto; and then the reaction was carried out for 15 minutes. Finally, 41 g of 4-t-butoxystyrene (this was dehydrated by distillation) was gradually charged again, and then the reaction was carried out for 30 minutes. Thereafter, 10 g of methanol was charged to stop the reaction. The reaction solution thus obtained was heated to room temperature and then concentrated under reduced pressure; and then, 800 g of methanol was charged thereinto. After the resulting mixture was stirred and settled, the upper methanol layer was removed. This operation was repeated for three times to remove metal lithium. The underlayer polymer solution was concentrated; and then, 580 g of tetrahydrofuran, 507 g of methanol, and 5.0 g of oxalic acid were added thereinto; and then, the deprotection reaction was carried out at 40° C. for 40 hours. The reaction solution was neutralized by 3.5 g of pyridine, concentrated, dissolved into 0.6 liter of acetone, and then, this mixture was poured into 7.0 liters of water. Deposited white solid was washed, collected by filtration, and then dried at 40° C. under reduced pressure to obtain 163.2 g of white polymer.

The obtained polymer showed following analysis results by measurements with $^{13}$C-NMR, $^1$H-NMR, and GPC.
Copolymer Composition Ratio:
Hydroxystyrene:4-t-butoxystyrene=62.5:37.5
Mass-average molecular weight (Mw): 10,200
Dispersity (Mw/Mn): 1.09
This was designated as Triblock-B.

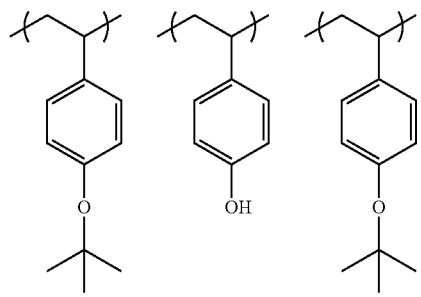

Synthesis Example 2-3

After a 2-L flask reactor was dried under reduced pressure, 1,500 g of tetrahydrofuran (this was dehydrated by distillation) was charged thereinto under a nitrogen atmosphere. After it was cooled to −75° C., 14.5 g of s-butyl lithium (1 N cyclohexane solution) was charged thereinto followed by gradual addition of 193 g of 4-ethoxyethoxystyrene (this was dehydrated by distillation). During this operation, care was taken such that temperature inside the reaction solution might not reach −60° C. or higher. After 15 minutes of the reaction, 47 g of methyl methacrylate ester (this was dehydrated by distillation) was gradually added thereinto; and then, the reaction was carried out with raising the temperature till 0° C. for 30 minutes. Thereafter, 10 g of methanol was charged to stop the reaction. The reaction solution thus obtained was heated to room temperature and then concentrated under reduced pressure; and then, 800 g of methanol was charged thereinto. After the resulting mixture was stirred and settled, the upper methanol layer was removed. This operation was repeated for three times to remove metal lithium. The underlayer polymer solution was concentrated; and then, 580 g of tetrahydrofuran, 507 g of methanol, and 5.0 g of oxalic acid were added thereinto; and then, the deprotection reaction was carried out at 40° C. for 40 hours. The reaction solution was neutralized by 3.5 g of pyridine, concentrated, dissolved into 0.6 liter of acetone, and then, this mixture was poured into 7.0 liters of water. Deposited white solid was washed, collected by filtration, and then dried at 40° C. under reduced pressure to obtain 148.9 g of white polymer.

The obtained polymer showed following analysis results by measurements with $^{13}$C-NMR, $^1$H-NMR, and GPC.
Copolymer Composition Ratio:
Hydroxystyrene:methyl methacrylate ester=67.9:32.1
Mass-average molecular weight (Mw): 11,200
Dispersity (Mw/Mn): 1.12
This was designated as Diblock-C.

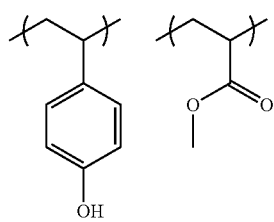

Hereunder, Triblock-D, Diblock-E, Diblock-F, Diblock-G, and Diblock-H having following structures were synthesized similarly.

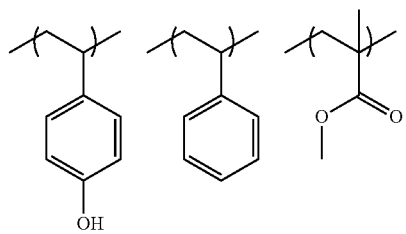

Triblock-D
(30:42.4:27.6)
Mw = 13,800
Mw/Mn = 1.08

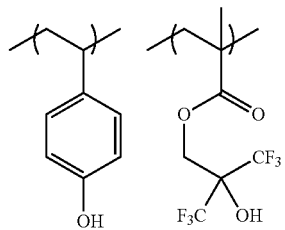

Diblock-E
(61.9:38.1)
Mw = 8,900
Mw/Mn = 1.17

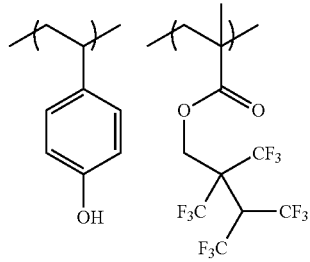

Diblock-F
(69.2:30.8)
Mw = 9,500
Mw/Mn = 1.12

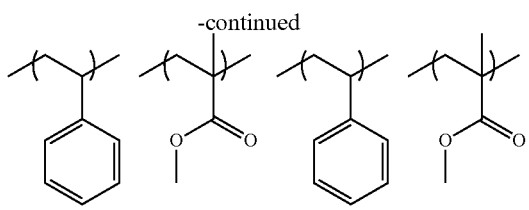

Diblock-G
(66.2:33.8)
Mw = 11,500
Mw/Mn = 1.09

Diblock-H
(67.9:32.1)
Mw = 41,000
Mw/Mn = 1.11

Examples and Comparative Examples

Measurement of Contact Angle

Contact Angle Sample of the Unexposed Area of the Underlayer Film

Each of the silicon-containing underlayer film compositions Sol. 1 to Sol. 41 was applied on a silicon wafer and then heated at 240° C. for 60 seconds to form the respective silicon-containing Film 1 to Film 41 having film thickness of 35 nm; and then, contact angle thereof to pure water (CA1) was measured (Table 4).

2. Contact Angle Sample of the Exposed Area of the Underlayer Film

Each of the silicon-containing underlayer film compositions Sol. 1 to Sol. 41 was applied on a silicon wafer and then heated at 240° C. for 60 seconds to form respective silicon-containing Film 1 to Film 41 having film thickness of 35 nm. Then, after entirety thereof was exposed by using the ArF immersion exposure instrument NSR-S610C (manufactured by Nikon Corp.) and then baked at 100° C. for 60 seconds (PEB) to obtain the exposed area film of the silicon-containing film. Then, contact angle thereof to pure water (CA2) was measured (Table 5).

TABLE 4

| No. | Contact angle | No. | Contact angle | No. | Contact angle | No. | Contact angle |
|---|---|---|---|---|---|---|---|
| Film 1 | 75 degrees | Film 12 | 75 degrees | Film 23 | 74 degrees | Film 34 | 75 degrees |
| Film 2 | 75 degrees | Film 13 | 78 degrees | Film 24 | 77 degrees | Film 35 | 77 degrees |
| Film 3 | 75 degrees | Film 14 | 78 degrees | Film 25 | 78 degrees | Film 36 | 77 degrees |
| Film 4 | 75 degrees | Film 15 | 74 degrees | Film 26 | 78 degrees | Film 37 | 78 degrees |
| Film 5 | 75 degrees | Film 16 | 80 degrees | Film 27 | 76 degrees | Film 38 | 79 degrees |
| Film 6 | 75 degrees | Film 17 | 79 degrees | Film 28 | 76 degrees | Film 39 | 75 degrees |
| Film 7 | 78 degrees | Film 18 | 78 degrees | Film 29 | 74 degrees | Film 40 | 79 degrees |
| Film 8 | 75 degrees | Film 19 | 81 degrees | Film 30 | 75 degrees | Film 41 | 75 degrees |
| Film 9 | 76 degrees | Film 20 | 80 degrees | Film 31 | 78 degrees | | |
| Film 10 | 77 degrees | Film 21 | 78 degrees | Film 32 | 77 degrees | | |
| Film 11 | 74 degrees | Film 22 | 79 degrees | Film 33 | 76 degrees | | |

TABLE 5

| No. | Contact angle | No. | Contact angle | No. | Contact angle | No. | Contact angle |
|---|---|---|---|---|---|---|---|
| Film 1 | 42 degrees | Film 12 | 39 degrees | Film 23 | 45 degrees | Film 34 | 35 degrees |
| Film 2 | 39 degrees | Film 13 | 45 degrees | Film 24 | 38 degrees | Film 35 | 41 degrees |
| Film 3 | 44 degrees | Film 14 | 44 degrees | Film 25 | 36 degrees | Film 36 | 35 degrees |
| Film 4 | 38 degrees | Film 15 | 46 degrees | Film 26 | 42 degrees | Film 37 | 41 degrees |
| Film 5 | 47 degrees | Film 16 | 45 degrees | Film 27 | 42 degrees | Film 38 | 42 degrees |
| Film 6 | 40 degrees | Film 17 | 38 degrees | Film 28 | 36 degrees | Film 39 | 42 degrees |
| Film 7 | 45 degrees | Film 18 | 35 degrees | Film 29 | 46 degrees | Film 40 | 45 degrees |
| Film 8 | 36 degrees | Film 19 | 38 degrees | Film 30 | 39 degrees | Film 41 | 68 degrees |
| Film 9 | 38 degrees | Film 20 | 38 degrees | Film 31 | 38 degrees | | |
| Film 10 | 38 degrees | Film 21 | 41 degrees | Film 32 | 37 degrees | | |
| Film 11 | 36 degrees | Film 22 | 42 degrees | Film 33 | 37 degrees | | |

It was found that the contact angles of Film 1 to Film 40, the silicon-containing films used in the present invention, were decreased after photo-exposure. On the contrary, there was no substantial change after photo-exposure in the contact angle of Film 41, the film substituted with an acid-stable group.

Formation of the Patterning Wafer:

The spin-on-carbon film ODL-50 (carbon content of 80% by mass, manufactured by Shin-Etsu Chemical Co., Ltd.) having film thickness of 200 nm was formed on a silicon wafer. Then, each of the silicon-containing film compositions Sol. 11 to Sol. 41 was applied thereonto and then baked at 240° C. for 60 seconds to form the silicon-containing film having film thickness of 35 nm (Film 11 to Film 41).

Subsequently, it was exposed by using the ArF immersion exposure instrument NSR-S610C (NA of 1.30, σ of 0.98/0.65, 35-degree dipole polarized illumination, and 6% half tone phase shift mask with which 45 nm 1:1 positive line-and-space pattern can be obtained; manufactured by Nikon Corp.) and then baked (PEB) at 100° C. for 60 seconds.

Diblock or Triblock Copolymers A to H in propylene glycol methyl ether acetate (PGMEA) were prepared, and then they were passed through a 0.1-μm filter made of a fluorinated resin to obtain respective self-assembling polymer solutions DS-A to DS-H.

This polymer solution was applied on each of Film 11 to Film 41 by spin coating so as to give film thickness of 50 nm, and then, this was heated at 180° C. under vacuum for 24 hours to form a pattern having a microdomain structure. This pattern was observed by the electron microscope CG4000 (manufactured by Hitachi High-Technologies Corp.); and the results thereof are summarized in Table 6.

Pattern Etching Test:

The pattern formed by the forgoing patterning test was dry-etched in its poly(meth)acrylate ester part by using an oxygen gas system under the processing condition (1) to form the pattern, which was then transferred by dry-etching the silicon-containing film by using the remaining polystyrene part as a mask under the condition (2), followed by transferring the pattern to the spin-on-carbon film by dry etching under the condition (3). The line width of the obtained pattern was measured by using the electron microscope CG 4000 (manufactured by Hitachi High-Technologies Corp.); and the pattern forms thereof are summarized in Table 6 for comparison.

(1) Etching Condition in the $O_2/N_2$ Gas System
Instrument: dry etching instrument Telius SP (manufactured by Tokyo Electron Ltd.)
Etching condition (1):

| Chamber pressure | 5 Pa |
|---|---|
| Upper/lower RF power | 100 W/50 W |
| $O_2$ gas flow rate | 10 mL/minute |
| $N_2$ gas flow rate | 10 mL/minute |
| Ar gas flow rate | 10 mL/minute |
| Treatment time | 30 seconds |

(2) Etching Condition in the $CHF_3/CF_4$ Gas System
Instrument: dry etching instrument Telius SP (manufactured by Tokyo Electron Ltd.)
Etching condition (2):

| Chamber pressure | 15 Pa |
|---|---|
| Upper/lower RF power | 500 W/300 W |
| $CHF_3$ gas flow rate | 50 mL/minute |
| $CF_4$ gas flow rate | 150 mL/minute |
| Ar gas flow rate | 100 mL/minute |
| Treatment time | 40 seconds |

(3) Etching Condition in the $O_2/N_2$ Gas System
Instrument: dry etching instrument Telius SP (manufactured by Tokyo Electron Ltd.)
Etching condition (3):

| Chamber pressure | 5 Pa |
|---|---|
| Upper/lower RF power | 1000 W/300 W |
| $O_2$ gas flow rate | 300 mL/minute |
| $N_2$ gas flow rate | 100 mL/minute |
| Ar gas flow rate | 100 mL/minute |
| Treatment time | 30 seconds |

TABLE 6

| Example | Silicon-containing underlayer film | Self-organizing polymer | Size of microdomain structure | Size after etching |
|---|---|---|---|---|
| Example 1 | Film 11 | DS-A | 25 nm | 23 nm |
| Example 2 | Film 12 | DS-B | 20 nm | 18 nm |
| Example 3 | Film 13 | DS-C | 21 nm | 19 nm |
| Example 4 | Film 14 | DS-D | 30 nm | 28 nm |
| Example 5 | Film 15 | DS-E | 19 nm | 17 nm |
| Example 6 | Film 16 | DS-F | 25 nm | 22 nm |
| Example 7 | Film 17 | DS-G | 60 nm | 59 nm |
| Example 8 | Film 18 | DS-H | 55 nm | 52 nm |
| Example 9 | Film 19 | DS-G | 30 nm | 28 nm |
| Example 10 | Film 20 | DS-G | 35 nm | 33 nm |
| Example 11 | Film 21 | DS-G | 35 nm | 32 nm |
| Example 12 | Film 22 | DS-G | 25 nm | 22 nm |
| Example 13 | Film 23 | DS-G | 35 nm | 33 nm |
| Example 14 | Film 24 | DS-G | 30 nm | 29 nm |
| Example 15 | Film 25 | DS-G | 25 nm | 23 nm |
| Example 16 | Film 26 | DS-G | 35 nm | 33 nm |
| Example 17 | Film 27 | DS-G | 30 nm | 27 nm |
| Example 18 | Film 28 | DS-G | 40 nm | 39 nm |
| Example 19 | Film 29 | DS-G | 35 nm | 34 nm |
| Example 20 | Film 30 | DS-G | 35 nm | 35 nm |
| Example 21 | Film 31 | DS-G | 45 nm | 43 nm |
| Example 22 | Film 32 | DS-G | 40 nm | 39 nm |
| Example 23 | Film 33 | DS-G | 40 nm | 39 nm |
| Example 24 | Film 34 | DS-G | 25 nm | 25 nm |
| Example 25 | Film 35 | DS-G | 40 nm | 38 nm |
| Example 26 | Film 36 | DS-G | 40 nm | 38 nm |
| Example 27 | Film 37 | DS-G | 30 nm | 30 nm |
| Example 28 | Film 38 | DS-G | 40 nm | 39 nm |
| Example 29 | Film 39 | DS-G | 35 nm | 35 nm |
| Example 30 | Film 40 | DS-G | 25 nm | 24 nm |
| Comparative Example 1 | Film 41 | DS-G | Not self-organized | |

As shown in Table 6, according to the patterning process of the present invention (Examples 1 to 30), a pattern having excellent uniformity and regularity could be obtained by forming, as the underlayer film, the silicon-containing film that generates difference in contact angles after photo-exposure, followed by forming the self-assembling polymer upon this silicon-containing film. In addition, the fine microdomain structure with the pattern size of 30 nm or less could be obtained (Examples 1 to 6, 9, 12, 14, 15, 17, 24, and 30). Further, a pattern having excellent size transfer difference could be obtained even after the pattern transferring process by etching. On the contrary, in the silicon-containing film having very small difference in the contact angles between before and after the photo-exposure (Comparative Example 1), self-assembly of the self-assembling polymer could not be confirmed; and thus, the pattern could not be obtained.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:
1. A patterning process which uses self-assembly, the patterning process comprising:
    forming a silicon-containing film by applying a silicon-containing film composition onto a substrate to be processed followed by heating, wherein the silicon-containing film composition contains a silicon-containing compound whose main chain is polysiloxane, the silicon-containing compound containing an organic substituent group having a hydroxyl group thereof substituted with an acid labile group or a carboxyl group thereof substituted with an acid labile group,
    pattern-exposing the silicon-containing film to a high energy beam, followed by a heat treatment thereof,
    forming a polymer film by applying a self-assembling polymer onto exposed and unexposed portions of the silicon-containing film,
    self-assembling the polymer film by a heat treatment to form a microdomain structure,
    forming a pattern by dry-etching the polymer film having the microdomain structure,
    transferring the pattern to the silicon-containing film by dry-etching by using the pattern formed on the polymer as a mask, and
    transferring the pattern to the substrate to be processed by dry-etching by using the pattern transferred to the silicon-containing film as a mask.
2. The patterning process according to claim 1, wherein the silicon-containing film composition contains a photo acid generator.

3. The patterning process according to claim 2, wherein the substrate to be processed is an organic hard mask mainly comprised of carbon formed by a CVD method, or an organic film formed by an application type method.

4. The patterning process according to claim 1, wherein the substrate to be processed is an organic hard mask mainly comprised of carbon formed by a CVD method, or an organic film formed by an application type method.

\* \* \* \* \*